(12) United States Patent
Simsek-Ege et al.

(10) Patent No.: US 12,137,549 B2
(45) Date of Patent: Nov. 5, 2024

(54) MICROELECTRONIC DEVICES COMPRISING CAPACITOR STRUCTURES, AND RELATED ELECTRONIC SYSTEMS AND METHODS

(71) Applicant: Micron Technology, Inc., Boise, ID (US)

(72) Inventors: Fatma Arzum Simsek-Ege, Boise, ID (US); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 509 days.

(21) Appl. No.: 17/461,095

(22) Filed: Aug. 30, 2021

(65) Prior Publication Data
US 2023/0067220 A1 Mar. 2, 2023

(51) Int. Cl.
*H10B 12/00* (2023.01)
*G11C 5/02* (2006.01)
(Continued)

(52) U.S. Cl.
CPC .............. *H10B 12/30* (2023.02); *G11C 5/025* (2013.01); *G11C 5/10* (2013.01); *G11C 11/407* (2013.01); *H10B 12/03* (2023.02)

(58) Field of Classification Search
CPC ......... G11C 11/407; G11C 5/025; G11C 5/10; H01L 28/90; H10B 12/03; H10B 12/0335; H10B 12/30; H10B 12/315; H10B 12/50
See application file for complete search history.

(56) References Cited

U.S. PATENT DOCUMENTS 8,067,286 B2 11/2011 Parekh et al.
8,153,499 B2 4/2012 Or-Bach et al.
(Continued)

FOREIGN PATENT DOCUMENTS

TW 202125777 A 7/2021
WO 2008063251 A2 5/2008

OTHER PUBLICATIONS

International Search Report for International Application No. PCT/US2022/074604, mailed Nov. 28, 2022, 3 pages.
(Continued)

*Primary Examiner* — Michelle Mandala
*Assistant Examiner* — Kevin Quinto
(74) *Attorney, Agent, or Firm* — TraskBritt

(57) ABSTRACT

A microelectronic device comprises array regions individually comprising memory cells comprising access devices and storage node device, digit lines coupled to the access devices and extending in a first direction, word lines coupled to the access devices and extending in a second direction orthogonal to the first direction, and control logic devices over and in electrical communication with the memory cells. The microelectronic device further comprises capacitor regions horizontally offset from the array regions in the first direction and having a dimension in the second direction greater than each individual array region in the second direction. The capacitor regions individually comprise additional control logic devices vertically overlying the memory cells, and capacitor structures within horizontal boundaries of the additional control logic devices. Related microelectronic devices, electronic systems, and methods are also described.

32 Claims, 30 Drawing Sheets

(51) Int. Cl.
    *G11C 5/10*       (2006.01)
    *G11C 11/407*     (2006.01)

(56) References Cited

U.S. PATENT DOCUMENTS

| | | |
|---|---|---|
| 8,184,471 B2 | 5/2012 | Woo et al. |
| 8,546,188 B2 | 10/2013 | Liu |
| 8,716,116 B2 | 5/2014 | Parekh et al. |
| 9,543,433 B2 | 1/2017 | Anathan et al. |
| 10,984,848 B2 | 4/2021 | Sakurai et al. |
| 2009/0168482 A1 | 7/2009 | Park et al. |
| 2010/0059806 A1 | 3/2010 | Mizushima |
| 2010/0320521 A1 | 12/2010 | Izumi |
| 2015/0364474 A1 | 12/2015 | Kang et al. |
| 2018/0358083 A1 | 12/2018 | Kawamura et al. |
| 2019/0067298 A1 | 2/2019 | Karda et al. |
| 2019/0244933 A1 | 8/2019 | Or-Bach et al. |
| 2020/0066730 A1 | 2/2020 | Guo et al. |
| 2020/0212041 A1 | 7/2020 | Machkaoutsan et al. |
| 2020/0411524 A1* | 12/2020 | Arslan ............... H10B 12/0335 |
| 2021/0118890 A1 | 4/2021 | Kim et al. |
| 2021/0265295 A1 | 8/2021 | Liu et al. |

OTHER PUBLICATIONS

International Written Opinion for International Application No. PCT/US2022/074604, mailed Nov. 28, 2022, 4 pages.

Taiwanese Search Report and Office Action from Taiwanese Application No. 111132623, dated Sep. 30, 2023, 7 pages with English translation.

\* cited by examiner

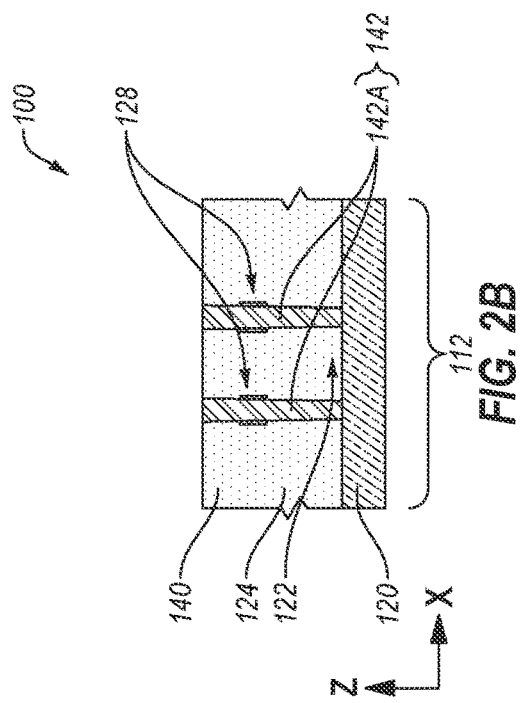
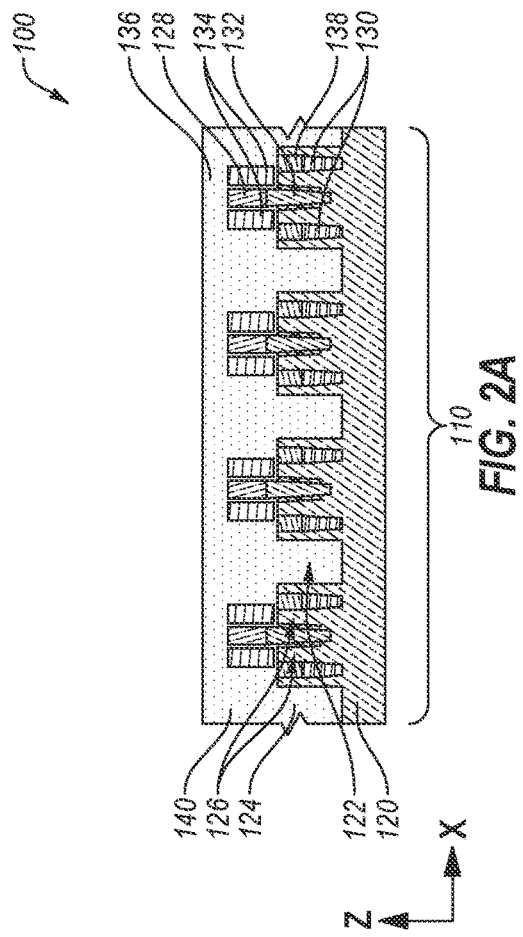

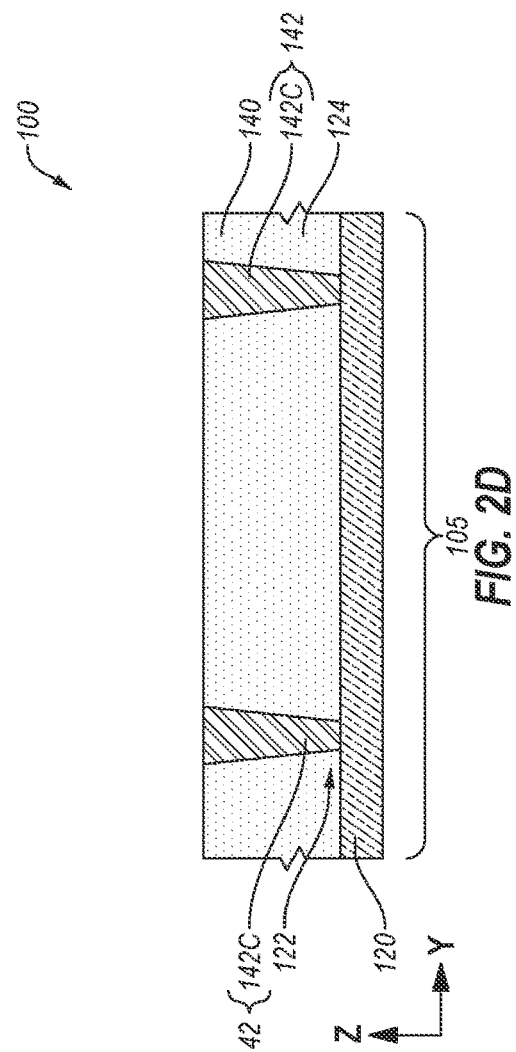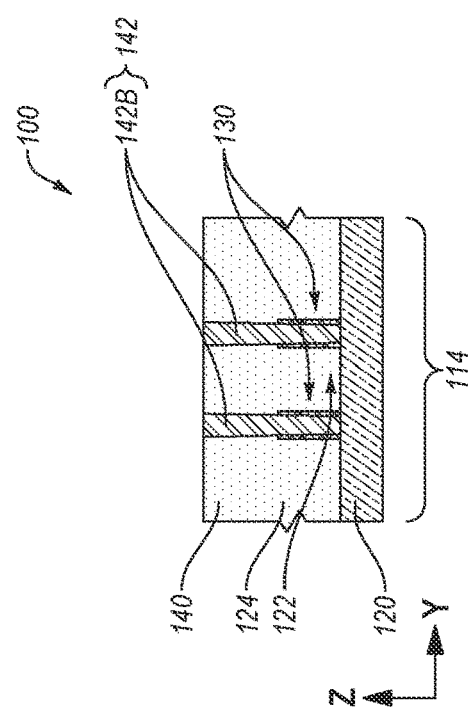

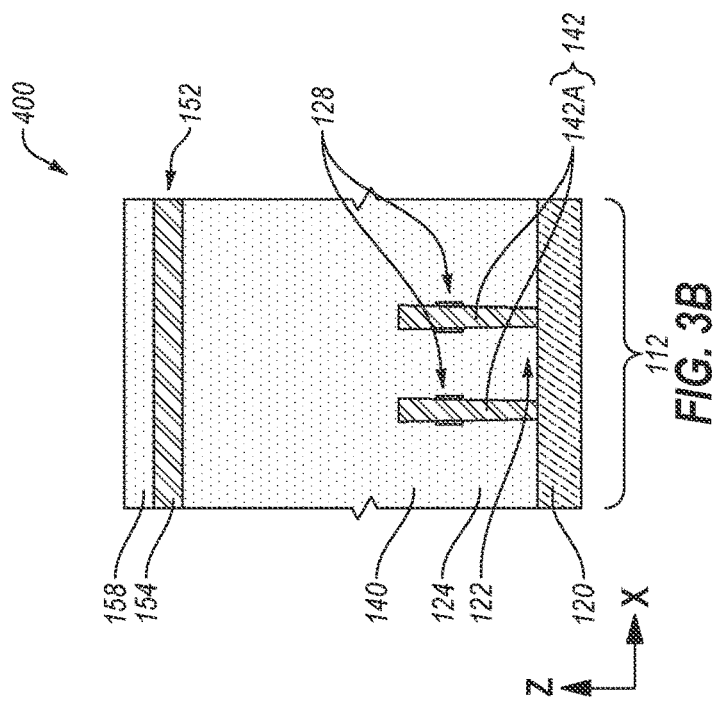
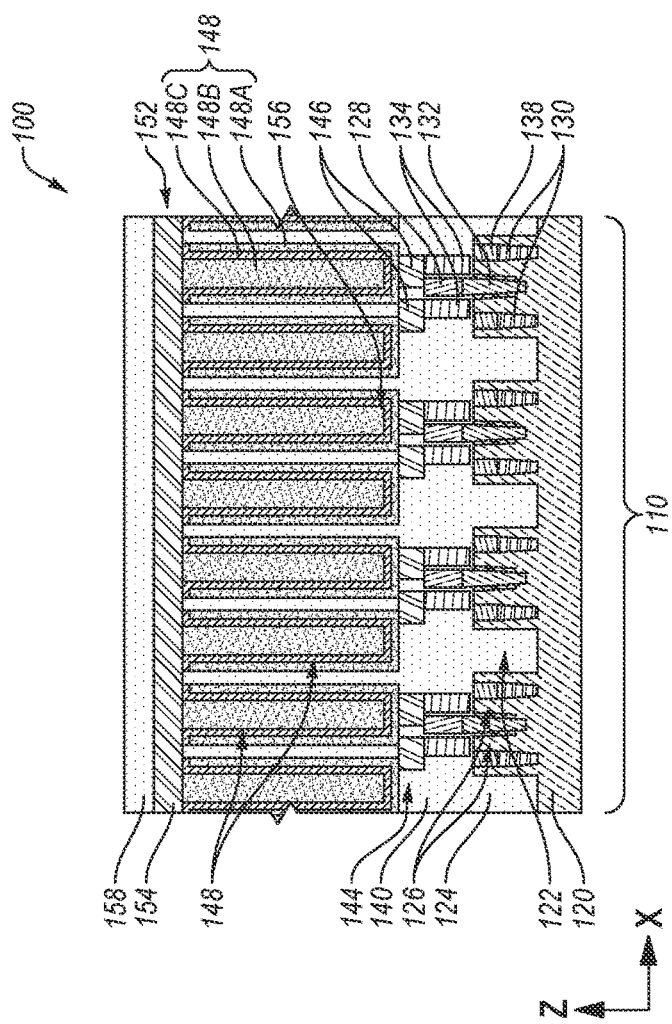
FIG. 3A
FIG. 3B

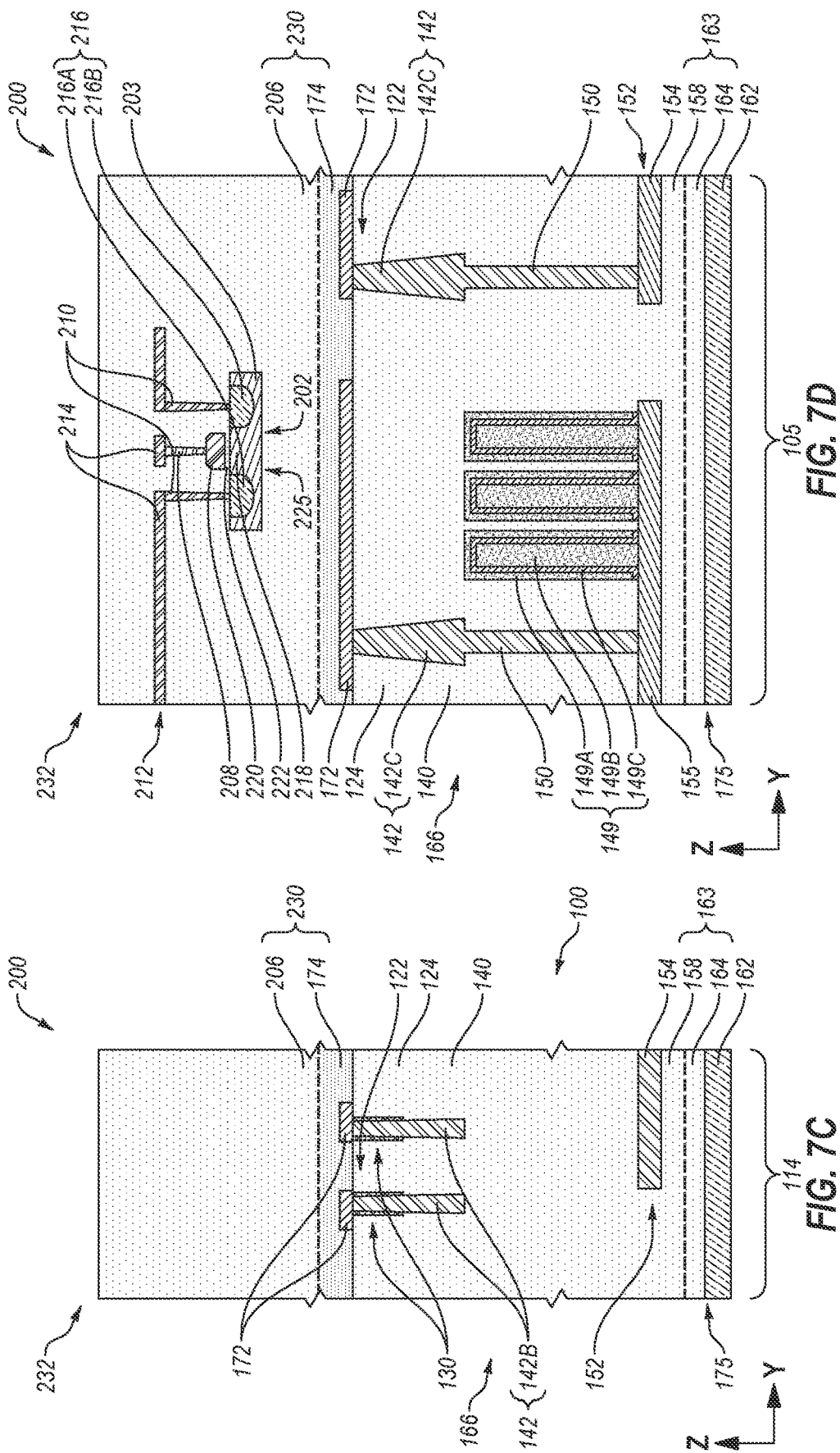

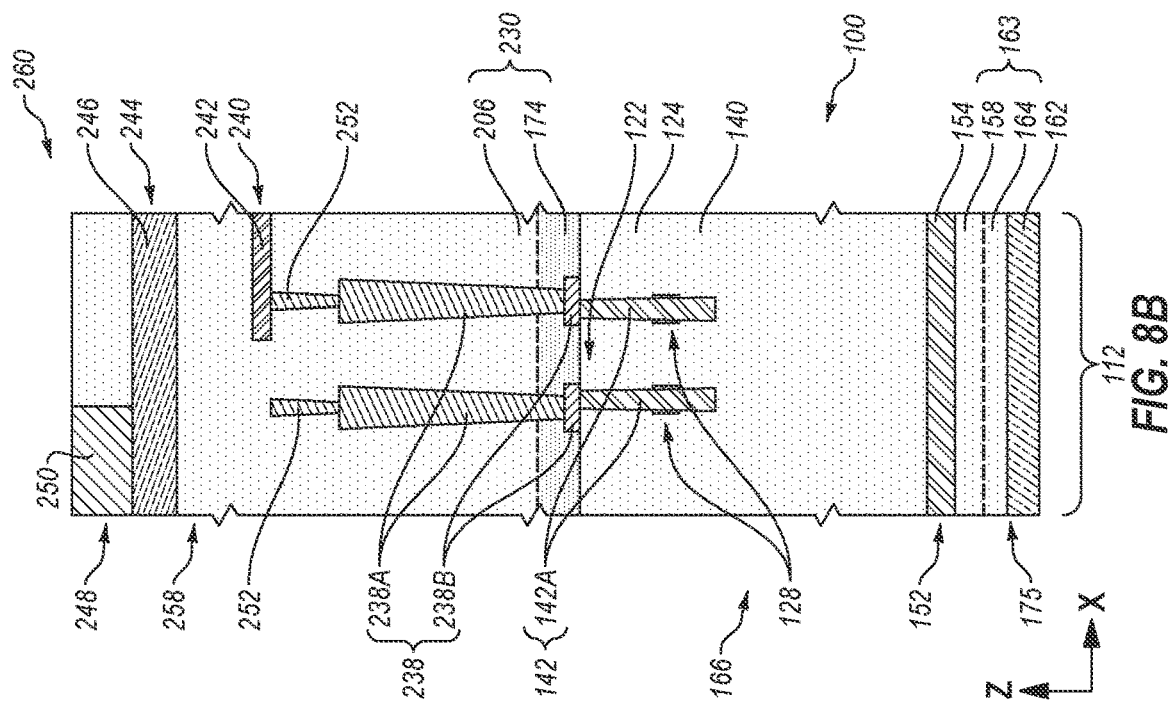
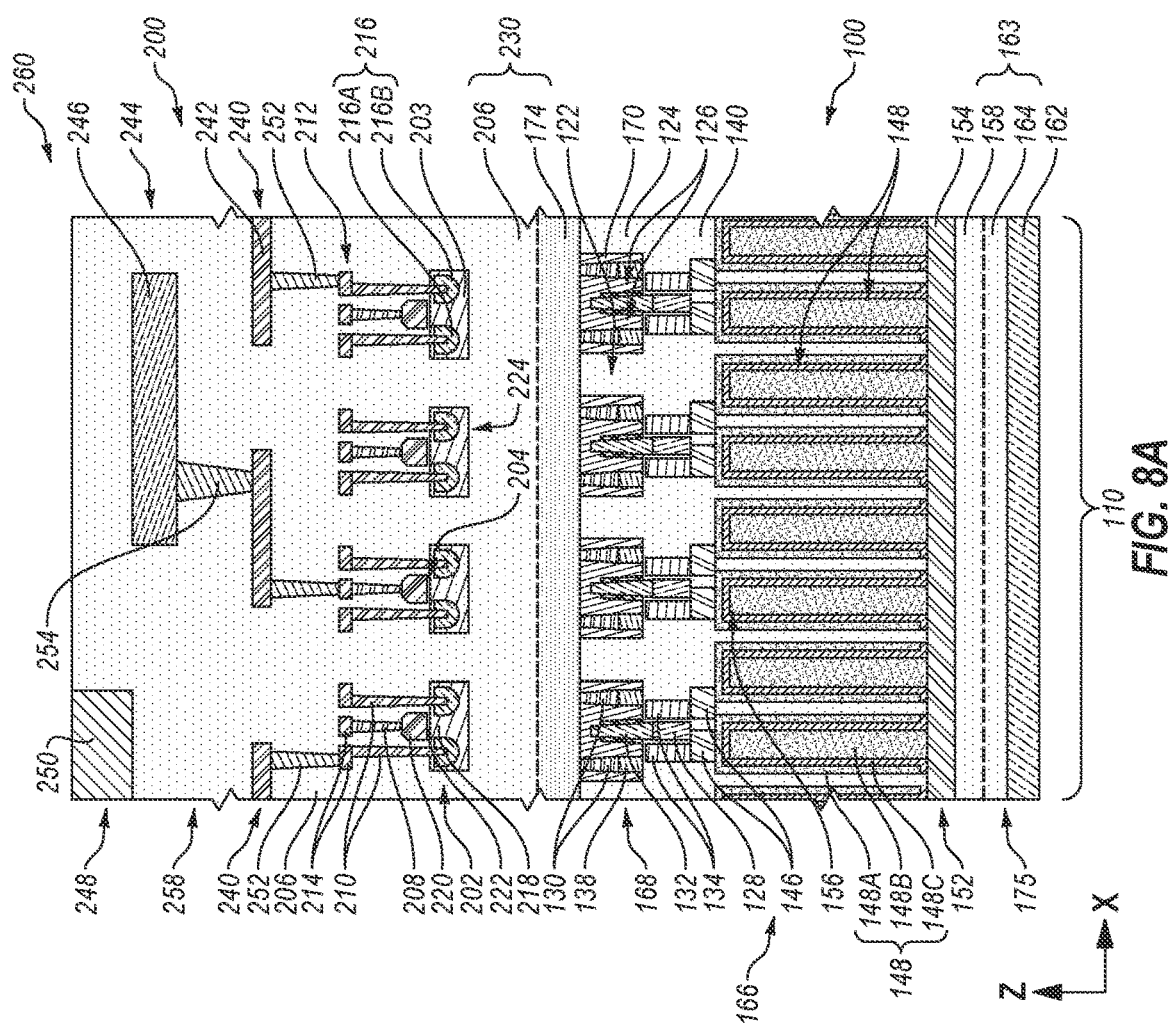

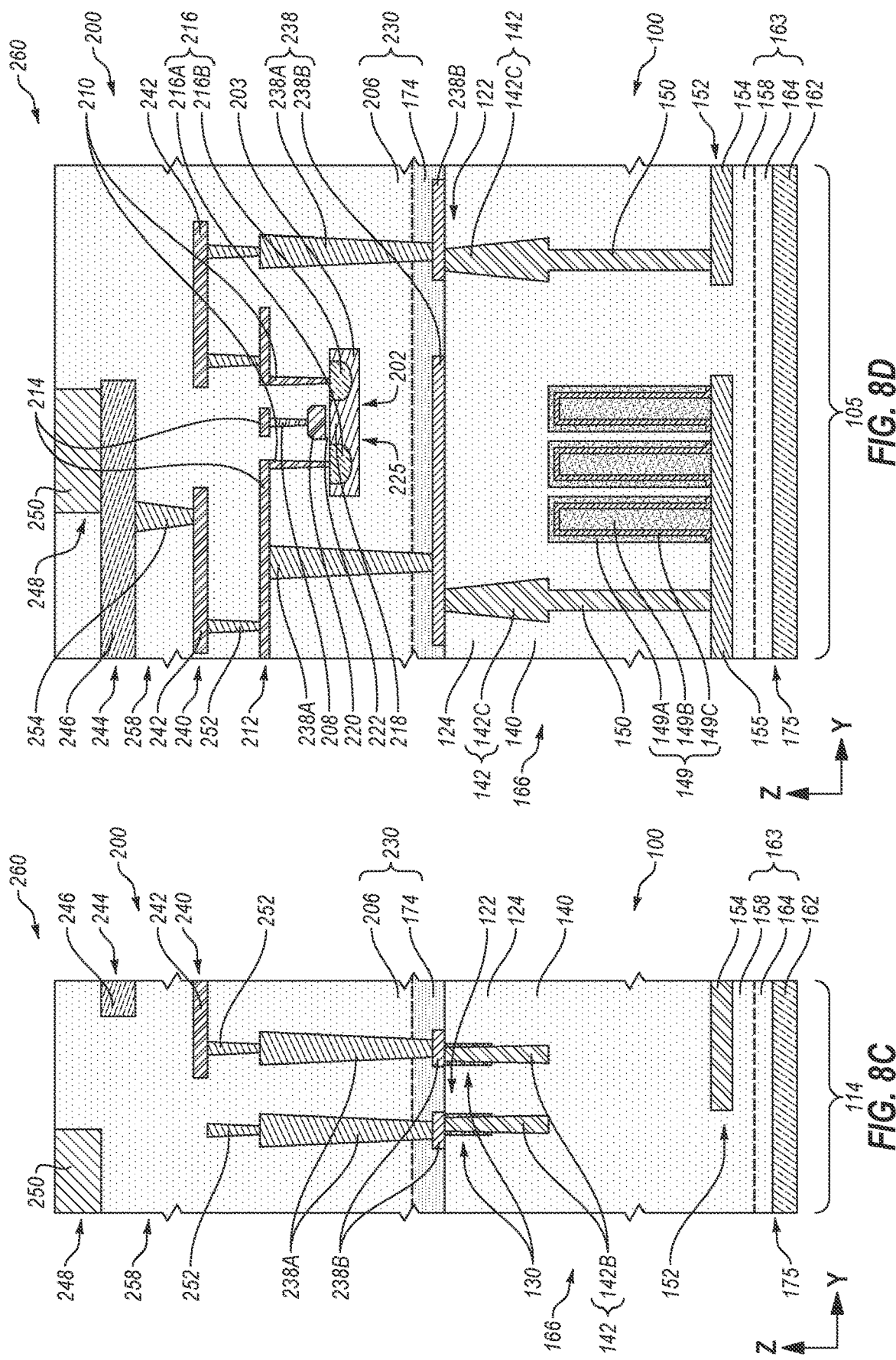

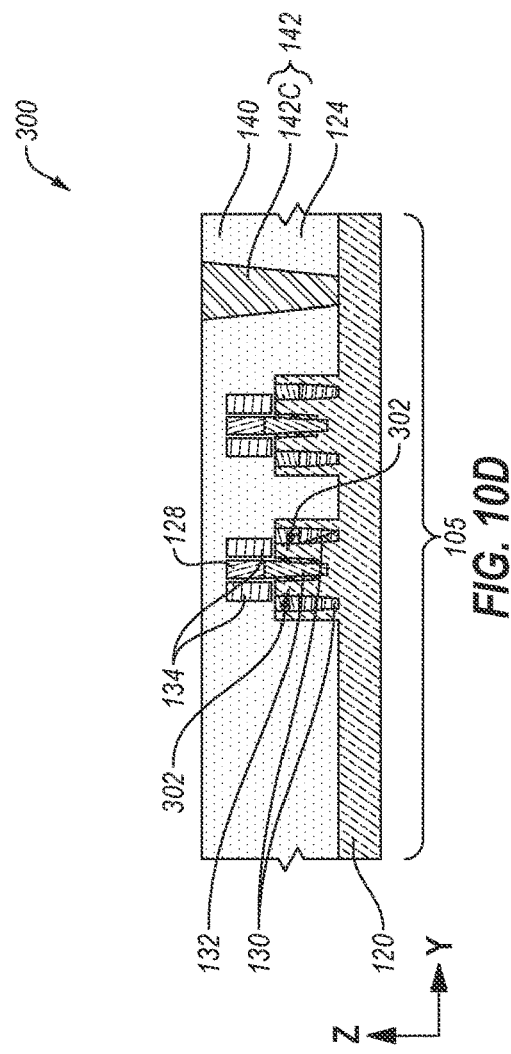
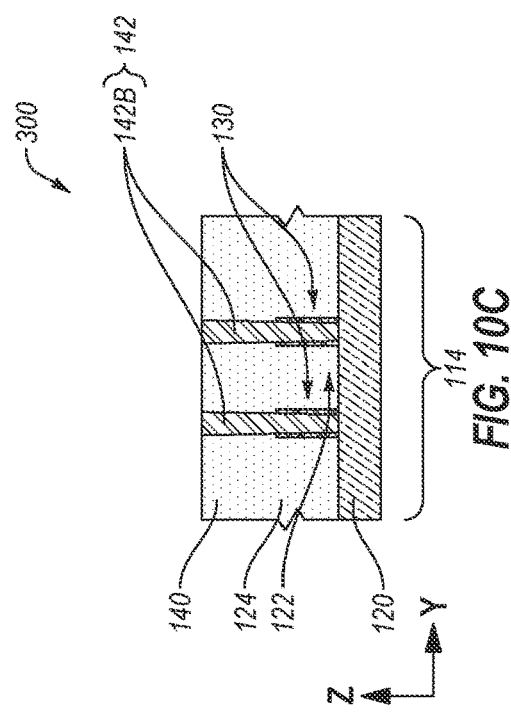

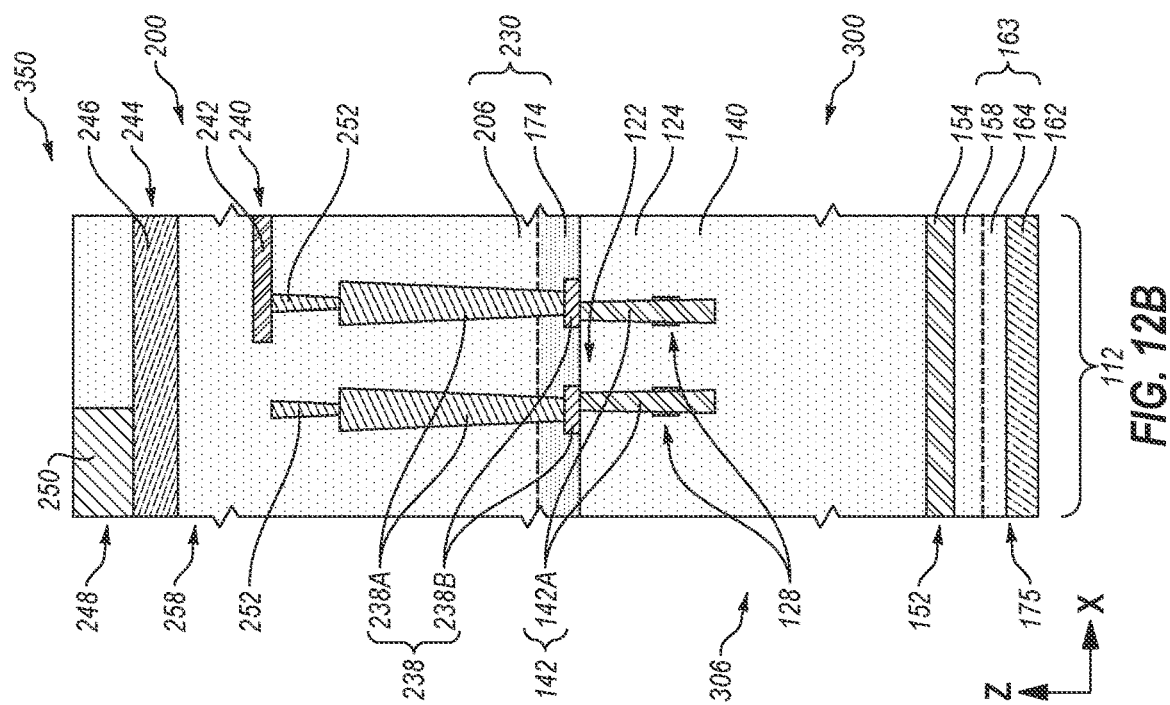
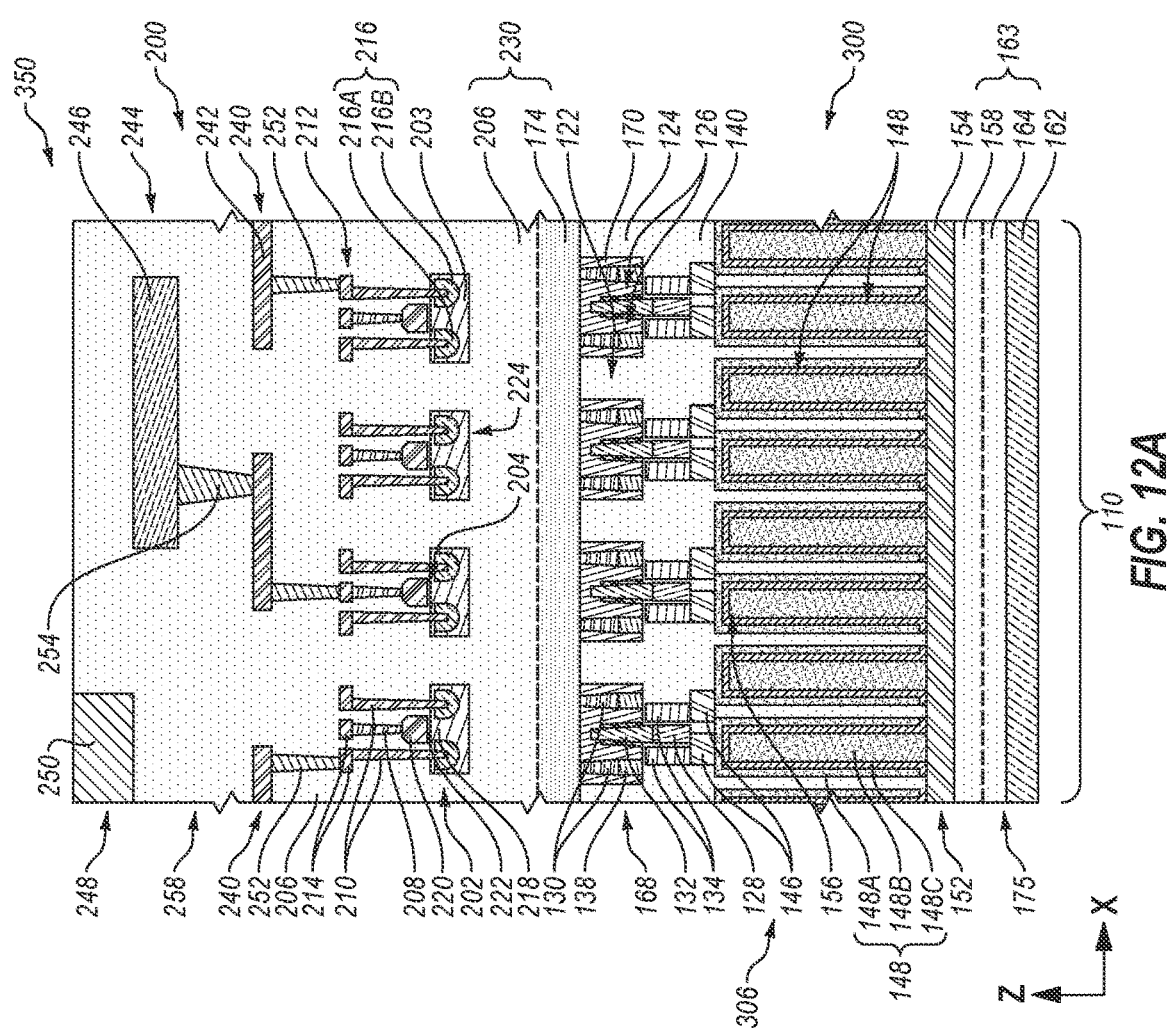

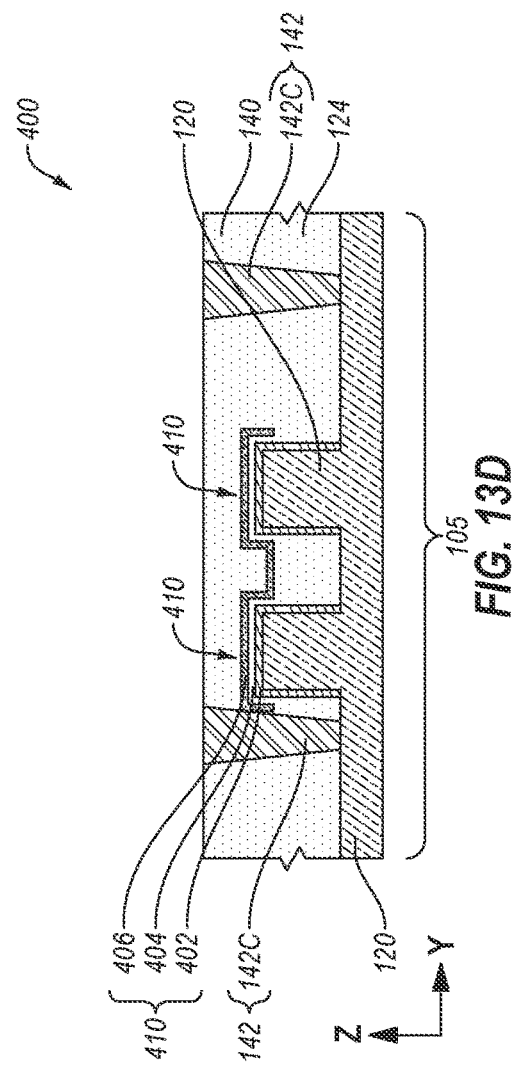
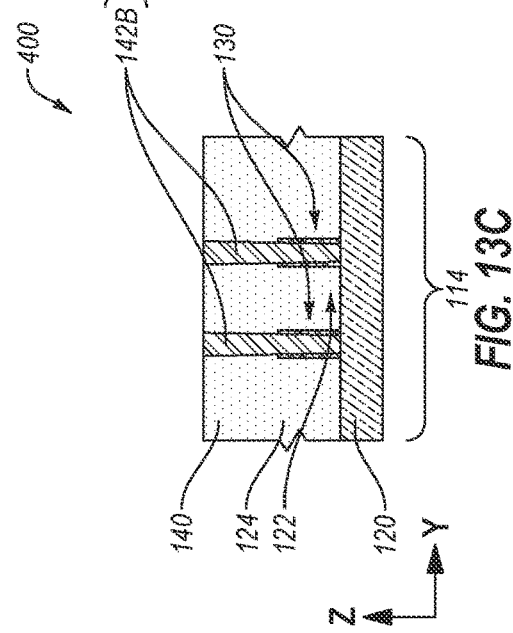

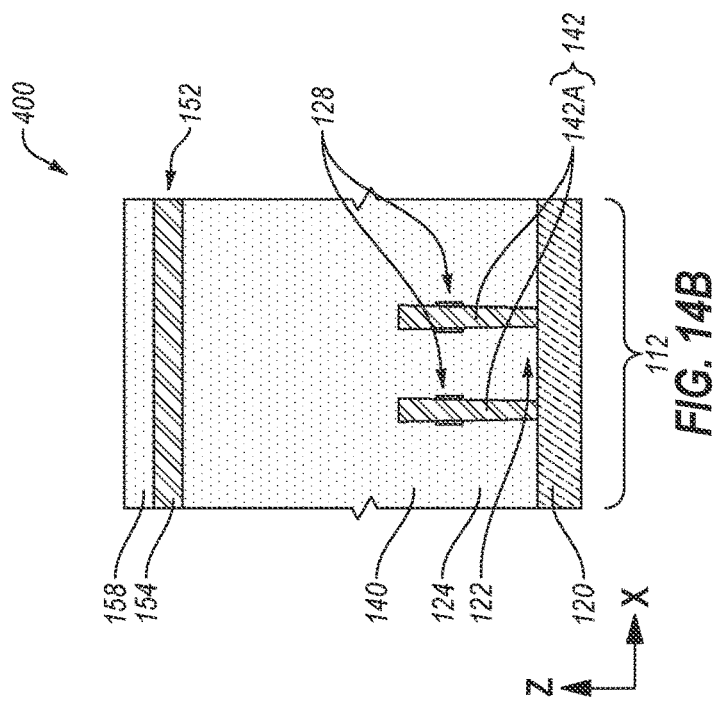
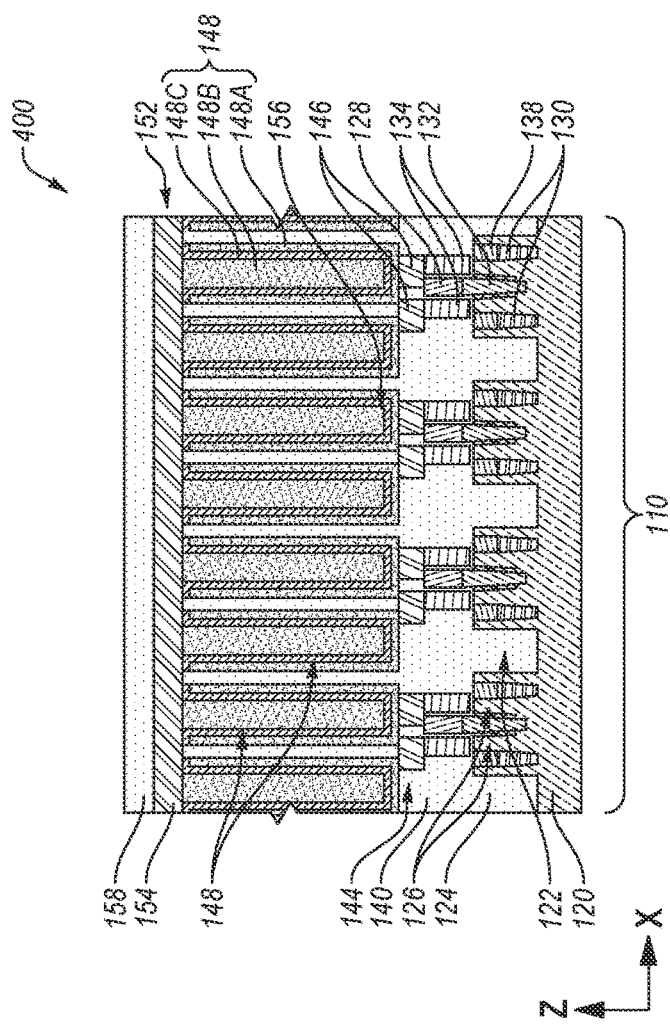
FIG. 14A
FIG. 14B

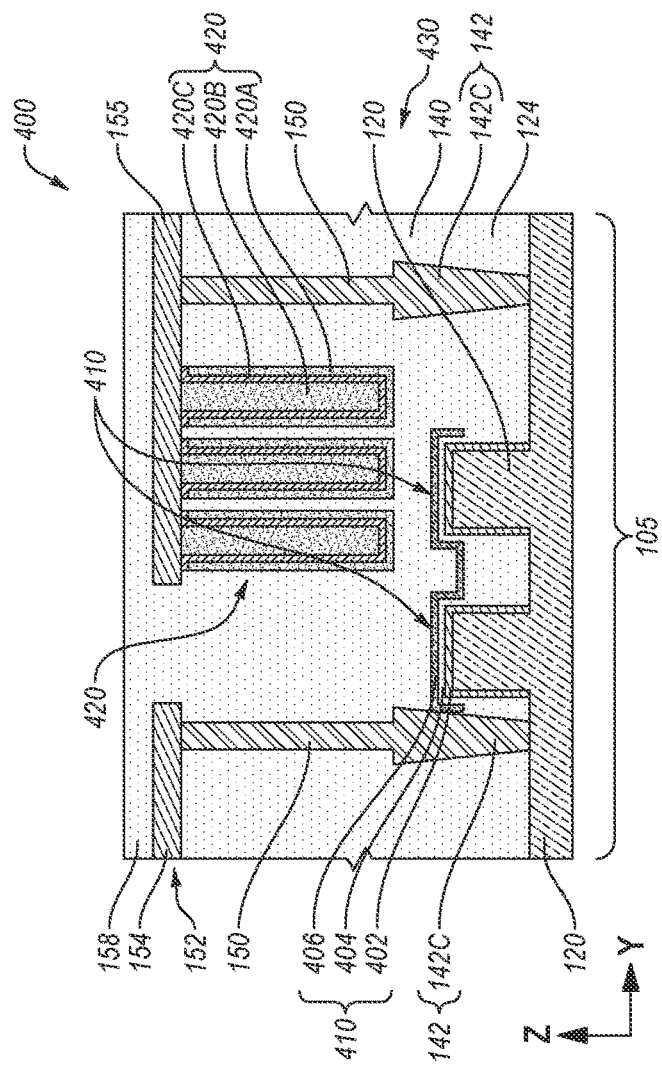
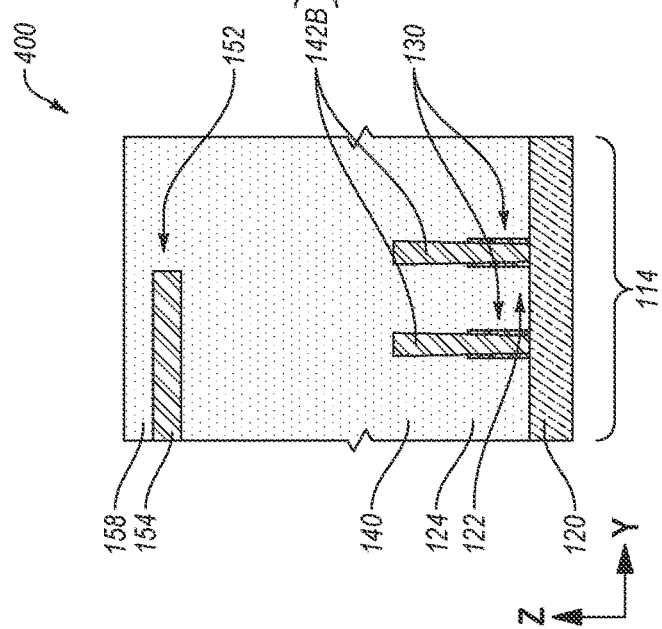
FIG. 14D
FIG. 14C

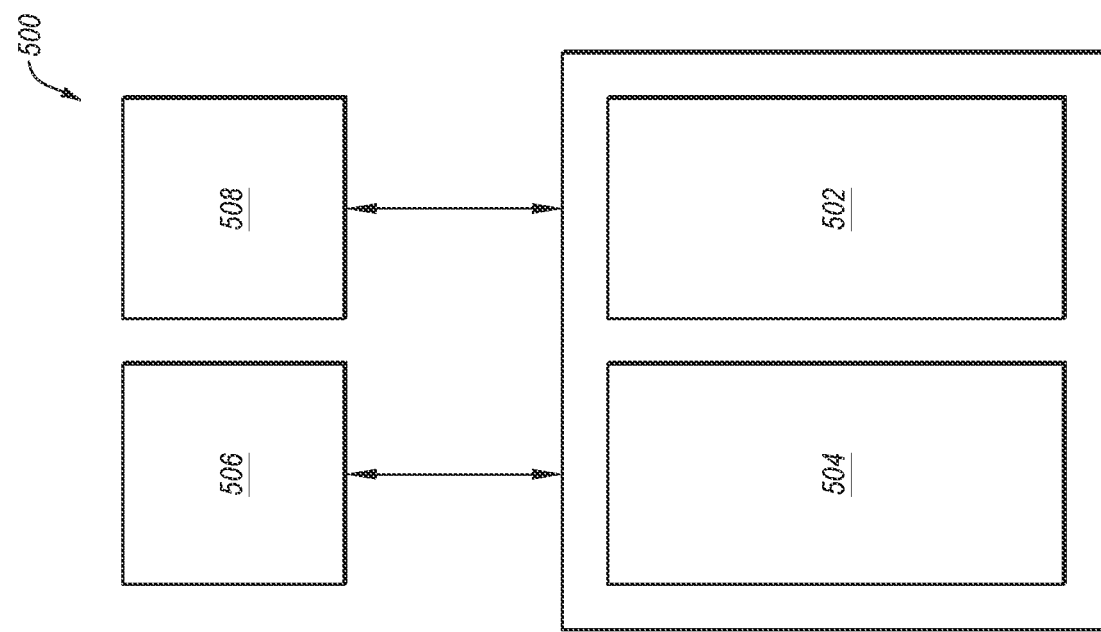

MICROELECTRONIC DEVICES COMPRISING CAPACITOR STRUCTURES, AND RELATED ELECTRONIC SYSTEMS AND METHODS

TECHNICAL FIELD

The disclosure, in various embodiments, relates generally to the field of microelectronic device design and fabrication. More specifically, the disclosure relates to microelectronic devices and apparatuses including capacitor structures in a capacitor region and horizontally spaced from memory arrays of the microelectronic device, and to related memory devices, electronic systems, and methods of forming the microelectronic devices.

BACKGROUND

Microelectronic device designers often desire to increase the level of integration or density of features within a microelectronic device by reducing; the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, volatile memory devices. One type of volatile memory device is a dynamic random-access memory (DRAM) device. A DRAM device may include a memory array including DRAM cells arranged in rows extending in a first horizontal direction and columns extending in a second horizontal direction. In one design configuration, an individual DRAM cell includes an access device (e.g., a transistor) and a storage node device (e.g., a capacitor) electrically connected to the access device. The DRAM cells of a DRAM device are electrically accessible through digit lines and word lines arranged along the rows and columns of the memory array and in electrical communication with control logic devices within a base control logic structure of the DRAM device.

Control logic devices within a base control logic structure underlying a memory array of a DRAM device have been used to control operations on the DRAM cells of the DRAM device. Control logic devices of the base control logic structure can be provided in electrical communication with digit lines and word lines coupled to the DRAM cells by way of routing and contact structures. Unfortunately, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the DRAM device.

BRIEF DESCRIPTION OF THE DRAWINGS

FIG. 2A through FIG. 2D are simplified, partial longitudinal cross-sectional views of a memory array (FIG. 2A), a digit line exit region (FIG. 2B), a word line exit region (FIG. 2C), and a capacitor region (FIG. 2D) of the microelectronic device structure shown in FIG. 1A and FIG. 1B at the processing stage of FIG. 1A and FIG. 1B;

FIG. 3A through FIG. 3D are simplified, partial longitudinal cross-sectional views of the memory array (FIG. 3A), the digit line exit region (FIG. 3B), the word line exit region (FIG. 3C), and the capacitor region (FIG. 3D) shown in FIG. 2A through FIG. 2D, respectively, at another processing stage of the method of forming the microelectronic device following the processing stage of FIG. 2A through FIG. 2D;

FIG. 7A through FIG. 7D are simplified, partial longitudinal cross-sectional views of a memory array (FIG. 7A), a digit line exit region (FIG. 7B), a word line exit region (FIG. 7C), and a capacitor region (FIG. 7D) after attaching the first microelectronic device of FIG. 4A through FIG. 4D to the second microelectronic device structure of FIG. 6A through FIG. 6D to form a microelectronic device structure assembly;

FIG. 8A through FIG. 8D are simplified, partial longitudinal cross-sectional views of a memory array (FIG. 8A), a digit line exit region (FIG. 8B), a word line exit region (FIG. 8C), and a capacitor region (FIG. 8D) of the microelectronic device structure assembly shown in FIG. 7A and FIG. 7B following the processing stage of FIG. 7A and FIG. 7B;

FIG. 10A through FIG. 10D are simplified, partial longitudinal cross-sectional views of a memory array (FIG. 10A), a digit line exit region (FIG. 10B), a word line exit region (FIG. 10C), and a capacitor region (FIG. 10D) of a microelectronic device structure, in accordance with embodiments of the disclosure;

FIG. 12A through FIG. 12D are simplified, partial longitudinal cross-sectional views of a memory array (FIG. 12A), a digit line exit region (FIG. 12B), a word line exit region (FIG. 12C), and a capacitor region (FIG. 12D) of a microelectronic device formed from the microelectronic device structure shown in FIG. 11A through FIG. 11D following further processing;

FIG. 13A through FIG. 13D are simplified, partial longitudinal cross-sectional views of a memory array (FIG. 13A), a digit line exit region (FIG. 13B), a word line exit region (FIG. 13C), and a capacitor region (FIG. 13D) of a microelectronic device structure, in accordance with embodiments of the disclosure;

FIG. 14A through FIG. 14D are simplified, partial longitudinal cross-sectional views of a memory array (FIG. 14A), a digit line exit region (FIG. 14B), a word line exit region (FIG. 14C), and a capacitor region (FIG. 14D) of the microelectronic device structure following the processing stage of FIG. 13A through FIG. 13D;

FIG. 16 is a schematic block diagram of an electronic system, in accordance with an embodiment of the disclosure.

DETAILED DESCRIPTION

Figure 1A:
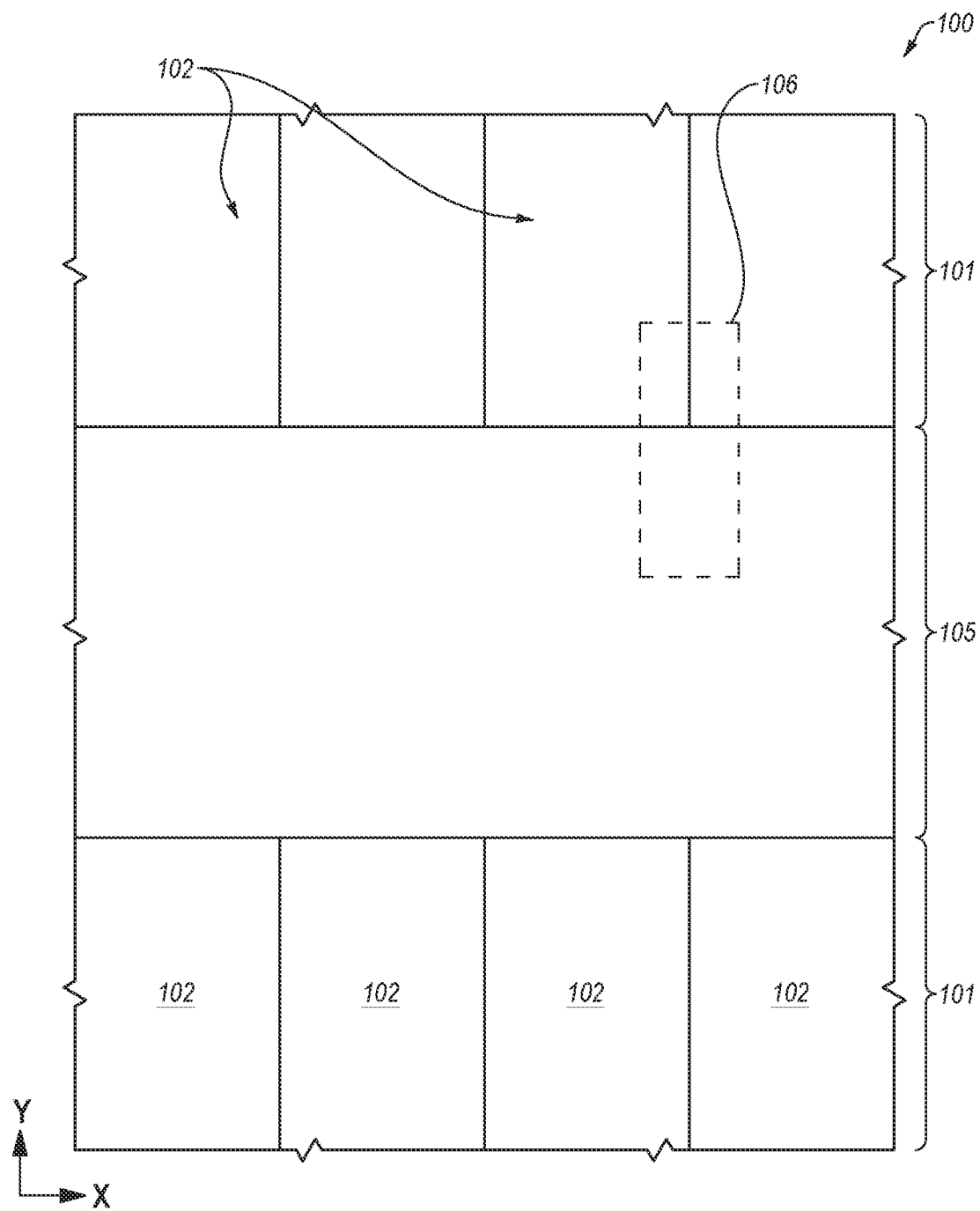
FIG. 1A and FIG. 1B are simplified plan views of a microelectronic device structure at a processing stage of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random-access memory (DRAM); conventional non-volatile memory, such as conventional NAND memory), but also includes an application-specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

According to embodiments described herein, a microelectronic device comprises a first microelectronic device structure attached to a second microelectronic device structure. The first microelectronic device structure comprises a memory array region comprising memory banks, each comprising memory arrays comprising memory cells. The second microelectronic device structure comprises control logic devices vertically overlying the memory cells of the memory arrays and includes devices for effectuating one or more control operations of the memory cells. A capacitor region is horizontally offset from the memory banks and the control logic devices and includes capacitor structures within the first microelectronic device structure and additional control logic devices within the second microelectronic device structure and vertically overlying the capacitor structures. The additional control logic devices may be horizontally aligned with (e.g., located within horizontal boundaries of) the capacitor structures. The additional control logic devices may comprise, for example, control logic devices comprising complementary metal-oxide-semiconductor (CMOS) circuitry. The capacitor structures may be coupled to (and, e.g., configured to power) one or more of the additional control logic devices. The capacitor structures may be coupled to BEOL structures of the microelectronic device. A horizontal area of the control logic devices and the additional control logic devices for effectuating operation of the memory bank including the memory arrays and the memory cells may be larger than a horizontal area of the memory banks. In some embodiments, the relatively larger horizontal area of the control logic devices and the additional control logic devices leaves additional horizontal area within the capacitor region of the first microelectronic device structure vertically underlying the additional control logic devices. The additional area within the capacitor region of the first microelectronic device structure may be used for the capacitor structures. The capacitor structures may be formed from at least some of the materials of the memory cells of the memory arrays and may be at least partially vertically aligned with at least a portion of the materials of the memory cells. Forming the capacitor structures within the capacitor region of the first microelectronic device structure facilitates improved area efficiency of the microelectronic device (e.g., a greater density of memory cells per unit area) compared to conventional microelectronic devices.

FIG. 1A through FIG. 8D are various views (described in further detail below) illustrating different portions of a microelectronic device (e.g., a memory device, such as a DRAM device), in accordance with embodiments of the disclosure. With the description provided below, it will be readily apparent to one of ordinary skill in the art that the methods described herein may be used for forming various devices and electronic systems. In other words, the methods of the disclosure may be used whenever it is desired to form a microelectronic device.

FIG. 1A is a simplified plan view of a first microelectronic device structure 100 (e.g., a first wafer) at an early processing stage of a method of forming a microelectronic device (e.g., a memory device, such as a DRAM device), in accordance with embodiments of the disclosure. As shown in FIG. 1A, the first microelectronic device structure 100 may be formed to include memory array regions 101 horizontally spaced (e.g., in the Y-direction) from one another by a capacitor region 105. In some embodiments, the capacitor region 105 is horizontally interposed (e.g., in the Y-direction) between memory array regions 101. In some embodiments, the capacitor region 105 is directly horizontally between (e.g., in the Y-direction) the memory array regions 101.

In some embodiments, a horizontal dimension in a first direction (e.g., in the X-direction) of the capacitor region 105 may be substantially the same as the horizontal dimension of the memory array regions 101. A horizontal dimension in a second direction (e.g., in the Y-direction) of the capacitor region 105 may be substantially the same as the horizontal dimension of each of the individual memory array regions 101 in the second direction. In some embodiments, the horizontal dimension of the capacitor region 105 in the second direction may be at least about 50 percent of the horizontal dimension of the memory array regions 101 in the second direction, such as at least about 60 percent, at least about 70 percent, at least about 80 percent, or at least about 90 percent of the horizontal dimension of the memory array regions 101 in the second direction. In some embodiments, a horizontal dimension of the capacitor region 105 in the second direction may be greater than a horizontal dimension of each of the individual memory array regions 101.

Each of the memory array regions 101 may include memory array banks 102 horizontally neighboring (e.g., in the X-direction) one another. As described in greater detail below, each of the memory array banks 102 may include one or more memory array regions including memory arrays of memory cells.

In some embodiments, a horizontal dimension (e.g., in the X-direction) of the capacitor region 105 may be larger than a corresponding horizontal dimension of each of the individual memory array banks 102.

The capacitor region 105 may include capacitor structures (e.g., capacitor structures 149 (FIG. 8D)) configured to be coupled to and employed to assist with powering additional devices (e.g., control logic devices, access devices) of a microelectronic device, such additional devices to be formed during subsequent processing acts. In some embodiments, the capacitor structures are subsequently coupled to and employed to assist with powering control logic devices comprising complementary metal-oxide-semiconductor (CMOS) circuitry. As described in further detail below, the control logic devices may be components of an additional, separately-formed microelectronic device structure (e.g., a second microelectronic device structure) that is subsequently attached to the first microelectronic device structure 100 to facilitate the formation of the microelectronic device of the disclosure. The capacitor structures formed within capacitor region 105 may be coupled to BEOL structures to subsequently be formed, as also described in further detail below. In some embodiments, the capacitor structures of the capacitor region 105 include some of the same materials and components as the memory cells (e.g., storage node devices, additional capacitor structures, access devices) of the memory arrays of the memory array banks 102.

By way of non-limiting example, the capacitor region 105 may include capacitor structures for charge pumps, RC filters, peaking amplifiers, capacitors for AC coupling (e.g., RF amplifier capacitors), capacitors for DC blocking (e.g., DC blocking capacitors), and decoupling capacitors, and capacitors for powering one or more control logic devices, such as one or more of digital signal acquisition (DSA) devices, one or more error checking and correction (ECC) devices, one or more voltage generators (e.g., one or more low voltage generators, one or more high voltage generators), one or more command address devices, one or more capacitor structures (e.g., one or more decoupling capacitors), one or more data outputs (e.g., DQU, DQL), one or more command address devices, one or more antifuse devices, one or more delay-locked loop (DLL) systems, one or more delay enable devices (e.g., one or more dQ enable delays devices), one or more temperature sensors, one or more data junctions for channeling data into and out of memory banks, and one or more additional control logic devices.

Figure 1B:
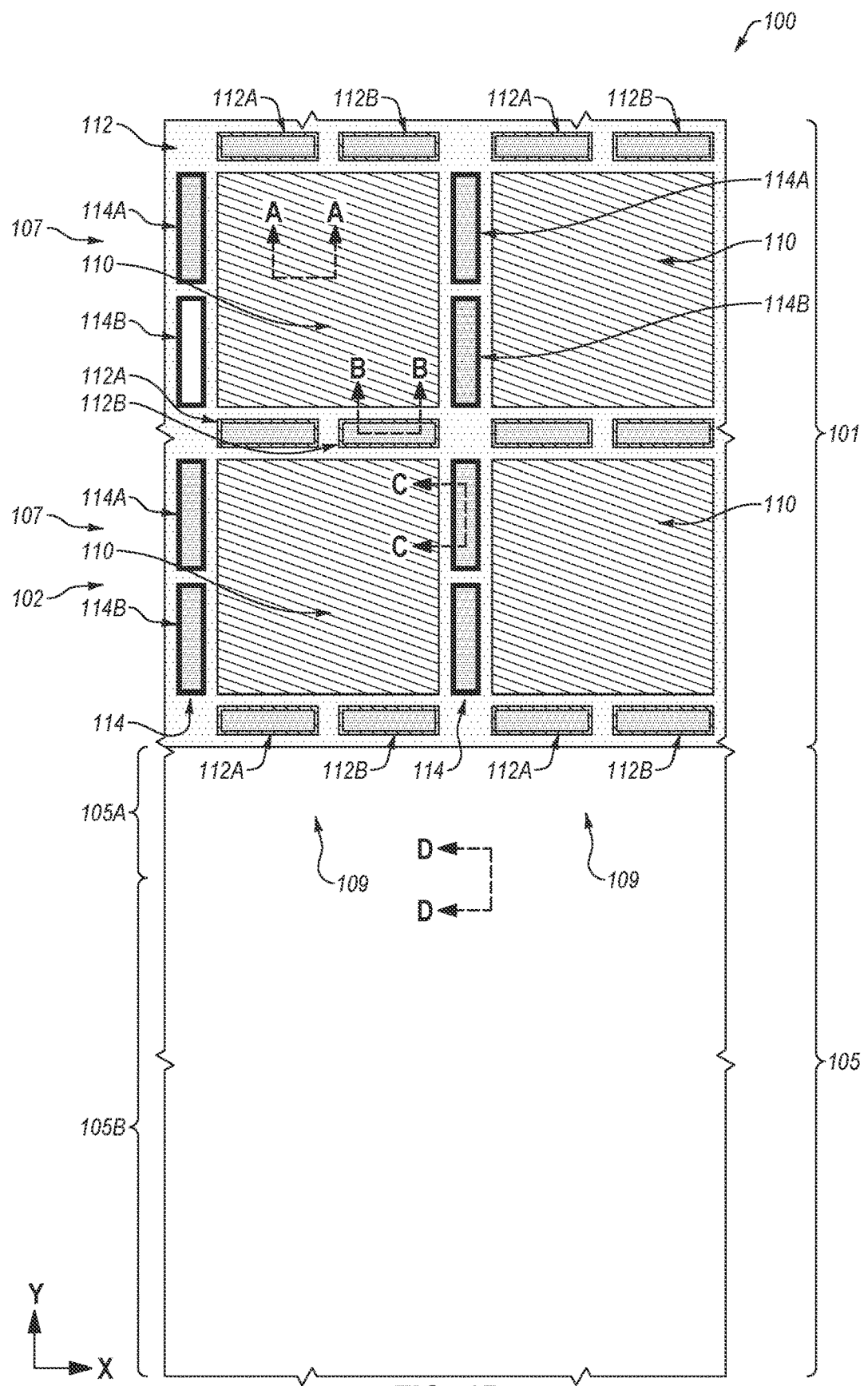

FIG. 1B is a simplified plan view of an enlarged portion of the first microelectronic device structure 100 illustrated in box 106 of FIG. 1A, in accordance with embodiments of the disclosure. The portion of the first microelectronic device structure 100 illustrated in FIG. 1B includes an enlarged portion of a memory array region 101 and a portion of the capacitor region 105.

As shown in FIG. 1B, the memory array banks 102 of the memory array region 101 of the first microelectronic device structure 100 may be formed to include memory array regions 110, digit line exit regions 112 (also referred to as "digit line contact socket regions") interposed between pairs of the memory array regions 110 horizontally neighboring one another in a first horizontal direction (e.g., the Y-direction), and word line exit regions 114 (also referred to as "word line contact socket regions") interposed between additional pairs of the memory array region 110 horizontally neighboring one another in a second horizontal direction (e.g., the X-direction) orthogonal to the first horizontal direction. The memory array regions 110, the digit line exit regions 112, and the word line exit regions 114 are each described in further detail below. While the memory array regions 110 may not include arrays of memory cells at the processing stage illustrated and described in FIG. 1A and FIG. 1B, the memory array regions 110 are processed to include arrays of memory cells during subsequent processing acts, as described below.

The memory array regions 110 of the first microelectronic device structure 100 may comprise horizontal areas of the first microelectronic device structure 100 configured and positioned to have arrays of memory cells (e.g., arrays of DRAM cells) subsequently formed within horizontal boundaries thereof, as described in further detail below. In addition, the memory array regions 110 may also be configured and positioned to have desirable arrangements of control logic devices subsequently formed within horizontal boundaries thereof, as also described in further detail below. The control logic devices to be formed within the horizontal boundaries of the memory array regions 110 may be formed in a second microelectronic device structure (e.g., a second microelectronic device structure 200 (FIG. 5A)) to be vertically offset (e.g., in the Z-direction) from the memory cells to be formed within the horizontal boundaries of the memory array regions 110. In some embodiments, the control logic devices are formed within the second microelectronic device structure and are located within horizontal boundaries of the memory array regions 110.

The first microelectronic device structure 100 may be formed to include a desired quantity of the memory array regions 110. For clarity and ease of understanding of the drawings and related description, FIG. 1B depicts the first microelectronic device structure 100 as being formed to include four (4) memory array regions 110. In additional embodiments, the first microelectronic device structure 100 is formed to include a different number of memory array regions 110. For example, the first microelectronic device structure 100 may be formed to include greater than eight (8) memory array regions 110, such as greater than or equal to sixteen (16) memory array regions 110, greater than or equal to thirty-two (32) memory array regions 110, greater than or equal to sixty-four (64) memory array regions 110, greater than or equal to one hundred twenty eight (128) memory array regions 110, greater than or equal to two hundred fifty six (256) memory array regions 110, greater than or equal to five hundred twelve (512) memory array regions 110, or greater than or equal to one thousand twenty-four (1024) memory array regions 110.

In addition, the first microelectronic device structure 100 may be formed to include a desired distribution of the memory array regions 110. As shown in FIG. 1B, in some embodiments, the first microelectronic device structure 100 is formed to include rows 107 of the memory array regions 110 extending in the X-direction, and columns 109 of the memory array regions 110 extending in the Y-direction.

With continued reference to FIG. 1B, the digit line exit regions 112 of the first microelectronic device structure 100 may comprise horizontal areas of the first microelectronic device structure 100 configured and positioned to have at least some subsequently formed digit lines (e.g., bit lines, data lines) horizontally terminate therein. For an individual digit line exit region 112, at least some subsequently formed digit lines operatively associated with memory array regions 110 flanking (e.g., at opposing boundaries in the Y-direction) the digit line exit region 112 may have ends within the horizontal boundaries of the digit line exit region 112. In addition, the digit line exit regions 112 may also be configured and positioned to include contact structures and routing structures within the horizontal boundaries thereof that are operatively associated with at least some of the subsequently formed digit lines. As described in further detail below, some of the contact structures to be formed within the digit line exit regions 112 may couple the subsequently formed digit lines to control logic circuitry of control logic devices (e.g., sense amplifier (SA) devices) to subsequently be formed within the memory array regions 110. As shown in FIG. 1B, in some embodiments, the digit line exit regions 112 horizontally extend in the X-direction and are horizontally interposed between horizontally neighboring rows 107 of the memory array regions 110 in the Y-direction. The digit line exit regions 112 may, for example, horizontally alternate with the rows 107 of the memory array regions 110 in the Y-direction.

An individual digit line exit region 112 may be divided into multiple subregions. For example, as shown in FIG. 1B, an individual digit line exit region 112 may include first digit line exit subregions 112A and second digit line exit subregions 112B. In some embodiments, the first digit line exit subregions 112A horizontally alternate with the second digit line exit subregions 112B in the X-direction. A pair (e.g., two (2)) of horizontally neighboring memory array regions 110 within an individual column 109 of the memory array regions 110 may include one (1) of the first digit line exit subregions 112A and one (1) of the second digit line exit subregions 112B positioned horizontally therebetween in the Y-direction. By way of non-limiting example, a first memory array region 110 and the second memory array region 110 of a first column 109 of the memory array regions 110 may include one (1) of the first digit line exit subregions 112A and one (1) of the second digit line exit subregions 112B positioned therebetween in the Y-direction. The one (1) of the first digit line exit subregions 112A and the one (1) of the second digit line exit subregions 112B may be at least partially (e.g., substantially) confined with horizontal boundaries in the X-direction of the first memory array region 110 and the second memory array region 110.

An individual first digit line exit subregion 112A may be configured and positioned to facilitate electrical connections between a group of digit lines (e.g., odd digit lines or even digit lines) and a group of control logic devices (e.g., odd SA devices or even SA devices) operatively associated with a portion (e.g., a half portion in the X-direction) of one (1) memory array region 110 of a pair of horizontally neighboring memory array regions 110 and to also facilitate electrical connections between a group of additional digit lines (e.g., additional odd digit lines or additional even digit lines) and a group of additional control logic devices (e.g., additional odd SA devices or additional even SA devices) operatively associated with a corresponding portion (e.g., a corresponding half portion in the X-direction) of an additional memory array region 110 of the pair of horizontally neighboring memory array regions 110. In addition, as also described in further detail below, an individual second digit line exit subregion 112B may be configured and positioned to facilitate electrical connections between a group of further digit lines and a group of further control logic devices operatively associated with another portion (e.g., another half portion in the X-direction) of the one (1) memory array region 110, and to also facilitate electrical connections between a group of yet further digit lines and a group of yet further control logic devices operatively associated with a corresponding another portion (e.g., a corresponding another half portion in the X-direction) of the additional memory array region 110.

Still referring to FIG. 1B, the word line exit regions 114 of the first microelectronic device structure 100 may comprise horizontal areas of the first microelectronic device structure 100 configured and positioned to have at least some subsequently formed word lines (e.g., access lines) horizontally terminate therein. For an individual word line exit region 114, at least some subsequently formed word lines operatively associated with the memory array regions 110 flanking (e.g., at opposing boundaries in the X-direction) the word line exit region 114 may have ends within the horizontal boundaries of the word line exit region 114. In addition, the word line exit regions 114 may also be configured and positioned to include contact structures and routing structures within the horizontal boundaries thereof that are operatively associated with the subsequently formed word lines. As described in further detail below, some of the contact structures to be formed within the word line exit regions 114 may couple the subsequently formed word lines to control logic circuitry of additional control logic devices (e.g., sub-word line driver (SWD) devices) to subsequently be formed within the memory array regions 110. As shown in FIG. 1B, in some embodiments, the word line exit regions 114 horizontally extend in the Y-direction and are horizontally interposed between horizontally neighboring columns of the memory array regions 110 in the X-direction. The word line exit regions 114 may, for example, horizontally alternate with the columns 109 of the memory array regions 110 in the X-direction.

An individual word line exit region 114 may be divided into multiple subregions. For example, as shown in FIG. 1B an individual word line exit region 114 may include first word line exit subregions 114A and second word line exit subregions 114B. In some embodiments, the first word line exit subregions 114A horizontally alternate with the second word line exit subregions 114B in the Y-direction. A pair (e.g., two (2)) of horizontally neighboring memory array regions 110 within an individual row 107 of the memory array regions 110 may include one (1) of the first word line exit subregions 114A and one (1) of the second word line exit subregions 114B positioned horizontally therebetween in the X-direction. By way of non-limiting example, a first array region and a third array region of a first row 107 of the memory array regions 110 may include one (1) of the first word line exit subregions 114A and one (1) of the second word line exit subregions 114B positioned therebetween in the X-direction. The one (1) of the first word line exit subregions 114A and the one (1) of the second word line exit subregions 114B may be at least partially (e.g., substantially) confined with horizontal boundaries in the Y-direction of the first array region and the third array region.

An individual first word line exit subregion 114A may be configured and positioned to facilitate electrical connections between a group of word lines (e.g., odd word lines or even word lines) and a group of control logic devices (e.g., odd SWD devices or even SWD devices) operatively associated with a portion (e.g., a half portion in the Y-direction) of one (1) memory array region 110 of a pair of horizontally neighboring memory array regions 110, and to also facilitate electrical connections between a group of additional word lines (e.g., additional odd word lines or additional even word lines) and a group of additional control logic devices (e.g., additional odd SWD devices or additional even SWD devices) operatively associated with a corresponding portion (e.g., a corresponding half portion in the Y-direction) of a further memory array (e.g., the third memory array region 110) of the pair of horizontally neighboring memory array regions 110. In addition, as also described in further detail below, an individual second word line exit subregion 114B may be configured and positioned to facilitate electrical connections between a group of further word lines and a group of further control logic devices operatively associated with another portion (e.g., another half portion in the Y-direction) of the one (1) memory array region 110 (e.g., the first memory array region 110), and to also facilitate electrical connections between a group of yet further word lines and a group of yet further control logic devices operatively associated with a corresponding another portion (e.g., a corresponding another half portion in the Y-direction) of the further memory array region 110 (e.g., the third memory array region 110).

With continued reference to FIG. 1B, the capacitor region 105 of the first microelectronic device structure 100 may comprise horizontal areas of the first microelectronic device structure 100 configured and positioned to facilitate electrical connections (e.g., by way of contact structures and routing structures formed within horizontal boundaries thereof) between control logic circuitry and additional structures (e.g., BEOL structures) of the second microelectronic device structure, as described in further detail below. The capacitor region 105 may horizontally neighbor one or more peripheral horizontal boundaries (e.g., in the Y-direction, in the X-direction) of one or more groups of the memory array regions 110 of the memory array banks 102 (FIG. 1A). For clarity and ease of understanding of the drawings and related description, FIG. 1B depicts the first microelectronic device structure 100 as being formed to include one (1) capacitor region 105 horizontally neighboring a shared horizontal boundary of two of the memory array regions 110. However, the first microelectronic device structure 100 may be formed to include one or more of a different quantity and a different horizontal position of capacitor regions 105. As a non-limiting example, the first microelectronic device structure 100 may be formed to include multiple (e.g., a plurality of, more than one) capacitor regions 105 horizontally neighboring different groups of the memory array regions 110 than one another. In some embodiments, the capacitor region 105 comprises a first portion 105A horizontally neighboring the memory array regions 101 and a second portion 105B horizontally spaced (e.g., in the Y-direction) from the memory array regions 101. In some embodiments, the first portion 105A comprises BEOL structures and socket structures and the second portion 105B comprises capacitor structures (e.g., the capacitor structures 149 (FIG. 8D)).

FIG. 2A through FIG. 2D illustrate simplified, partial longitudinal cross-sectional views of different regions of the first microelectronic device structure 100 previously described with reference to FIG. 1B. FIG. 2A illustrates a simplified, partial longitudinal cross-sectional view from the perspective of the Y-direction (so as to depict an XZ-plane) of one of the memory array regions 110 of the first microelectronic device structure 100 taken through section line A-A of FIG. 1B. FIG. 2B illustrates a simplified, partial longitudinal cross-sectional view from the perspective of the Y-direction (so as to depict an XZ-plane) of one of the digit line exit regions 112 of the first microelectronic device structure 100 taken through section line B-B of FIG. 1B. FIG. 2C illustrates a simplified, partial longitudinal cross-sectional view from the perspective of the X-direction (so as to depict a YZ-plane) of one of the word line exit regions 114 of the first microelectronic device structure 100 taken through section line C-C of FIG. 1B. FIG. 2D illustrates a simplified, partial longitudinal cross-sectional view from the perspective of the X-direction (so as to depict a YZ-plane) of one of the capacitor region 105 of the first microelectronic device structure 100 taken through section line D-D of FIG. 1B.

Referring collectively to FIG. 2A through FIG. 2D, the first microelectronic device structure 100 may be formed to include a first base semiconductor structure 120, filled trenches 122, and a first isolation material 124. The filled trenches 122 vertically extend (e.g., in the Z-direction) into the first base semiconductor structure 120. The first isolation material 124 covers and surrounds surfaces of the first base semiconductor structure 120.

The first base semiconductor structure 120 comprises a base material or construction upon which additional features (e.g., materials, structures, devices) of the first microelectronic device structure 100 are formed. The first base semiconductor structure 120 may comprise a semiconductor structure (e.g., a semiconductor wafer), or a base semiconductor material on a supporting structure. The first base semiconductor structure 120 may be formed of and include one or more of semiconductor material (e.g., one or more of a silicon material, such as monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductor material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; $\alpha$-$Al_2O_3$), and silicon carbide). In some embodiments, the first base semiconductor structure 120 may comprise a conventional silicon substrate (e.g., a conventional silicon wafer), or another bulk substrate comprising a semiconductor material. In some embodiments, the first base semiconductor structure 120 comprises a silicon wafer. The first base semiconductor structure 120 may include one or more layers, structures, and/or regions formed therein and/or thereon.

The filled trenches 122 may comprise trenches (e.g., openings, vias, apertures) within the first base semiconductor structure 120 that are at least partially (e.g., substantially) filled with the first isolation material 124. The filled trenches 122 may, for example, be employed as shallow trench isolation (STI) structures within the first base semiconductor structure 120. The filled trenches 122 may be formed to vertically extend partially (e.g., less than completely) through the first base semiconductor structure 120.

The first isolation material 124 may be formed of and include at least one insulative material. By way of non-limiting example, the first isolation material 124 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first isolation material 124 is formed of and includes $SiO_x$ (e.g., $SiO_2$). The first isolation material 124 may be substantially homogeneous, or the first isolation material 124 may be heterogeneous. In some embodiments, the first isolation material 124 is substantially homogeneous. In additional embodiments, the first isolation material 124 is heterogeneous. The first isolation material 124 may, for example, be formed of and include a stack of at least two different dielectric materials.

Access devices 126 (FIG. 2A) (e.g., access transistors) may be formed within the memory array regions 110 (FIG. 2A). In addition, digit lines 128 (FIG. 2A and FIG. 2B) (e.g., data lines, bit lines) may be formed to be coupled to the access devices 126 (FIG. 2A) and to horizontally extend in the Y-direction through the memory array regions 110. At least some of the digit lines 128 (FIG. 2A and FIG. 2B) may terminate (e.g., end) within the digit line exit region 112 (FIG. 2B). Furthermore, word lines 130 (e.g., access lines) may be formed to be coupled to the access devices 126 (FIG. 2A) and to horizontally extend in the X-direction through the memory array region 110. At least some of the word lines 130 (FIG. 2A and FIG. 2C) may terminate within the word line exit region 114 (FIG. 2C).

The access devices 126 formed within the memory array region 110 may be employed as components of memory cells (e.g., DRAM cells) to be formed within the memory array region 110. By way of non-limiting example, each access device 126 may individually be formed to include a channel region comprising a portion of the first base semiconductor structure 120; a source region and a drain region each individually comprising one or more of at least one conductively doped portion of the first base semiconductor structure 120 and/or at least one conductive structure formed in, on, or over the first base semiconductor structure 120; and at least one gate structure comprising a portion of at least one of the word lines 130. Each access device 126 may also include a gate dielectric material (e.g., a dielectric oxide material) formed to be interposed between the channel region thereof and the gate structure thereof.

The digit lines 128 may exhibit horizontally elongate shapes extending in parallel in the Y-direction; and the word lines 130 may exhibit horizontally elongate shapes extending in parallel in the X-direction orthogonal to the Y-direction. As used herein, the term "parallel" means substantially parallel. The digit lines 128 and the word lines 130 may each individually be formed of and include conductive material. By way of non-limiting example, the digit lines 128 and the word lines 130 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit lines 128 and the word lines 130 are each individually formed of and include one or more of W, Ru, Mo, and titanium nitride ($TiN_y$). Each of the digit lines 128 and each of the word lines 130 may individually be substantially homogeneous, or one or more of the digit lines 128 and/or one or more of the word lines 130 may individually be substantially heterogeneous. In some embodiments, each of the digit lines 128 and each of the word lines 130 are formed to be substantially homogeneous.

Still referring to FIG. 2A, within the memory array region 110, additional features (e.g., structures, materials) are also formed on, over, and/or between the access devices 126, the digit lines 128, and the word lines 130. For example, as shown in FIG. 2A, first contact structures 132 (e.g., digit line contact structures, also referred to as so-called "bitcon" structures) may be formed to vertically extend between and couple the access devices 126 to the digit lines 128; second contact structures 134 (e.g., cell contact structures, also referred to as so-called "cellcon" structures) may be formed in contact with the access devices 126 and may configured and positioned to couple the access devices 126 to subsequently formed storage node devices (e.g., capacitors); dielectric cap structures 136 may be formed on or over the digit lines 128; and additional dielectric cap structures 138 may be formed on or over the word lines 130. In addition, dielectric structures (e.g., dielectric spacers, such as low-k dielectric spacers formed of and including one or more low-k dielectric materials) may be formed to intervene (e.g., horizontally intervene) between and isolate the second contact structures 134 and digit lines 128; and further dielectric structures (e.g., gate dielectric structures, such as gate dielectric oxide structures) may be formed to intervene (e.g., horizontally intervene) between and isolate the first contact structures 132 and the word lines 130.

The first contact structures 132 and the second contact structures 134 may individually be formed of and include at least one conductive material. In some embodiments, the first contact structures 132 and the second contact structures 134 are individually formed of and include one or more of at least one metal (e.g., W), at least one alloy, at least one conductive metal silicide (e.g., one or more of titanium silicide ($TiSi_x$), cobalt silicide ($CoSi_x$), tungsten silicide ($WSi_x$), tantalum silicide ($TaSi_x$), molybdenum silicide ($MoSi_x$), and nickel silicide ($NiSi_x$)), and at least one conductive metal nitride (e.g., one or more of $TiN_y$, tungsten nitride ($WN_y$), tantalum nitride ($TaN_y$), cobalt nitride ($CoN_y$), molybdenum nitride ($MoN_y$), and nickel nitride ($NiN_y$)). In addition, the dielectric cap structures 136 and the additional dielectric cap structures 138 may individually be formed of and include at least one insulative material. In some embodiments, the dielectric cap structures 136 and the additional dielectric cap structures 138 are individually formed of and include a dielectric nitride material (e.g., $SiN_y$, such as $Si_3N_4$).

Referring to FIG. 2B, within the digit line exit region 112, at least some of the digit lines 128 may horizontally terminate (e.g., end) in the Y-direction. Each of the digit lines 128 horizontally extending through the memory array regions 110 (FIG. 2A) and horizontally terminating within the digit line exit region 112 may be formed to terminate at substantially the same horizontal position in the Y-direction; or at least one of the digit lines 128 horizontally terminating within the digit line exit region 112 may be formed to terminate at a different horizontal position in the Y-direction within the digit line exit region 112 than at least one other of the digit lines 128 horizontally terminating within the digit line exit region 112. In some embodiments, at least some digit lines 128 horizontally neighboring one another in the X-direction have terminal ends (e.g., terminal surfaces) horizontally offset from one another in the Y-direction. Horizontally offsetting the terminal ends of some of the digit lines 128 from the terminal ends of some other of the digit lines 128 within the digit line exit region 112 may, for example, promote or facilitate desirable contact structure arrangements within the digit line exit region 112.

Referring next to FIG. 2C, within the word line exit region 114, at least some of the word lines 130 may horizontally terminate (e.g., end) in the X-direction. Each of the word lines 130 horizontally extending through the memory array region 110 (FIG. 2A) and horizontally terminating within the word line exit region 114 may be formed to terminate at substantially the same horizontal position in the X-direction; or at least one of the word lines 130 horizontally terminating within the word line exit region 114 may be formed to terminate at a different horizontal position in the X-direction within the word line exit region 114 than at least one other of the word lines 130 horizontally terminating within the word line exit region 114. In some embodiments, at least some word lines 130 horizontally neighboring one another in the Y-direction have terminal ends (e.g., terminal surfaces) horizontally offset from one another in the X-direction. Horizontally offsetting the terminal ends of some of the word lines 130 from the terminal ends of some other of the word lines 130 within the word line exit region 114 may, for example, promote or facilitate desirable contact structure arrangements within the word line exit region 114.

Referring collectively to FIG. 2B through FIG. 2D, third contact structures 142 may be formed within each of the digit line exit region 112 (FIG. 2B), the word line exit region 114 (FIG. 2C), and the capacitor region 105 (FIG. 2D). The third contact structures 142 may be formed to vertically extend (e.g., in the Z-direction) to and contact the first base semiconductor structure 120. In addition, as described in further detail below, some of the third contact structures 142 may be formed to contact to portions of the digit lines 128 (FIG. 2B) within the digit line exit region 112 (FIG. 2B), and some other of the third contact structures 142 may be formed to contact portions of the word lines 130 (FIG. 2C) within the word line exit region 114 (FIG. 2C).

Referring to FIG. 2B, within the digit line exit region 112, a first group 142A of the third contact structures 142 may be formed to contact at least some of the digit lines 128 horizontally extending (e.g., in the Y-direction) into the digit line exit region 112. Each third contact structure 142 of the first group 142A of third contact structures 142 may be considered to be a digit line contact structure (e.g., a so-called "edge of array" digit line contact structure). As shown in FIG. 2B, each third contact structure 142 of the first group 142A of third contact structures 142 may be formed to physically contact and vertically extend completely through an individual digit line 128. For example, within the digit line exit region 112, each third contact structure 142 of the first group 142A may be formed to physically contact and vertically extend through each of a second isolation material 140, one of the digit lines 128, and the first isolation material 124. Accordingly, each third contact structure 142 of the first group 142A may be formed to be coupled to one of the digit lines 128. In some embodiments, outer sidewalls of each third contact structure 142 of the first group 142A of the third contact structures 142 physically contact inner sidewalls of an individual digit line 128. In addition, each third contact structure 142 of the first group 142A may be formed to vertically terminate on or within the first base semiconductor structure 120, such as on or within a portion of the first base semiconductor structure 120 vertically underlying one of the filled trenches 122 within the digit line exit region 112.

Referring next to FIG. 2C, within the word line exit region 114, a second group 142B of the third contact structures 142 may be formed to contact at least some of the word lines 130 horizontally extending (e.g., in the X-direction) into the word line exit region 114. Each third contact structure 142 of the second group 142B of third contact structures 142 may be considered to be a word line contact structure (e.g., a so-called "edge of array" word line contact structure). As shown in FIG. 2C, each third contact structure 142 of the second group 142B of third contact structures 142 may be formed to physically contact and vertically extend completely through an individual word line 130. For example, within the word line exit region 114, each third contact structure 142 of the second group 142B may be formed to physically contact and vertically extend through each of the second isolation material 140, one of the word lines 130, and the first isolation material 124. Accordingly, each third contact structure 142 of the second group 142B may be formed to be coupled to one of the word lines 130. In some embodiments, outer sidewalls of each third contact structure 142 of the second group 142B of the third contact structures 142 physically contact inner sidewalls of an individual word line 130. In addition, each third contact structure 142 of the second group 142B may be formed to vertically terminate on or within the first base semiconductor structure 120, such as on or within a portion of the first base semiconductor structure 120 vertically underlying one of the filled trenches 122 within the word line exit region 114.

Referring next to FIG. 2D, within the capacitor region 105, a third group 142C of the third contact structures 142 may be formed to vertically extend to portions of the first base semiconductor structure 120 located within the capacitor region 105. Each third contact structure 142 of the third group 142C of third contact structures 142 may be considered to be a deep contact structure (e.g., a deep contact structure to be electrically connected to one or more BEOL structures to subsequently be formed). Within the capacitor region 105, each third contact structure 142 of the third group 142C may be formed to physically contact and vertically extend through each of the second isolation material 140 and the first isolation material 124; and may vertically terminate on or within the first base semiconductor structure 120, such as on or within a portion of the first base semiconductor structure 120 vertically underlying one of the filled trenches 122 within the capacitor region 105.

Collectively referring again to FIG. 2A through FIG. 2D, the third contact structures 142, including the first group 142A (FIG. 2B), the second group 142B (FIG. 2C), and the third group 142C (FIG. 2D) thereof, may be formed of and include conductive material. By way of non-limiting example, the third contact structures 142 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third contact structures 142 are each individually formed of and include W. Each of the third contact structures 142 may be substantially homogeneous, or one or more of the third contact structures 142 may individually be heterogeneous. In some embodiments, each of the third contact structures 142 is substantially homogeneous. In additional embodiments, each of the third contact structures 142 is heterogeneous. Each third contact structure 142 may, for example, be formed of and include a stack of at least two different conductive materials.

Referring collectively to FIG. 2A through FIG. 2D, the second isolation material 140 may be formed on or over portions of at least the first base semiconductor structure 120, the access devices 126 (FIG. 2A), the digit lines 128 (FIG. 2A and FIG. 2B), the word lines 130 (FIG. 2A and FIG. 2C), the second contact structures 134, the third contact structures 142, and the first isolation material 124. The second isolation material 140 may be formed of and include at least one insulative material. A material composition of second isolation material 140 may be substantially the same as a material composition of the first isolation material 124, or the material composition of the second isolation material 140 may be different than the material composition of the first isolation material 124. In some embodiments, the second isolation material 140 is formed of and includes a dielectric oxide material, such as $SiO_x$ (e.g., $SiO_2$).

Referring next to FIG. 3A through FIG. 3D, illustrated are simplified, partial longitudinal cross-sectional views, from the directional perspectives previously described, of the memory array region 110 (FIG. 3A), the digit line exit region 112 (FIG. 3B), the word line exit region 114 (FIG. 3C), and the capacitor region 105 (FIG. 3D) at a processing stage of the method of forming the microelectronic device following the processing stage previously described with reference to FIG. 2A through FIG. 2D. As collectively depicted in FIG. 3A through FIG. 3D, at least one first routing tier 144 including first routing structures 146 may be formed over the access devices 126 (FIG. 3A); storage node devices 148 (e.g., capacitors) may be formed over and in electrical communication with at least some of the first routing structures 146 within the memory array region 110 (FIG. 3A); fourth contact structures 150 (FIG. 3D) may be formed over and in electrical communication with at least some of the third contact structures 142 within the capacitor region 105 (FIG. 3D); a second routing tier 152 including second routing structures 154 and additional second routing structure 155 (FIG. 3D) may be formed over the storage node devices 148 and the fourth contact structures 150.

With continued collective reference to FIG. 3A through FIG. 3D, the first routing structures 146 of the first routing tier 144 may be employed to facilitate electrical communication between additional features (e.g., structures, materials, devices) coupled thereto. The first routing structures 146 may each individually be formed of and include conductive material. By way of non-limiting example, the first routing structures 146 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 146 are formed of and include W.

Referring to FIG. 3A, within the memory array region 110, at least some of the first routing structures 146 may be formed and configured to couple the access devices 126 (e.g., access devices) to the storage node devices 148 (e.g., capacitors) to form memory cells 156 (e.g., DRAM cells) within the memory array regions 110. Each memory cell 156 may individually include one of the access devices 126; one of the storage node devices 148; one of the second contact structures 134 interposed between the access device 126 and the storage node device 148; and one of the first routing structures 146 interposed between the second contact structure 134 and the storage node device 148. At least some of the first routing structures 146 within the memory array region 110 may, for example, be configured and employed as redistribution material (RDM) structures (also referred to as "redistribution layer" (RDL) structures) to effectively shift (e.g., stagger, adjust, modify) horizontal positions of semiconductor pillars of the access devices 126 to accommodate a desired arrangement (e.g., a hexagonal close packed arrangement) of the storage node devices 148 vertically over and in electrical communication with the access devices 126.

While FIG. 3A through FIG. 3D show the formation of a single (e.g., only one) first routing tier 144 including first routing structures 146, multiple (e.g., more than one) first routing tiers 144 each individually including a desired arrangement (e.g., pattern) of first routing structures 146 may be formed. By of non-limiting example, two or more (e.g., three or more) of the first routing tiers 144 may be formed, wherein different first routing tiers 144 are vertically offset from one another and each individually include a desired arrangement of first routing structures 146 therein. At least some of the first routing structures 146 within at least one of the first routing tiers 144 may be coupled to at least some of the first routing structures 146 within at least one other of the first routing tiers 144 by way of conductive interconnect structures.

Referring to again to FIG. 3A, within the memory array region 110, the storage node devices 148 may individually be formed and configured to store a charge representative of a programmable logic state of the memory cell 156 including the storage node device 148. In some embodiments, the storage node devices 148 comprise capacitors. During use and operation, a charged capacitor may represent a first logic state, such as a logic 1; and an uncharged capacitor may represent a second logic state, such as a logic 0. Each of the storage node devices 148 may, for example, be formed to include a first electrode (e.g., a bottom electrode) 148A, a second electrode (e.g., a top electrode) 148B, and a dielectric material 148C between the first electrode 148A and the second electrode 148B. Each of the first electrode 148A and the second electrode 148B may individually be formed of and include conductive material. The dielectric material 148C may be formed of and include insulative material.

Figure 3D:
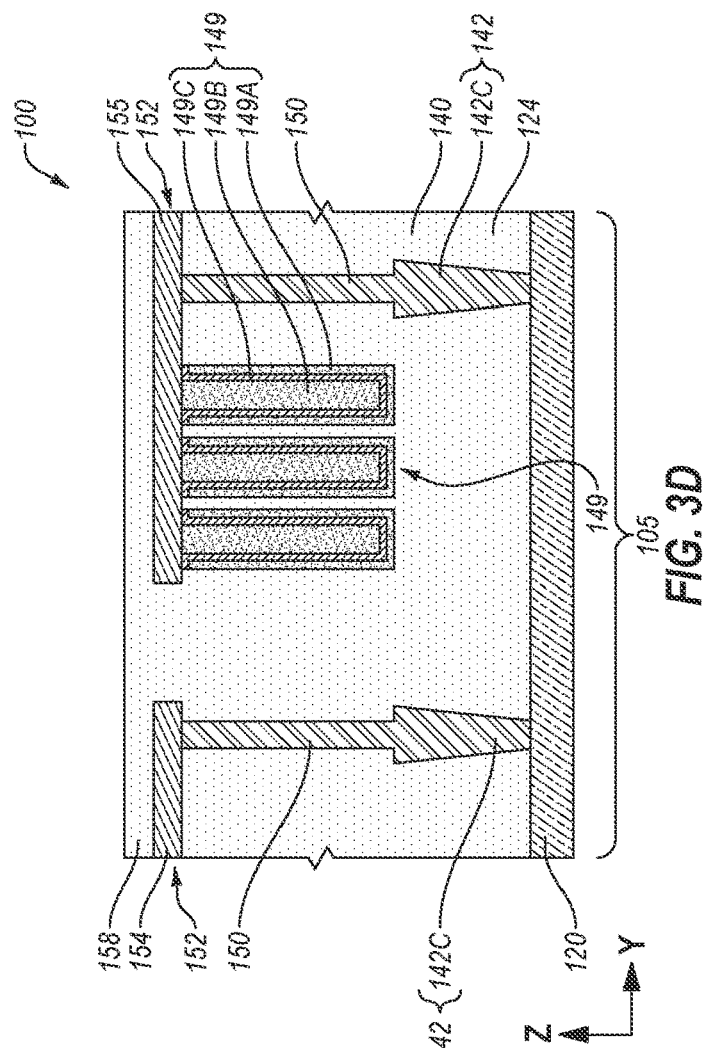
Figure 3C:
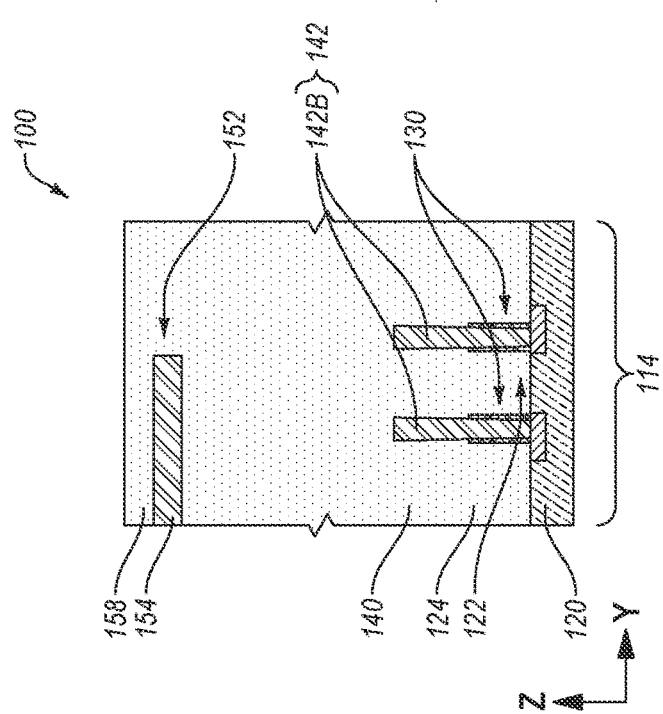

Referring next to FIG. 3D, within the capacitor region 105, at least some of the fourth contact structures 150 may be formed to be coupled to at least some of the third contact structures 142 of the third group 142C. The fourth contact structures 150 may individually be formed of and include conductive material. By way of non-limiting example, the fourth contact structures 150 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the fourth contact structures 150 is formed of and includes W. Each of the fourth contact structures 150 may be substantially homogeneous, or one or more of the fourth contact structures 150 may individually be heterogeneous. In some embodiments, each of the fourth contact structures 150 is substantially homogeneous. In additional embodiments, each of the fourth contact structures 150 is heterogeneous. Each fourth contact structure 150 may, for example, be formed of and include a stack of at least two different conductive materials.

As shown in FIG. 3D, within the capacitor region 105, one or more groups of capacitor structures 149 (e.g., additional storage node devices) may, optionally, also be formed. The capacitor structures 149 may be coupled to at least some of the additional second routing structures 155 of the second routing tier 152 positioned within the capacitor region 105. The capacitor structures 149 may be employed to enhance the performance of a microelectronic device formed through the methods of the disclosure. The capacitor structures 149 may, for example, subsequently (e.g., following completion of additional processing stages of the method of forming the microelectronic device) be coupled to and employed to assist with powering additional devices (e.g., control logic devices, access devices) of the microelectronic device. In some embodiments, the capacitor structures 149 are subsequently coupled to and employed to power control logic devices comprising complementary metal-oxide-semiconductor (CMOS) circuitry. As described in further detail below, the control logic devices may be components of an additional, separately-formed microelectronic device structure (e.g., a second microelectronic device structure 200 (FIG. 5A, FIG. 5B)) that is subsequently attached to the first microelectronic device structure 100 to facilitate the formation of a microelectronic device of the disclosure. The capacitor structures 149 formed within capacitor region 105 may be coupled to (e.g., by way of one or more of the additional second routing structures 155, one or more of the second routing structures 154, one or more of the fourth contact structures 150, one or more of the third contact structures 142, one or more additional routing structures, and one or more additional contact structures) to BEOL structures to subsequently be formed in the second microelectronic device structure, as also described in further detail below.

In some embodiments, the capacitor structures 149 of the capacitor region 105 (FIG. 3D) are vertically aligned (e.g., in the Z-direction) with the storage node devices 148 of the memory array (FIG. 3A). Stated another way, the capacitor structures 149 may be located within vertical boundaries of the storage node devices 148.

The capacitor structures 149 may be substantially similar to the storage node devices 148 of the memory array regions 110. In some embodiments, the capacitor structures 149 are formed substantially concurrently with formation of the storage node devices 148. By way of non-limiting example, the capacitor structures 149 may each individually comprise a first electrode (e.g., a bottom electrode) 149A, a second electrode (e.g., a top electrode) 149B, and a dielectric material 149C between the first electrode 149A and the second electrode 149B, which may be substantially similar (e.g., comprise substantially the same material composition) as each of the respective first electrode 148A, second electrode 148B, and dielectric material 148C of the storage node devices 148.

Referring collectively to FIG. 3A through FIG. 3D, in some embodiments, the second routing structures 154 of the second routing tier 152 may be employed to facilitate electrical communication between additional features (e.g., structures, materials, devices) coupled thereto. In some embodiments, one or more of the second routing structures 154 are formed to horizontally extend between and couple at least some of the storage node devices 148 (and, hence, the memory cells 156) (FIG. 3A) within the memory array region 110 (FIG. 3A) to one or more of the fourth contact structures 150 (FIG. 3D) within the capacitor region 105 (FIG. 3D).

In some embodiments, one or more of the additional second routing structures 155 are formed within the second routing tier 152 to horizontally extend between one of the third contact structures 142 of the third group 142C of the capacitor region 105 and the capacitor structures 149 of the capacitor region 105. In some embodiments, the one or more additional second routing structures 155 are electrically isolated from the second routing structure 154 of the second routing tier 152 and from the storage node devices 148 of the memory array region 110.

The second routing structures 154 and the additional second routing structures 155 may each be formed of and include conductive material. By way of non-limiting example, the second routing structures 154 and the additional second routing structures 155 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the second routing structures 154 and the additional second routing structures 155 of the second routing tier 152 is formed of and includes W.

With continued reference to FIG. 3A through FIG. 3D, a third isolation material 158 may be formed on or over portions of at least the second isolation material 140, the first routing structures 146, the storage node devices 148 (FIG. 3A), the capacitor structures 149 (FIG. 3D), the fourth contact structures 150 (FIG. 3D), the second routing structures 154, and the additional second routing structures 155 (FIG. 3D). The third isolation material 158 may be formed of and include at least one insulative material. A material composition of the third isolation material 158 may be substantially the same as a material composition of the second isolation material 140, or the material composition of the third isolation material 158 may be different than the material composition of the second isolation material 140. In some embodiments, the third isolation material 158 is formed of and includes a dielectric oxide material, such as $SiO_x$ (e.g., $SiO_2$). As shown in FIG. 3A through FIG. 3D, an upper surface of third isolation material 158 may be formed to be substantially planar and to vertically overlie upper surfaces of the second routing structures 154.

Referring next to FIG. 4A through FIG. 4D, illustrated are simplified, partial longitudinal cross-sectional views, from the directional perspectives previously described, of the memory array region 110 (FIG. 4A), the digit line exit region 112 (FIG. 4B), the word line exit region 114 (FIG. 4C), and the capacitor region 105 (FIG. 4D) at a processing stage of the method of forming the microelectronic device following the processing stage previously described with reference to FIG. 3A through FIG. 3D. As collectively depicted in FIG. 4A through FIG. 4D, an additional microelectronic device structure 175 (e.g., a second wafer) including a base structure 162 and a fourth isolation material 164 may be attached to the third isolation material 158 to form a first microelectronic device structure assembly 166. The first microelectronic device structure assembly 166 may then be vertically inverted (e.g., flipped upside down in the Z-direction), and an upper portion of the first base semiconductor structure 120 (FIG. 3A through FIG. 3D) may be removed to expose (e.g., uncover) the first isolation material 124 within the filled trenches 122 (FIG. 3A through FIG. 3D) and form a first semiconductor tier 168 (FIG. 4A) including first semiconductor structures 170 (FIG. 4A) separated from one another by remaining portions of the first isolation material 124. Thereafter, sacrificial structures 172 (e.g., sacrificial pad structures) (FIG. 4B through FIG. 4D) may be formed to physically contact at least some of the third contact structures 142, and a fifth isolation material 174 may be formed on or over surfaces of the sacrificial structures 172, the first semiconductor structures 170, and the first isolation material 124. In other embodiments, rather than forming sacrificial structures 172 physically contacting at least some of the third contact structures 142, conductive structures having the same size, shape, and geometric configuration of the sacrificial structures illustrated in FIG. 4B through FIG. 4D may be formed physically contacting at least some of the third contact structures 142.

The base structure 162 of the additional microelectronic device structure 175 comprises a base material or construction upon which additional features (e.g., materials, structures, devices) are formed. In some embodiments, the base structure 162 comprises a wafer. The base structure 162 may be formed of and include one or more of semiconductor material (e.g., one or more of a silicon material, such monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductor material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; a-$Al_2O_3$), and silicon carbide). By way of non-limiting example, the base structure 162 may comprise a semiconductor wafer (e.g., a silicon wafer), a glass wafer, or a ceramic wafer. The base structure 162 may include one or more layers, structures, and/or regions formed therein and/or thereon.

The fourth isolation material 164 of the additional microelectronic device structure 175 may be formed of and include at least one insulative material. A material composition of the fourth isolation material 164 may be substantially the same as a material composition of the third isolation material 158; or the material composition of the fourth isolation material 164 may be different than the material composition of the third isolation material 158. In some embodiments, the fourth isolation material 164 is formed of and includes a dielectric oxide material, such as $SiO_x$ (e.g., $SiO_2$).

To attach the additional microelectronic device structure 175 to the third isolation material 158, the fourth isolation material 164 of the additional microelectronic device structure 175 may be provided in physical contact with the third isolation material 158, and the fourth isolation material 164 and the third isolation material 158 may be exposed to annealing conditions to form bonds (e.g., oxide-to-oxide bonds) between the fourth isolation material 164 and the third isolation material 158. By way of non-limiting example, the fourth isolation material 164 and the third isolation material 158 may be exposed to a temperature greater than or equal to about 400° C. (e.g., within a range of from about 400° C. to about 800° C., greater than about 800° C.) to form oxide-to-oxide bonds between the third isolation material 158 and the fourth isolation material 164. In some embodiments, the third isolation material 158 and the fourth isolation material 164 are exposed to at least one temperature greater than about 800° C. to form oxide-to-oxide bonds between the third isolation material 158 and the fourth isolation material 164.

As shown in FIG. 4A through FIG. 4D, bonding the fourth isolation material 164 to the third isolation material 158 may form a first connected isolation structure 163. In FIG. 4A through FIG. 4D, the fourth isolation material 164 and the third isolation material 158 of the first connected isolation structure 163 are distinguished from one another by way of a dashed line. However, the fourth isolation material 164 and the third isolation material 158 may be integral and continuous with one another. Put another way, the first connected isolation structure 163 may be a substantially monolithic structure including the fourth isolation material 164 as a first region thereof, and the third isolation material 158 as a second region thereof. In some such embodiments, the fourth isolation material 164 may be attached to the third isolation material 158 thereof without a bond line.

Still collectively referring to FIG. 4A through FIG. 4D, the upper portion of the first base semiconductor structure 120 (FIG. 3A through FIG. 3D) vertically overlying the filled trenches 122 (FIG. 3A through FIG. 3D) following the vertical inversion of the first microelectronic device structure assembly 166 may be removed using at least one conventional wafer thinning process (e.g., a conventional chemical-mechanical planarization (CMP) process; a conventional etching process, such as a conventional dry etching process, or a conventional wet etching process). The first semiconductor structures 170 (FIG. 4A) may be formed to exhibit a desired vertical height (e.g., in the Z-direction) after the material removal process. The material removal process may also remove portions (e.g., upper portions following the vertical inversion of the first microelectronic device structure assembly 166) of the first isolation material 124. In addition, within the digit line exit region 112 (FIG. 4B), the word line exit region 114 (FIG. 4C), and the capacitor region 105 (FIG. 4D), the material removal process may partially expose the third contact structures 142. The material removal process may also remove portions (e.g., upper portions following the vertical inversion of the first microelectronic device structure assembly 166) of the third contact structures 142.

Figure 4B:
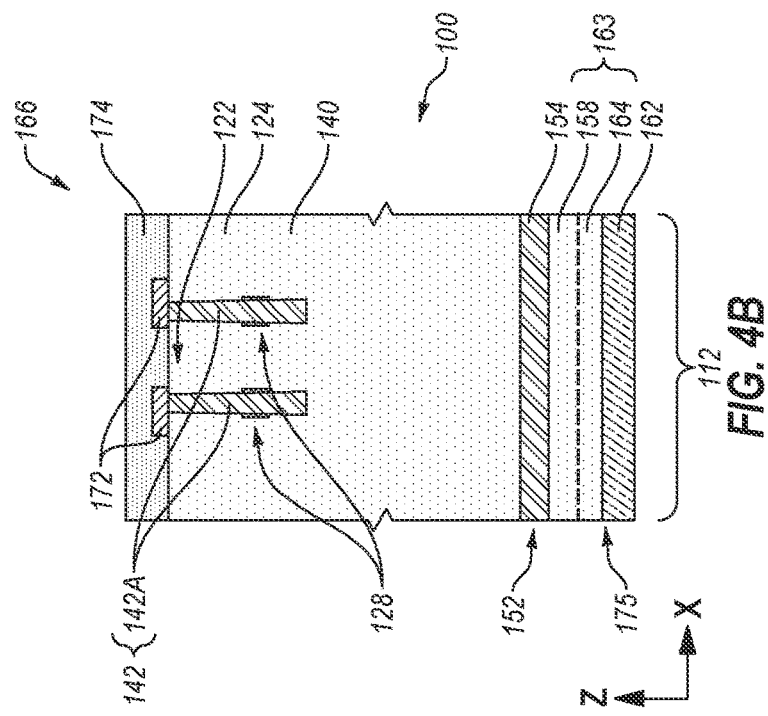
FIG. 4A through FIG. 4D are simplified, partial longitudinal cross-sectional views of the memory array (FIG. 4A), the digit line exit region (FIG. 4B), the word line exit region (FIG. 4C), and the capacitor region (FIG. 4D) shown in FIG. 3A through FIG. 3D, respectively, at another processing stage of the method of forming the microelectronic device following the processing stage of FIG. 3A through FIG. 3D.
Figure 4A:
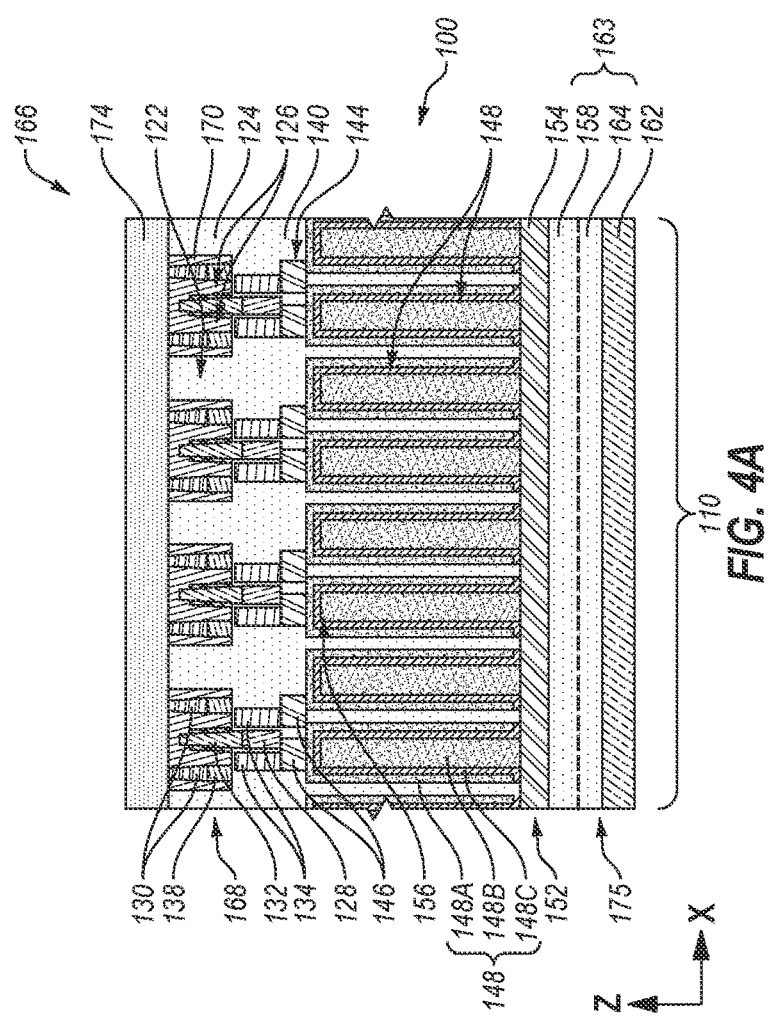
Figure 4D:
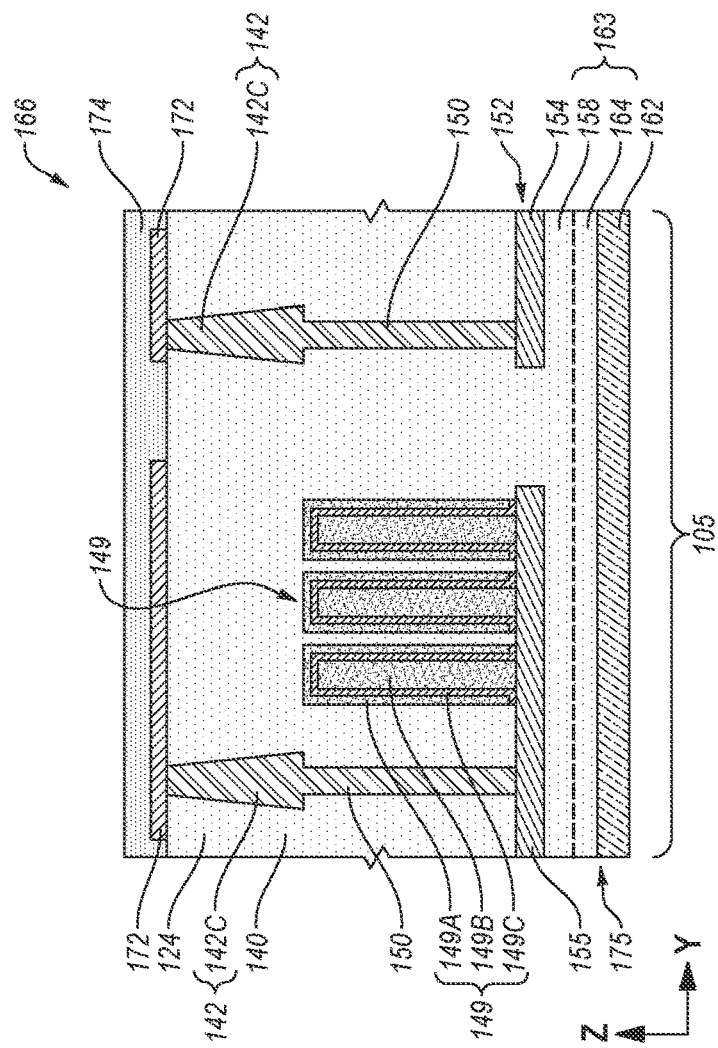
Figure 4C:
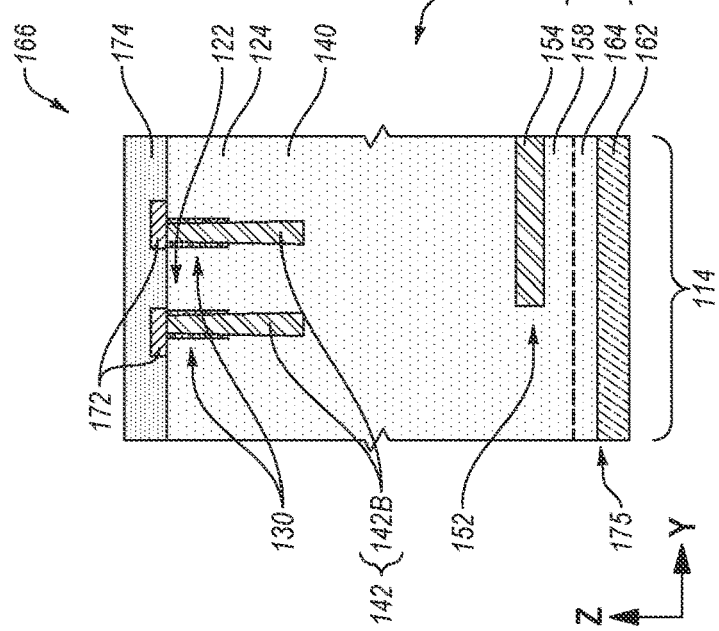

Referring still to FIG. 4B through FIG. 4D, the sacrificial structures 172 may be formed to have desirable geometric configurations (e.g., shapes, dimensions) and horizontal positions (e.g., in the X-direction and in the Y-direction). The geometric configurations, horizontal positions, and horizontal spacing of the sacrificial structures 172 at least partially depends on the geometric configurations, horizontal positions, and horizontal spacing of the third contact structures 142. Individual sacrificial structures 172 may be formed to at least partially horizontally overlap individual third contact structures 142. In some embodiments, the each sacrificial structure 172 is formed to substantially cover an upper surface of the third contact structure 142 in physical contact therewith. Individual sacrificial structures 172 may be formed to have horizontal dimensions (e.g., in the X-direction and in the Y-direction) greater than or equal to corresponding horizontal dimensions of individual third contact structures 142 in physical contact therewith.

The sacrificial structures 172 may be formed of and include at least one material (e.g., at least one dielectric material) that may be selectively removed relative to the fifth isolation material 174, the first isolation material 124, and the third contact structures 142. For example, the sacrificial structures 172 may be selectively etchable relative to the fifth isolation material 174 during common (e.g., collective, mutual) exposure to a first etchant, and the fifth isolation material 174 may be selectively etchable to the sacrificial structures 172 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. A material composition of the sacrificial structures 172 is different than the material compositions of the fifth isolation material 174, the first isolation material 124, and the third contact structures 142. As a non-limiting example, the sacrificial structures 172 may comprise at least one insulative material having a different material composition than insulative material(s) of the fifth isolation material 174 and the first isolation material 124. In some embodiments, the sacrificial structures 172 are formed of and include one or more of at least one dielectric nitride material (e.g., $SiN_y$, such as $Si_3N_4$), and at least one dielectric oxynitride material (e.g., $SiO_xN_y$). The sacrificial structures 172 may individually be substantially homogeneous, or the sacrificial structures 172 may individually be heterogeneous.

Referring collectively to FIG. 4A through FIG. 4D, the fifth isolation material 174 may be formed to cover surfaces of the first semiconductor structures 170 (FIG. 4A), and the sacrificial structures 172 (FIG. 4B through FIG. 4D). A material composition of the fifth isolation material 174 may be substantially the same as a material composition of the first isolation material 124, or the material composition of the fifth isolation material 174 may be different than the material composition of the first isolation material 124. In some embodiments, the fifth isolation material 174 is formed of and includes a dielectric oxide material, such as $SiO_x$ (e.g., $SiO_2$). As shown in FIG. 4A through FIG. 4D, an upper surface of the fifth isolation material 174 may be formed to be substantially planar and to vertically overlie upper surfaces of the sacrificial structures 172 (FIG. 4B through FIG. 4D).

Figure 5A:
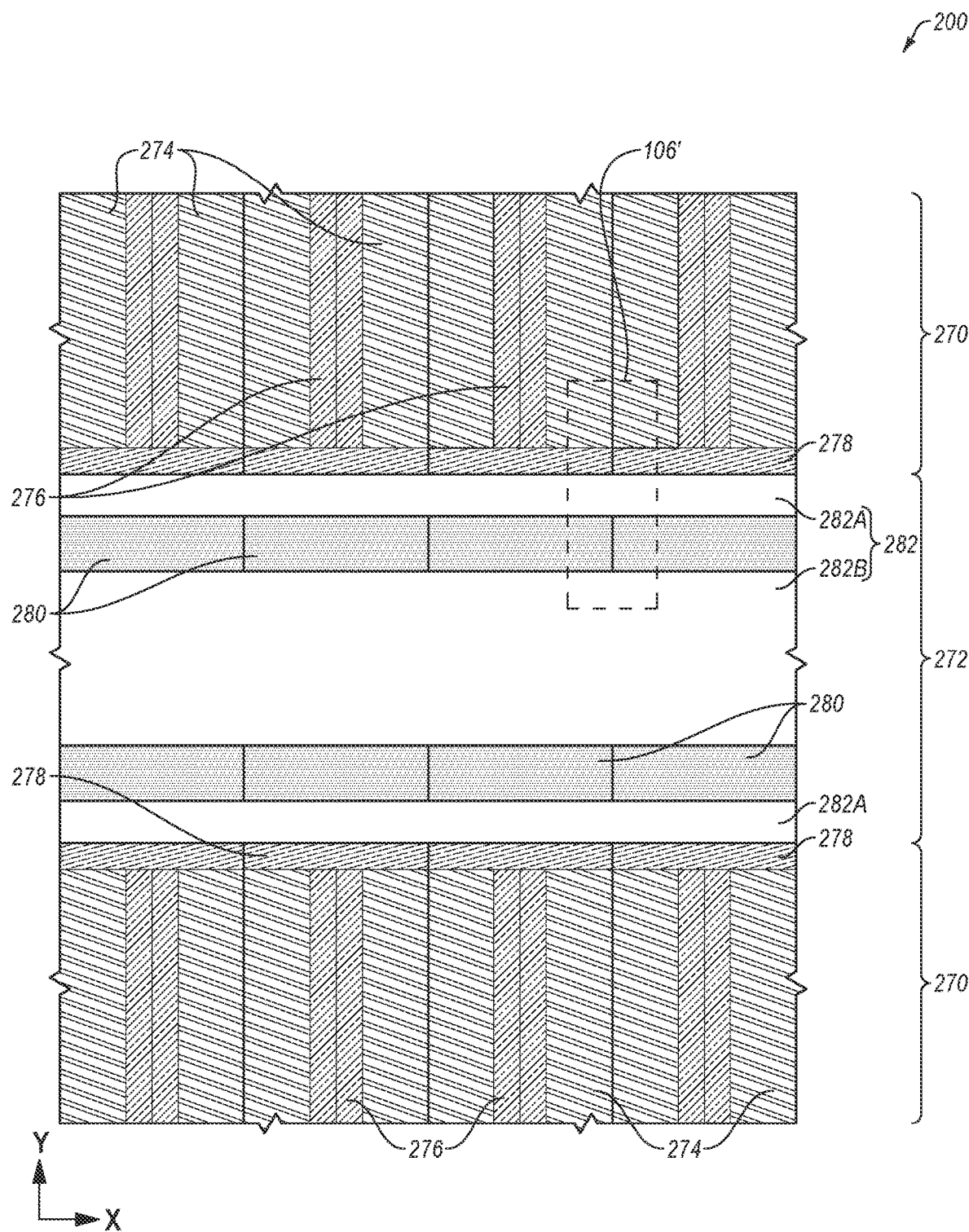
FIG. 5A and FIG. 5B are simplified plan views of a microelectronic device structure at a processing stage of a method of forming a second microelectronic device, in accordance with embodiments of the disclosure.
Figure 5B:
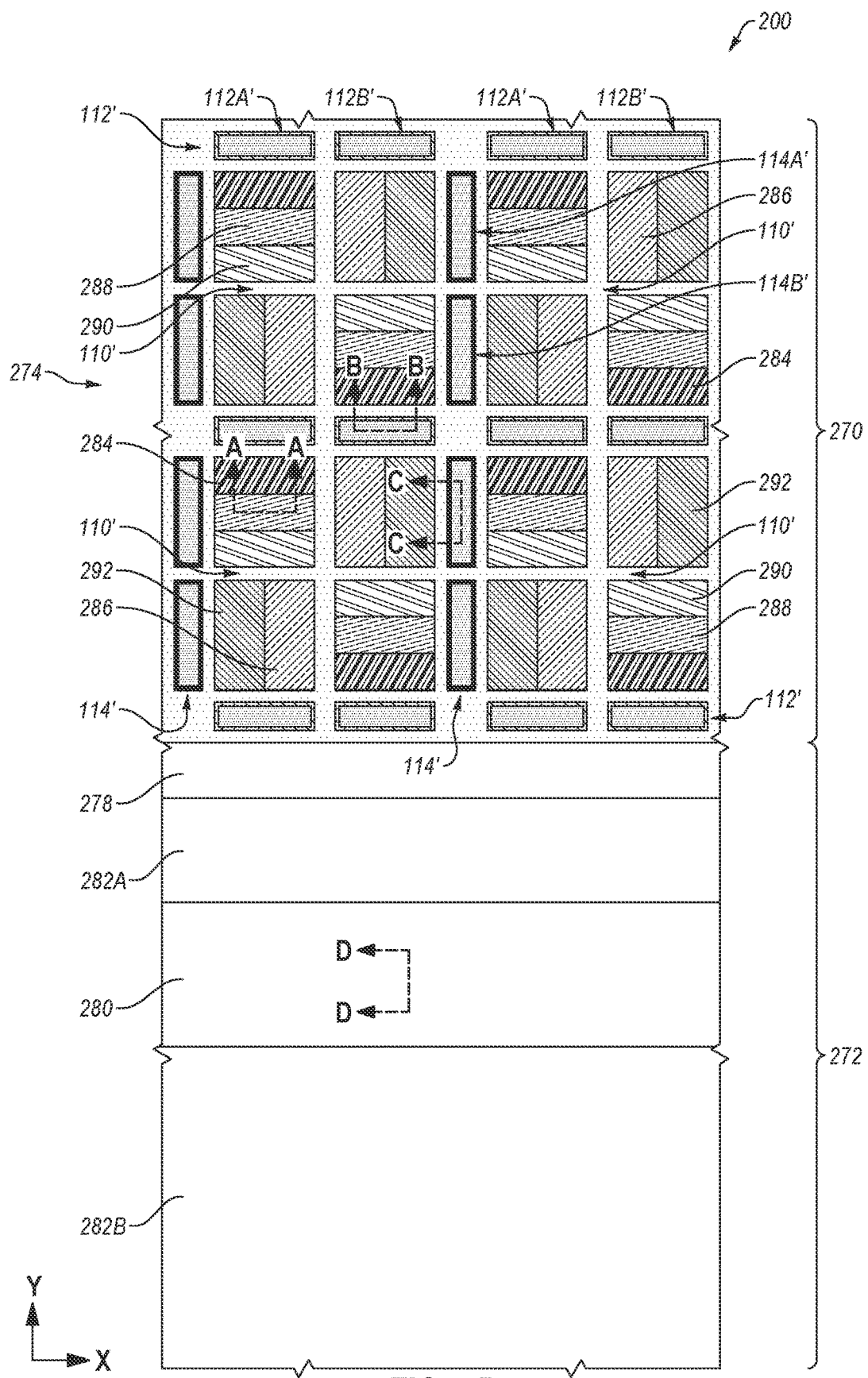

Referring next to FIG. 5A and FIG. 5B, illustrated are simplified plan views of the second microelectronic device structure 200. FIG. 5A is a simplified plan view of the second microelectronic device structure 200 having a horizontal area corresponding to the horizontal area of the first microelectronic device structure 100 of FIG. 1A. In some embodiments, the horizontal area (e.g., in the XY plane) of the second microelectronic device structure 200 is substantially the same as the horizontal area (e.g., in the XY plane) of the first microelectronic device structure 100 (FIG. 1A). FIG. 5B is a simplified plan view of an enlarged portion of the second microelectronic device structure 200 having a horizontal area corresponding to the horizontal area of the enlarged portion of the first microelectronic device structure 100 of FIG. 1B. In some embodiments, the second microelectronic device structure 200 comprises a second wafer.

The second microelectronic device structure 200 may include regions and devices sized, shaped, and positioned to be located vertically above or below (e.g., in the Z-direction) regions and devices of the first microelectronic device structure 100. As described below, after various processing stages of each of the first microelectronic device structure 100 and the second microelectronic device structure 200, the first microelectronic device structure 100 may be attached to the second microelectronic device structure 200 to form a microelectronic device.

The second microelectronic device structure 200 includes transistor array regions 270 (also referred to as "transistor bank" regions) horizontally neighboring (e.g., in the Y-direction) a control logic region 272. As described in further detail below, the control logic region 272 is sized and shaped such that the control logic region 272 vertically overlies the capacitor region 105 of the first microelectronic device structure assembly 166 after attachment of the second microelectronic device structure 200 to the first microelectronic device structure assembly 166 during subsequent processing acts of formation of the microelectronic device. In some embodiments, the control logic region 272 is horizontally surrounded (e.g., in the Y-direction) by transistor array regions 270. Stated another way, the control logic region 272 may horizontally intervene (e.g., in the Y-direction) transistor array regions 270.

The transistor array regions 270 may each individually include transistor arrays 274 horizontally neighboring (e.g., in the X-direction) row decoders 276. Each transistor array 274 may horizontally neighbor (e.g., in the X-direction) one row decoder 276 and one other transistor array 274. Similarly, each of the row decoders 276 may horizontally neighbor (e.g., in the X-direction) one other row decoder 276 and one transistor array 274. Column decoders 278 may horizontally neighbor (e.g., in the Y-direction) the transistor arrays 274 and the row decoders 276. The row decoders 276 and the column decoders 278 may each individually be configured for effectuating operation of memory cells located within the memory array banks 102 (FIG. 1A) of the memory array regions 101 (FIG. 1A).

In some embodiments, each of the memory array banks 102 (FIG. 1A) are sized, shaped, and configured to include within horizontal boundaries (e.g., in the X-direction, in the Y-direction) thereof, two transistor arrays 274 and two row decoders 276 of the transistor array region 270. Each of the two transistor arrays 274 may be located at opposing horizontal boundaries (e.g., in the X-direction) of the memory array bank 102 and two row decoders 276 may be located horizontally between (e.g., in the X-direction) the two transistor arrays 274. In some embodiments, each of the memory array banks 102 may also be sized, shaped, and configured to include within horizontal boundaries thereof, one of the column decoders 278 of the transistor array region 270. The column decoder 278 may be located at a horizontal boundary (e.g., in the Y-direction) of the memory array bank 102. In some such embodiments, each memory array bank 102 includes, within horizontal boundaries thereof, two transistor arrays 274, two row decoders 276, and one column decoder 278 of the transistor array region 270 of the second microelectronic device structure 200. However, the disclosure is not so limited and one or more additional devices or a different quantify of the transistor arrays 274, row decoders 276, and column decoders 278 of the second microelectronic device structure 200 may be associated with and located within horizontal boundaries of the memory array bank 102.

With continued reference to FIG. 5A, the control logic region 272 may include one or more control logic devices configured to effectuate control operations of memory cells of the memory array banks 102 (FIG. 1A) of the memory array regions 101 (FIG. 1A) of the first microelectronic device structure 100 (FIG. 1A). The control logic region 272 may include a control logic device regions 282 including first control logic device regions 282A and a second control logic device region 282B and bank logic regions 280. In some embodiments, the bank logic regions 280 horizontally intervene (e.g., in the Y-direction) one first control logic device region 282A and the second control logic device region 282B. In other embodiments, the first control logic device region 282A may directly horizontally neighbor the second control logic device region 282B and the bank logic regions 280 may not horizontally intervene between the first control logic device region 282A and the second control logic device region 282B.

In some embodiments, the first control logic device regions 282A horizontally neighbor (e.g., in the Y-direction) the column decoders 278 and the bank logic regions 280. In some embodiments, the second control logic device region 282B horizontally intervenes (e.g., in the Y-direction) two bank logic regions 280.

The bank logic regions 280 may each individually include one or more control logic devices for effectuating operation of individual transistor arrays 274, row decoders 276, and column decoders 278 of the transistor array regions 270 with which they are associated.

The one or more control logic device regions 282 may include one or more of one or more digital signal acquisition (DSA) devices, one or more error checking and correction (ECC) devices, one or more voltage generators (e.g., one or more low voltage generators, one or more high voltage generators), one or more command address devices, one or more capacitor structures (e.g., one or more decoupling capacitors), one or more data outputs (e.g., DQU, DQL), one or more command address devices, one or more antifuse devices, one or more delay-locked loop (DLL) systems, one or more delay enable devices (e.g., one or more dQ enable delays devices), one or more temperature sensors, one or more data junctions for channeling data into and out of memory banks, and one or more additional control logic devices.

In some embodiments, the first control logic device regions 282A include one or more ECC devices and one or more DSA devices. In some embodiments, each of the first control logic device regions 282A includes one ECC device and one DSA device for each of the memory array banks 102 (FIG. 1A) of the first microelectronic device structure 100 (FIG. 1A) with which it is associated. Stated another way, in some embodiments, the second microelectronic device structure 200 includes one ECC device and one DSA device for each memory array bank 102 (FIG. 1A) of the first microelectronic device structure 100 (FIG. 1A).

In some embodiments, the second control logic device region 282B includes one or more voltage generators (e.g., one or more low voltage generators, one or more high voltage generators), one or more command address devices, one or more capacitor structures (e.g., one or more decoupling capacitors), one or more data outputs (e.g., DQU, DQL), one or more command address devices, one or more antifuse devices, one or more delay-locked loop (DLL) systems, one or more delay enable devices (e.g., one or more dQ enable delays devices), one or more temperature sensors, and one or more data junctions.

In some embodiments, the first control logic device regions 282A and the second control logic device region 282B individually include one or more additional devices, such as one or more of repair circuitry (e.g., column repair circuitry, row repair circuitry), I/O devices (e.g., local I/O devices), test devices, array multiplexers (MUX), self-refresh/wear leveling devices, redundancy fuses and logic (DFM) devices, and test mode logic (DFT) devices.

As described in further detail below, in some embodiments, the first microelectronic device structure assembly 166 (FIG. 4A through FIG. 4D) is coupled to the second microelectronic device structure 200 to form a microelectronic device. Different regions of the second microelectronic device structure 200 may be horizontally aligned with and directly vertically overlie corresponding regions of the first microelectronic device structure 100. In some embodiments, the transistor array regions 270 (including one or more of the transistor arrays 274, the row decoders 276, and the column decoders 278) of the second microelectronic device structure 200 may be horizontally aligned with (e.g., located within horizontal boundaries of) the memory array regions 101 (e.g., including the memory array banks 102) of the first microelectronic device structure 100 (FIG. 1A). In some such embodiments, at least some of the transistor arrays 274 of the second microelectronic device structure 200 include control logic devices that are located within horizontal boundaries of the memory array regions 110 of the first microelectronic device structure 100.

In some embodiments, the control logic region 272 (e.g., including one or more of the first control logic device regions 282A, the second control logic device region 282B, and the bank logic regions 280) of the second microelectronic device structure 200 may be horizontally aligned with (e.g., located within horizontal boundaries of) the capacitor region 105 (FIG. 1A) of the first microelectronic device structure 100 (FIG. 1A). In other words, in some embodiments, one or more (e.g., each) of the first control logic device regions 282A, the bank logic regions 280, and the second control logic device regions 282B are located within horizontal boundaries of the capacitor region 105. In some embodiments, the microelectronic device comprising the first microelectronic device structure 100 attached to the second microelectronic device structure 200 includes one or more of the first control logic device regions 282A, the bank logic regions 280, and the second control logic device regions 282B vertically above or below (e.g., in the Z-direction) the capacitor region 105. In some embodiments, the first microelectronic device structure 100 (FIG. 1A) may be sized, shaped, and positioned to include within horizontal boundaries (e.g., in the X-direction, in the Y-direction) thereof the control logic region 272 of the second microelectronic device structure 200.

In some embodiments, the transistor array regions 270 of the second microelectronic device structure 200 have a larger horizontal area (e.g., in the XY plane) than the horizontal area of the memory array regions 101 of the first microelectronic device structure 100. In some embodiments, the transistor array regions 270 of the second microelectronic device structure 200 have a larger horizontal dimension in the Y-direction than the horizontal dimension in the Y-direction of the memory array regions 101 of the first microelectronic device structure 100. Stated another way, the transistor array regions 270 may horizontally extend beyond the horizontal boundaries of the memory array regions 101 in a horizontal direction (e.g., in the Y-direction).

FIG. 5B is a simplified plan view of the enlarged portion of the second microelectronic device structure 200 illustrating box 106' of FIG. 5A. In some embodiments, the horizontal area (e.g., in the XY plane) of the enlarged portion of the second microelectronic device structure 200 illustrated in FIG. 5B is substantially the same as the horizontal area (e.g., in the XY plane) of the first microelectronic device structure 100 illustrated in FIG. 1B.

Referring to FIG. 5B, the second microelectronic device structure 200 includes the transistor array regions 270 horizontally neighboring (e.g., in the Y-direction) the control logic region 272. In FIG. 5B, the portions of the transistor array region 270 illustrated include the transistor arrays 274 and do not include the row decoders 276 (FIG. 5A).

The transistor array region 270 is formed to include an arrangement of different control logic sections within individual different regions of the second microelectronic device structure 200. The different control logic devices within the transistor array region 270 may be positioned vertically above (e.g., in the Z-direction) the memory array regions 110 (FIG. 1B) of the memory array region 101 (FIG. 1A) of the first microelectronic device structure 100 (FIG. 1B).

As illustrated in FIG. 5B, the transistor array region 270 may include a desired arrangement of memory array regions 110' configured to be within a horizontal boundary of each memory array region 110 (FIG. 1B) of the first microelectronic device structure 100 (FIG. 1B). The memory array regions 110' may each individually include sense amplifier (SA) sections 284 and sub-word line driver (SWD) sections 286 configured to be located within a horizontal boundary of each memory array regions 110'. The SA sections 284 may include SA devices coupled to the digit lines of the first microelectronic device structure 100 (FIG. 1B), as described in further detail below. The digit lines may vertically underlie (e.g., in the Z-direction) the SA devices of the SA sections 284 within the first microelectronic device structure 100. The SWD sections 286 may include SWD devices coupled to the word lines of the first microelectronic device structure 100, as also described in further detail below. The word lines may vertically underlie (e.g., in the Z-direction) the SWD devices of the SWD sections 286 within the first microelectronic device structure 100. The transistor array region 270 further includes digit line exit regions 112' and word line exit regions 114' are locations corresponding to the respective digit line exit regions 112 and the word line exit regions 114 of the first microelectronic device structure assembly 166. As described above with reference to the digit line exit regions and the word line exit regions 114, the digit line exit regions 112' and the word line exit regions 114' of the second microelectronic device structure 200 may be divided into multiple subregions. For example, an individual digit line exit regions 112' may be divided into a first digit line exit subregion 112A' and a second digit line exit subregion 112B', as described above with reference to the digit line exit regions 112. In addition, an individual word line exit region 114' may be divided into a first word line exit subregion 114A' and a second word line exit subregion 114B', as described above with reference to the word line exit regions 114.

As described in further detail below, the capacitor region 105 of the first microelectronic device structure 100 (FIG. 1B) is formed within the first microelectronic device structure 100 at locations that will be subsequently horizontally aligned with the control logic region 272 of the second microelectronic device structure 200 when the second microelectronic device structure 200 is attached to the first microelectronic device structure assembly 166. By way of non-limiting example, the capacitor region 105 may be located within the first microelectronic device structure 100 at locations horizontally aligned with the control logic region 272, such as one or more of the bank logic regions 280, the first control logic device regions 282A, and the second control logic device region 282B (FIG. 1B) of the second microelectronic device structure 200.

With continued reference to FIG. 5B, the transistor arrays 274 may further include one or more column decoder sections 288, one or more additional control logic device sections 290, and one or more main word line driver (MWD) sections 292. In some embodiments, each memory array region 110 (FIG. 1B) of the first microelectronic device structure 100 (FIG. 1B) may be associated with two (2) of the SA sections 284, two (2) of the SWD sections 286, two (2) of the column decoder sections 288, two (2) of the additional control logic device sections, and two (2) of the MWD sections 292.

Figure 6B:
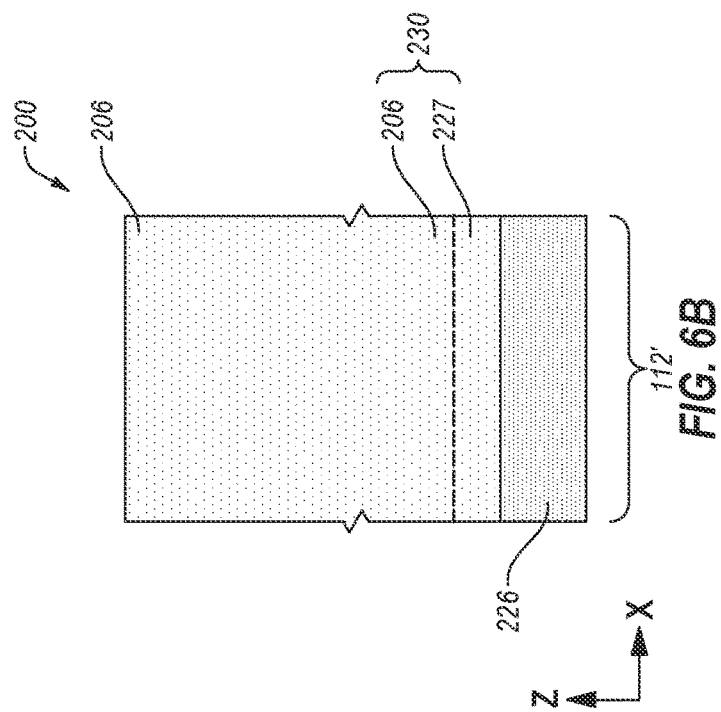
FIG. 6A through FIG. 6D are simplified, partial longitudinal cross-sectional views of a memory array (FIG. 6A), a digit line exit region (FIG. 6B), a word line exit region (FIG. 6C), and a capacitor region (FIG. 6D) of the second microelectronic device structure shown in FIG. 5A and FIG. 5B at the processing stage of FIG. 5A and FIG. 5B.
Figure 6A:
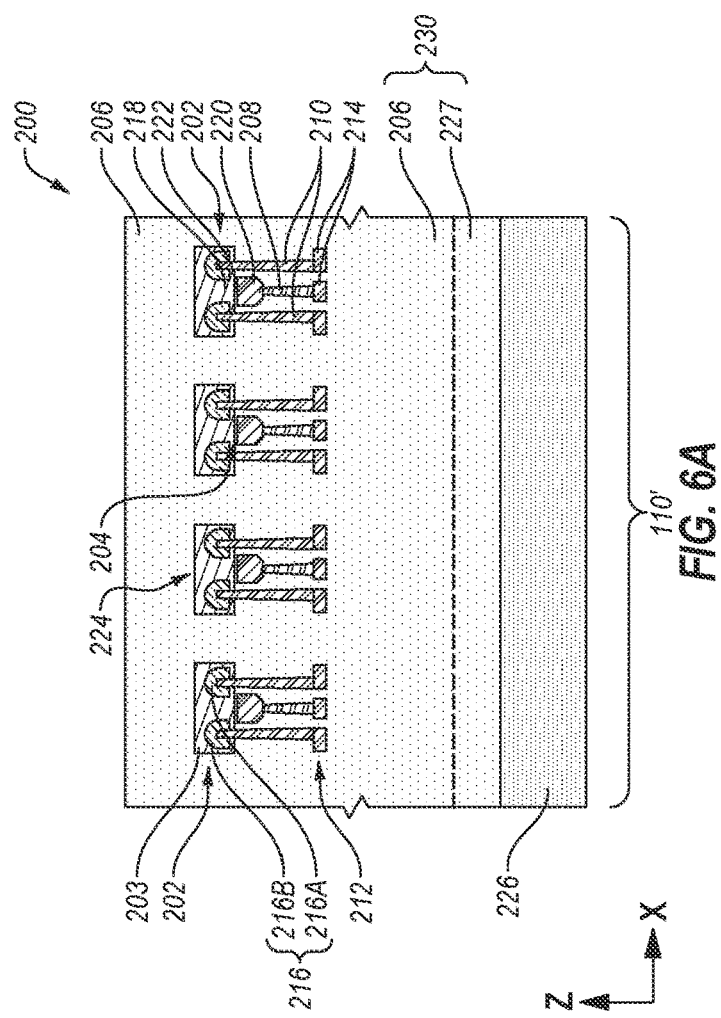
Figure 6D:
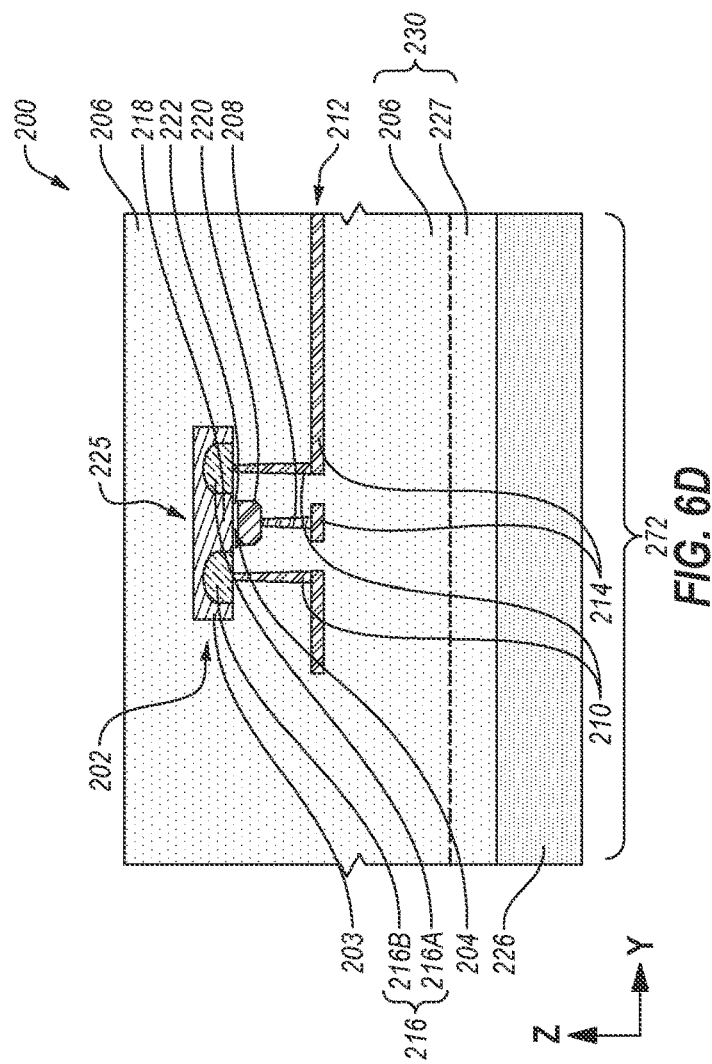
Figure 6C:
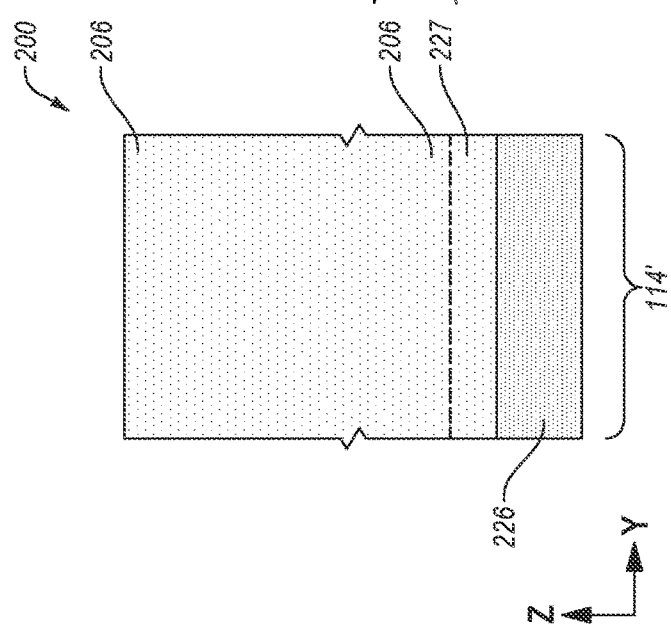

FIG. 6A through FIG. 6D, illustrated are simplified, partial longitudinal cross-sectional views of different regions of the second microelectronic device structure 200 of FIG. 1B formed separate from the first microelectronic device structure assembly 166 (FIG. 4A through FIG. 4D), in accordance with embodiments of the disclosure. The second microelectronic device structure 200 may be formed to have an arrangement of different regions (e.g., memory array regions, digit line exit regions, word line exit regions, control logic regions) corresponding to (e.g., substantially the same as) the arrangement of different regions (e.g., the memory array regions 110, the digit line exit regions 112, the word line exit regions 114, the capacitor regions 105) previously described with reference to FIG. 1A through FIG. 4D. FIG. 6A illustrates a simplified, partial longitudinal cross-sectional view from the perspective of the Y-direction (so as to depict an XZ-plane) of one of the memory array regions 110' of the taken through section line A-A of FIG. 5B. FIG. 6B illustrates a simplified, partial longitudinal cross-sectional view from the perspective of the Y-direction (so as to depict an XZ-plane) one of the digit line exit regions 112' taken through section line B-B of FIG. 5B. FIG. 6C illustrates a simplified, partial longitudinal cross-sectional view from the perspective of the X-direction (so as to depict a YZ-plane) of one of the word line exit regions 114' taken through section line C-C of FIG. 5B. FIG. 6D illustrates a simplified, partial longitudinal cross-sectional view from the perspective of the X-direction (so as to depict a YZ-plane) of the control logic region 272 taken through section line D-D of FIG. 5B. The locations of the memory array region 110', the digit line exit region 112', word line exit region 114', and the control logic region 272 of the second microelectronic device structure 200 may correspond to (e.g., directly vertically overlie or underlie) memory array region 110, digit line exit regions 112, word line exit regions 114, and the capacitor regions 105, respectively, of the first microelectronic device structure 100. In some embodiments, the memory array regions 110', the digit line exit regions 112', the word line exit regions 114', and the control logic regions 272 of the second microelectronic device structure 200 may be located within horizontal boundaries (e.g., in the X-direction and the Y-direction) of the respective memory array region 110, digit line exit regions 112, word line exit regions 114, and the capacitor regions 105 of the first microelectronic device structure 100.

As shown in FIG. 6A through FIG. 6D, the second microelectronic device structure 200 may be formed to include a second semiconductor tier 202 including a semiconductor material 203, transistors 204 (FIG. 6A and FIG. 6D), a sixth isolation material 206, fifth contact structures 208 (FIG. 6A and FIG. 6D), sixth contact structures 210 (FIG. 6A and FIG. 6D, and at least one third routing tier 212 (FIG. 6A and FIG. 6D) including third routing structures 214 (FIG. 6A and FIG. 6D). The fifth contact structures 208 and sixth contact structures 210 contact the transistors 204. Some of the third routing structures 214 contact some of the fifth contact structures 208, and some other of the third routing structures 214 contact some of the sixth contact structures 210. The sixth isolation material 206 may substantially cover and surround the semiconductor material 203 of the second semiconductor tier 202, the transistors 204, the fifth contact structures 208, the sixth contact structures 210, and the third routing structures 214.

Semiconductor material 203 of the second semiconductor tier 202 may be formed of or comprise a semiconductor structure (e.g., a semiconductor wafer), or a base semiconductor material on a supporting structure. For example, the second semiconductor tier 202 may comprise a conventional silicon substrate (e.g., a conventional silicon wafer), or another bulk substrate comprising a semiconductor material. In some embodiments, the second semiconductor tier 202 comprises a silicon wafer. The second semiconductor tier 202 may include one or more layers, structures, and/or regions formed therein and/or thereon.

Referring collectively to FIG. 6A through FIG. 6D, the transistors 204 may individually be formed to include conductively doped regions 216, a channel region 218, a gate structure 220, and a gate dielectric material 222. For a given transistor 204, the conductively doped regions 216 may be formed within the semiconductor material 203 of the second semiconductor tier 202; the channel region 218 may be within the semiconductor material 203 and may be horizontally interposed between the conductively doped regions 216 thereof; the gate structure 220 may vertically overlie the channel region 218; and the gate dielectric material 222 (e.g., a dielectric oxide) may be vertically interposed (e.g., in the Z direction) between the gate structure 220 and the channel region 218. The conductively doped regions 216 of an individual transistor 204 may include a source region 216A and a drain region 216B.

For an individual transistor 204, the conductively doped regions 216 thereof may comprise the semiconductor material 203 of the second semiconductor tier 202 doped with one or more desired conductivity-enhancing dopants. In some embodiments, the conductively doped regions 216 of the transistor 204 comprise semiconductor material (e.g., silicon) doped with at least one N-type dopant (e.g., one or more of phosphorus, arsenic, antimony, and bismuth). In some of such embodiments, the channel region 218 of the transistor 204 comprises the semiconductor material doped with at least one P-type dopant (e.g., one or more of boron, aluminum, and gallium). In some other of such embodiments, the channel region 218 of the transistor 204 comprises substantially undoped semiconductor material (e.g., substantially undoped silicon). In additional embodiments, for an individual transistor 204, the conductively doped regions 216 thereof comprise semiconductor material (e.g., silicon) doped with at least one P-type dopant (e.g., one or more of boron, aluminum, and gallium). In some of such additional embodiments, the channel region 218 of the transistor 204 comprises the semiconductor material doped with at least one N-type dopant (e.g., one or more of phosphorus, arsenic, antimony, and bismuth). In some other of such additional embodiments, the channel region 218 of the transistor 204 comprised substantially undoped semiconductor material (e.g., substantially undoped silicon).

Still referring collectively to FIG. 6A through FIG. 6D, the gate structures 220 (e.g., gate electrodes) may individually horizontally extend (e.g., in the X-direction) between and be employed by multiple transistors 204. The gate structures 220 may be formed of and include conductive material. The gate structures 220 may individually be substantially homogeneous, or the gate structures 220 may individually be heterogeneous. In some embodiments, the gate structures 220 are each substantially homogeneous. In additional embodiments, the gate structures 220 are each heterogeneous. Individual gate structures 220 may, for example, be formed of and include a stack of at least two different conductive materials.

The fifth contact structures 208 may individually be formed to vertically extend between and couple the gate structures 220 (and, hence, the transistors 204) to one or more of the third routing structures 214 of the third routing tier 212. The sixth contact structures 210 may be formed to vertically extend between and couple the conductively doped regions 216 (e.g., the source region 216A, the drain region 216B) of the transistors 204 to some of the third routing structures 214 of the third routing tier 212.

The fifth contact structures 208 and the sixth contact structures 210 may individually be formed of and include conductive material. By way of non-limiting example, the fifth contact structures 208 and the sixth contact structures 210 may individually be formed of and include one or more of at least one metal, at least one alloy, and at least one conductive metal-containing material (e.g., a conductive metal nitride, a conductive metal silicide, a conductive metal carbide, a conductive metal oxide). A material composition of the sixth contact structures 210 may be substantially the same as a material composition of the fifth contact structures 208, or the material composition of one or more of the sixth contact structures 210 may be different than the material composition of one or more of the fifth contact structures 208. In some embodiments, the fifth contact structures 208 and the sixth contact structures 210 are individually formed of and include W. In additional embodiments, the fifth contact structures 208 and the sixth contact structures 210 are individually formed of and include Cu.

Still referring collectively to FIG. 6A through FIG. 6D, the third routing structures 214 of the third routing tier 212 may be formed of and include conductive material. By way of non-limiting example, the third routing structures 214 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third routing structures 214 are formed of and include W. In additional embodiments, the third routing structures 214 are formed of and include Cu. At least some of the third routing structures 214 may be employed as local routing structures of a microelectronic device (e.g., a memory device, such as a DRAM device).

While FIG. 6A through FIG. 6D illustrate that the second microelectronic device structure 200 includes a single (e.g., only one) third routing tier 212 including third routing structures 214, the second microelectronic device structure 200 may include multiple (e.g., more than one) third routing tiers 212 each individually including a desired arrangement (e.g., pattern) of third routing structures 214. By of non-limiting example, two or more (e.g., three or more) of the third routing tiers 212 may be formed, wherein different third routing tiers 212 are vertically offset from one another and each individually include a desired arrangement of third routing structures 214 therein. At least some of the third routing structures 214 within at least one of the third routing tiers 212 may be coupled to at least some of the third routing structures 214 within at least one other of the third routing tiers 212 by way of conductive interconnect structures.

With continued collective reference to FIG. 6A through FIG. 6D, the transistors 204, the third routing structures 214, the fifth contact structures 208, the sixth contact structures 210 may form control logic circuitry of various control logic devices 224 in the memory array region 110' (FIG. 6A) and additional control logic devices 225 in the control logic region 272. The control logic devices 224 and the additional control logic devices 225 may individually be configured to control various operations of various features (e.g., the memory cells 156 (FIG. 4A)) of a microelectronic device (e.g., a memory device, such as a DRAM device) to be formed through the methods of disclosure. In some embodiments, the control logic devices 224 and the additional control logic devices 225 individually comprise CMOS circuitry. As a non-limiting example, the control logic devices 224 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., main word line drivers, sub word line drivers (SWD)), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, array multiplexers (MUX), error checking and correction (ECC) devices, self-refresh/wear leveling devices, and other chip/deck control circuitry. In some embodiments, the control logic devices 224 of the memory array region 110' (FIG. 6A) may comprise different control logic structures and circuitry than the additional control logic devices 225 within the control logic region 272.

By way of non-limiting example, in some embodiments, the control logic devices 224 comprise sense amplifiers, word line drivers, and column decoders and the additional control logic devices 225 comprise one or more of the control logic devices described above within the control logic region 272 (FIG. 5A, FIG. 5B), such as within one or more of the control logic device regions 282 (the first control logic device region 282A, the second control logic device region 282B), and the bank logic region 280.

In some embodiments, the transistors 204 of the control logic region 272 are larger (e.g., have a greater dimension in the horizontal direction (e.g., in the X-direction, in the Y-direction)) than the transistors 204 of the memory array region 110'. In some such embodiments, the additional control logic devices 225 of the control logic region 272 have a larger dimension than the transistors 204 of the memory array region 110'.

With returned collective reference to FIG. 6A through FIG. 6D, the sixth isolation material 206 covering and surrounding the second semiconductor tier 202, the transistors 204 (FIG. 6A and FIG. 6D), the gate structures 220 (FIG. 6A and FIG. 6D), the fifth contact structures 208 (FIG. 6A and FIG. 6D), the sixth contact structures 210 (FIG. 6A and FIG. 6D), and the third routing structures 214 (FIG. 6A and FIG. 6D) may be formed of and include at least one insulative material. A material composition of the sixth isolation material 206 may be the same as a material composition of the fifth isolation material 174 (FIG. 5A through FIG. 5D) of the first microelectronic device structure assembly 166 (FIG. 6A through FIG. 6D), or the material composition of the sixth isolation material 206 may be different than the material composition of the fifth isolation material 174 (FIG. 4A through FIG. 4D). In some embodiments, the sixth isolation material 206 is formed of and includes a dielectric oxide material, such as $SiO_x$ (e.g., $SiO_2$).

With continued reference to FIG. 6A through FIG. 6D, an additional base structure 226 may be attached to the sixth isolation material 206. The additional base structure 226 comprises a base material or construction upon which additional features (e.g., materials, structures, devices) may be formed. In some embodiments, the additional base structure 226 comprises a wafer. The additional base structure 226 may be formed of and include one or more of semiconductor material (e.g., one or more of a silicon material, such monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductor material on a supporting structure, glass material (e.g., one or more of BSP, PSG, FSG, BPSG, aluminosilicate glass, an alkaline earth boro-aluminosilicate glass, quartz, titania silicate glass, and soda-lime glass), and ceramic material (e.g., one or more of p-AlN, SOPAN, AlN, aluminum oxide (e.g., sapphire; α-Al$_2$O$_3$), and silicon carbide). By way of non-limiting example, the additional base structure 226 may comprise a semiconductor wafer (e.g., a silicon wafer), a glass wafer, or a ceramic wafer. The additional base structure 226 may include one or more layers, structures, and/or regions formed therein and/or thereon.

The seventh isolation material 227 may be formed of and include at least one insulative material. A material composition of the seventh isolation material 227 may be substantially the same as a material composition of the sixth isolation material 206; or the material composition of the seventh isolation material 227 may be different than the material composition of the sixth isolation material 206. In some embodiments, the seventh isolation material 227 is formed of and includes a dielectric oxide material, such as SiO$_x$ (e.g., SiO$_2$).

To attach the additional base structure 226 to the sixth isolation material 206, the seventh isolation material 227 may be provided in physical contact with the sixth isolation material 206, and the seventh isolation material 227 and the sixth isolation material 206 may be exposed to annealing conditions to form bonds (e.g., oxide-to-oxide bonds) between the seventh isolation material 227 and the sixth isolation material 206. By way of non-limiting example, the seventh isolation material 227 and the sixth isolation material 206 may be exposed to a temperature greater than or equal to about 400° C. (e.g., within a range of from about 400° C. to about 800° C., greater than about 800° C.) to form oxide-to-oxide bonds between the sixth isolation material 206 and the seventh isolation material 227. In some embodiments, the sixth isolation material 206 and the seventh isolation material 227 are exposed to at least one temperature greater than about 800° C. to form oxide-to-oxide bonds between the sixth isolation material 206 and the seventh isolation material 227.

Referring next to FIG. 7A through FIG. 7D, illustrated are simplified, partial longitudinal cross-sectional views, from the directional perspectives previously described, of the memory array region 110 (FIG. 7A), the digit line exit region 112 (FIG. 7B), the word line exit region 114 (FIG. 7C), and the capacitor region 105 (FIG. 7D) previously described with reference to FIG. 4A through FIG. 4D at a processing stage of the method of forming the microelectronic device following the processing stages previously described with reference to FIG. 4A through FIG. 4D and FIG. 6A through FIG. 6D. As depicted in FIG. 7A through FIG. 7D, following the processing stage previously described with reference to FIG. 6A through FIG. 6D, the second microelectronic device structure 200 may be vertically inverted (e.g., flipped upside down in the Z-direction), and the sixth isolation material 206 thereof may be provided on the fifth isolation material 174 of the first microelectronic device structure assembly 166, and then the sixth isolation material 206 and fifth isolation material 174 may be subjected to annealing conditions (e.g., a temperature greater than or equal to about 400° C., such as within a range of from about 400° C. to about 800° C., or greater than about 800° C.) to form bonds (e.g., oxide-to-oxide bonds) between the sixth isolation material 206 and fifth isolation material 174 to form a second microelectronic device structure assembly 232. Thereafter, the additional base structure 226, the seventh isolation material 227 (FIG. 6A through FIG. 6D), and portions of the sixth isolation material 206 vertically overlying the control logic devices 224 and the additional control logic device 225 of the second semiconductor tier 202 may be removed using at least one conventional wafer thinning process (e.g., a conventional CMP process; a conventional etching process, such as a conventional dry etching process, or a conventional wet etching process).

Attaching (e.g., bonding) the sixth isolation material 206 of the second microelectronic device structure 200 to the fifth isolation material 174 of the first microelectronic device structure assembly 166 may form a second connected isolation structure 230 comprising the sixth isolation material 206 and the fifth isolation material 174. In FIG. 7A through FIG. 7D, the second connected isolation structure 230 illustrates the sixth isolation material 206 and the fifth isolation material 174 as being distinguished from one another by way of a dashed line. However, the sixth isolation material 206 and the fifth isolation material 174 may be integral and continuous with one another. Put another way, second connected isolation structure 230 may be a substantially monolithic structure including the sixth isolation material 206 as a first region thereof, and the fifth isolation material 174 as a second region thereof. For the second connected isolation structure 230, the sixth isolation material 206 thereof may be attached to the fifth isolation material 174 thereof without a bond line.

As depicted in FIG. 7A through FIG. 7D, the second microelectronic device structure 200 may be attached to the first microelectronic device structure assembly 166 such that memory array region 110' (FIG. 6A), digit line exit regions 112' (FIG. 6B), word line exit region 114' (FIG. 6C), and control logic region 272 (FIG. 6D) of the second microelectronic device structure 200 horizontally overlap (e.g., are substantially horizontally aligned with) memory array region 110 (FIG. 4A), digit line exit regions 112 (FIG. 4B), word line exit regions 114 (FIG. 4C), and capacitor region 105 (FIG. 4D) of the first microelectronic device structure assembly 166 (FIG. 4A through FIG. 4D), respectively. Thus, in FIG. 7A through FIG. 7D, the memory array region 110 (FIG. 7A), the digit line exit region 112 (FIG. 7B), the word line exit region 114 (FIG. 7C), and the capacitor region 105 (FIG. 7D) respectively include features of the memory array region 110' (FIG. 6A), the digit line exit region 112' (FIG. 6B), the word line exit region 114' (FIG. 6C), and the control logic region 272 (FIG. 6D) of the second microelectronic device structure 200 following the processing stage previously described with reference to FIG. 6A through FIG. 6D. Because the control logic region 272 may vertically overlie and be located within horizontal boundaries of the capacitor region 105 of the first microelectronic device structure assembly 166, the capacitor region 105 described with reference to FIG. 7D includes the capacitor region 105 of the first microelectronic device structure assembly 166 and the control logic region 272 of the second microelectronic device structure 200. While the different regions shown in FIG. 7A through FIG. 7D were previously described as different regions of the first microelectronic device structure 100 (FIG. 1A through FIG. 3D) and of the first microelectronic device structure assembly 166 (FIG. 4A through FIG. 4D) formed by processing the first microelectronic device structure 100 according to the methods of the disclosure, it will be understood that these regions become regions of a microelectronic device of the disclosure formed using the first microelectronic device structure assembly 166 and the second microelectronic device structure 200, as described in further detail below. Thus, these different regions are not limited to the features (e.g., structures, materials, devices) and/or portions of features of the first microelectronic device structure 100 and the first microelectronic device structure assembly 166. Instead, these regions evolve through the methods of the disclosure to encompass and include additional features (e.g., additional structures, additional materials, additional devices), portions of additional features, and/or modified features.

Figure 7B:
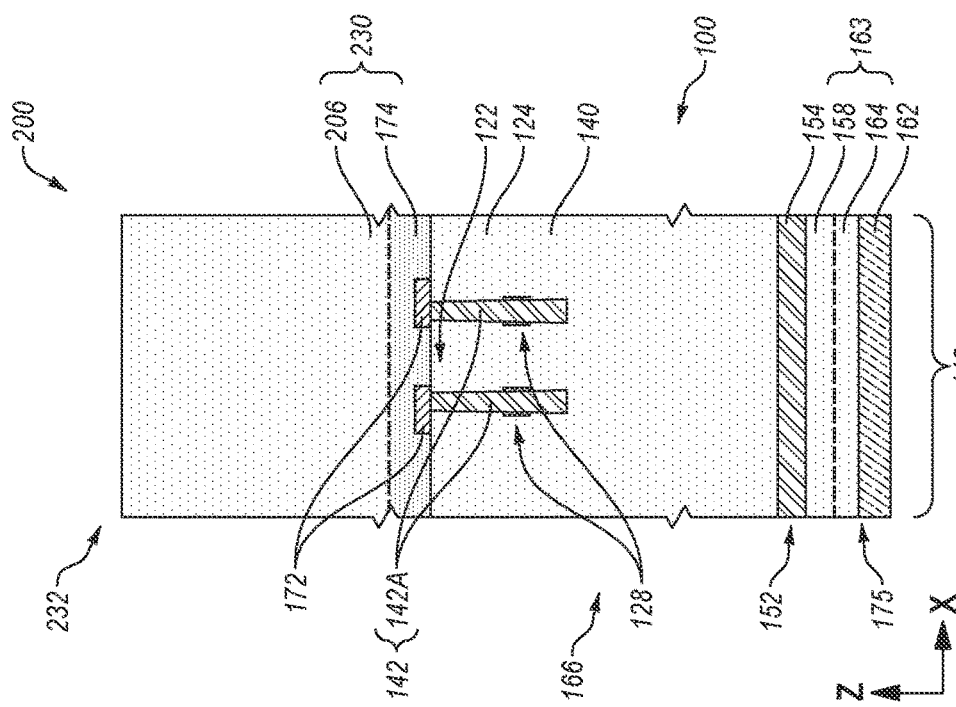
Figure 7A:
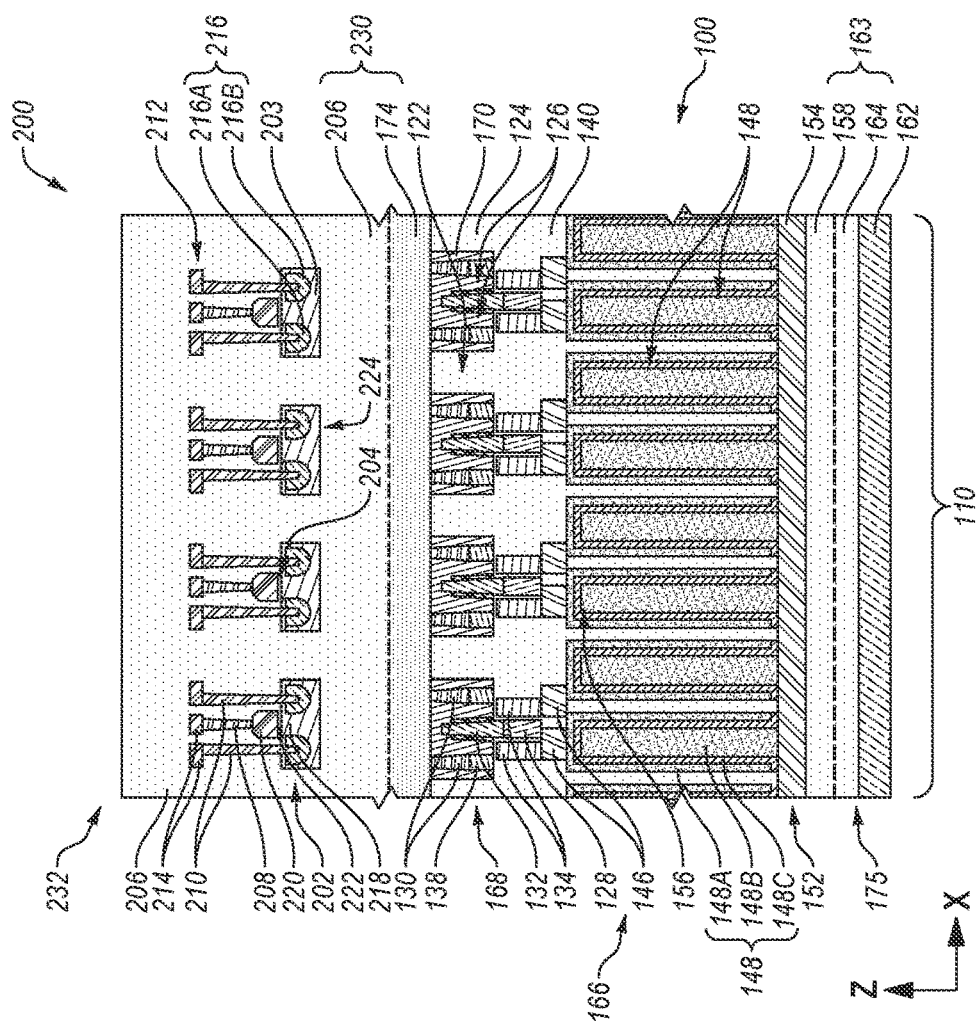

With reference now to FIG. 8A through FIG. 8D, illustrated are simplified, partial longitudinal cross-sectional views, from the directional perspectives previously described, of the memory array region 110 (FIG. 8A), the digit line exit region 112 (FIG. 8B), the word line exit region 114 (FIG. 8C), and the capacitor region 105 (FIG. 8D) at a processing stage of the method of forming a microelectronic device 260 following the processing stage previously described with reference to FIG. 7A through FIG. 7D. In some embodiments, contact openings may be formed to vertically extend (e.g., in the Z-direction) through the sixth isolation material 206 to expose (e.g., uncover) portions of the sacrificial structures 172 (FIG. 7B through FIG. 7D). The contact openings may be formed to vertically extend through portions of the sixth isolation material 206, the sacrificial structures 172, the third routing structures 214 of the third routing tier 212, and the fifth isolation material 174 vertically overlying the sacrificial structures 172. The contact openings may be formed to terminate at or below uppermost vertical boundaries (e.g., uppermost surfaces) of the sacrificial structures 172.

The contact openings may be formed by subjecting portions of the sixth isolation material 206, the sacrificial structures 172, the third routing structures 214 of the third routing tier 212, and the fifth isolation material 174 vertically overlying the sacrificial structures 172 to one or more conventional material removal processes (e.g., one or more conventional etching processes, such as one or more conventional anisotropic dry etching process), which are not described in detail herein.

The contact openings may be employed to remove (e.g., exhume) the sacrificial structures 172 and facilitate the formation of seventh contact structures 238 in contact (e.g., physical contact, electrical contact) with the third contact structures 142 (FIG. 7B through FIG. 7D).

After forming the contact openings, the sacrificial structures 172 (FIG. 7B through FIG. 7D) may be selectively removed to form void spaces at locations of the sacrificial structures 172 and to expose (e.g., uncover) portions of the third contact structures 142 (FIG. 7B through FIG. 7D) (e.g., upper surfaces of the third contact structures 142) previously covered by the sacrificial structures 172 (FIG. 7B through FIG. 7D). The void spaces may be formed by exposing the second microelectronic device structure assembly 232 (FIG. 7A through FIG. 7D) to at least one chemical species (e.g., at least etchant) that selectively removes (e.g., selectively etches) the sacrificial structures 172 (FIG. 7B through FIG. 7D) relative to the sixth isolation material 206, the sacrificial structures 172, the third routing structures 214 of the third routing tier 212, and the fifth isolation material 174. The chemical species may, for example, etch the sacrificial structures 172 (FIG. 7B through FIG. 7D) at a rate that is at least about five times (5×) greater (e.g., at least about ten times (10×) greater, at least about twenty times (20×) greater, at least about forty times (40×) greater) than rate(s) at which the chemical species etches the sixth isolation material 206, the sacrificial structures 172, the third routing structures 214 of the third routing tier 212, and the fifth isolation material 174. By way of non-limiting example, if the sixth isolation material 206, the sacrificial structures 172, the third routing structures 214 of the third routing tier 212, and the fifth isolation material 174 are formed of and include a dielectric oxide material (e.g., $SiO_x$, such as $SiO_2$) and the sacrificial structures 172 (FIG. 7B through FIG. 7D) are formed of and include a dielectric nitride material (e.g., $SiN_y$, such as $Si_3N_4$), the second microelectronic device structure assembly 232 may be treated with phosphoric acid ($H_3PO_4$) to selectively remove the sacrificial structures 172 (FIG. 7B through FIG. 7D) through the contact openings and form the void spaces.

The seventh contact structures 238 may be formed to include a first region 238A (e.g., an upper region) and a second region 238B (e.g., a lower region). A geometric configuration (e.g., shape, dimensions) of the first region 238A may be substantially the same as a geometric configuration of the contact opening; and geometric configuration of the second region 238B may be substantially the same as a geometric configuration of the sacrificial structures 172 (FIG. 7A through FIG. 7D). As shown in FIG. 8B through FIG. 8D, for an individual seventh contact structure 238, the second region 238B may vertically underlie (e.g., in the Z-direction) the first region 238A, and the second region 238B may horizontally extend (e.g., in the X-direction, in the Y-direction) beyond horizontal boundaries of the first region 238A. For each of the seventh contact structures 238, the first region 238A thereof may be integral and continuous with the second region 238B thereof. Put another way, each seventh contact structure 238 may be formed to be a substantially monolithic structure including the first region 238A and the second region 238B.

The seventh contact structures 238 (including the first regions 238A and the second regions 238B thereof) may be formed of and include conductive material. By way of non-limiting example, the seventh contact structures 238 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the seventh contact structures 238 are each individually formed of and include W. Each of the seventh contact structures 238 may be substantially homogeneous, or one or more of the seventh contact structures 238 may individually be heterogeneous. In some embodiments, each of the seventh contact structures 238 is substantially homogeneous. In additional embodiments, each of the seventh contact structures 238 is heterogeneous. Each seventh contact structure 238 may, for example, be formed of and include a stack of at least two different conductive materials.

In embodiments where the first microelectronic device structure assembly 166 (FIG. 4A through FIG. 4D) does not include the sacrificial structures 172 and includes conductive structures in place of the sacrificial structures 172, the conductive structures may not be removed. In some such embodiments, the seventh contact structures 238 may be formed in electrical communication with the conductive structures.

With continued reference to FIG. 8A through FIG. 8D, BEOL structures may be formed over the second semiconductor tier 202 including second structures 203 to form the microelectronic device 260. For example, at least one fourth routing tier 240 including fourth routing structures 242 may be formed over the third routing tier 212, the control logic devices 224 (FIG. 8A), the seventh contact structures 238 (FIG. 8B, FIG. 8C), and the additional control logic devices 225 (FIG. 8D); at least one fifth routing tier 244 including fifth routing structures 246 may be formed over the fourth routing tier 240; and at least one sixth routing tier 248 including sixth routing structures 250 may be formed over the fifth routing tier 244. One or more of the fourth routing structures 242 of the fourth routing tier 240 may be coupled to one or more of the third routing structures 214 of the third routing tier 212 and/or one or more of the seventh contact structures 238 by way of eighth contact structures 252. In addition, one or more of the fifth routing structures 246 of the fifth routing tier 244 may be coupled to one or more of the fourth routing structures 242 of the fourth routing tier 240 by way of ninth contact structures 254. Furthermore, one or more of the sixth routing structures 250 of the sixth routing tier 248 are formed to directly physically contact one or more of the fifth routing structures 246 of the fifth routing tier 244.

Referring to FIG. 8D, in some embodiments, at least some of the fourth routing structures 242, the fifth routing structures 246, and the sixth routing structures 250 are formed to be in electrical communication with at least some of the second routing structures 154 by way of at least one deep contact assembly extending between the at least some of the fourth routing structures 242 and one or both of at least some of the second routing structures 154 and at least some of the additional second routing structures 155 within the capacitor region 105. As shown in FIG. 8D, the deep contact assembly may include some of the contact structures (e.g., at least one of the eighth contact structures 252, at least one of the seventh contact structures 238, at least one of the third contact structures 142, and at least one of the fourth contact structures 150) located within the capacitor region 105. In some embodiments, the deep contact assemblies vertically extend through the first microelectronic device structure assembly 166, such as from the second microelectronic device structure 200 through the first microelectronic device structure assembly 166 and to the second routing tier 152 including one or both of the second routing structure 154 and the additional second routing structures 155.

The fourth routing structures 242, the fifth routing structures 246, the sixth routing structures 250, the eighth contact structures 252, the ninth contact structures 254 (FIG. 8A through FIG. 8D) may each be formed of and include conductive material. By way of non-limiting example, the fourth routing structures 242, the fifth routing structures 246, the sixth routing structures 250, the eighth contact structures 252, the ninth contact structures 254 (FIG. 8A through FIG. 8D) may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fourth routing structures 242 are each formed of and include W; the fifth routing structures 246 are each formed of and include Cu; the sixth routing structures 250 are formed of and include Al; and the eighth contact structures 252, and the ninth contact structures 254 (FIG. 8A and FIG. 8D), are each formed of and include W.

Still referring to collectively to FIG. 8A through FIG. 8D, an eighth isolation material 258 may be formed on or over portions of at least the fourth routing structures 242, the fifth routing structures 246, the sixth routing structures 250, the eighth contact structures 252, and the ninth contact structures 254 (FIG. 8A and FIG. 8D). The eighth isolation material 258 may be formed of and include at least one insulative material. In some embodiments, the eighth isolation material 258 is formed of and includes a dielectric oxide material, such as $SiO_x$ (e.g., $SiO_2$).

As shown in FIG. 8A through FIG. 8D, the method described above with reference to FIG. 1A through FIG. 8D may effectuate the formation of a microelectronic device 260 (e.g., a memory device, such as a DRAM device) including the features (e.g., structures, materials, devices) previously described herein. In some embodiments, at least some of the fourth routing structures 242, the fifth routing structures 246, and the sixth routing structures 250 are employed as global routing structures for the microelectronic device 260. The fourth routing structures 242, the fifth routing structures 246, and the sixth routing structures 250 may, for example, be configured to receive global signals from an external bus, and to relay the global signals to other features (e.g., structures, devices) of the microelectronic device 260.

Accordingly, in some embodiments, the microelectronic device 260 may be formed from the first microelectronic device structure 100 and the second microelectronic device structure 200. The first microelectronic device structure 100 may include a region (e.g., the capacitor region 105) horizontally neighboring the memory array region 110 and including one or more structures (e.g., the capacitor structures 149) similar to structures (e.g., the storage node devices 148) of the memory array region 110. The capacitor structures 149 of the capacitor region 105 may be used for providing additional capacitance for operation of the microelectronic device 260 compared to conventional microelectronic devices. In some embodiments, the capacitor structures 149 of the capacitor region 105 are located within the horizontal area of the first microelectronic device structure 100 vertically underlying (e.g., in the Z-direction) control logic regions (e.g., the control logic region 272, such as one or more of the first control logic device region 282A, the bank logic regions 280, and the second control logic device region 282B) of the second microelectronic device structure 200. Forming the capacitor structures 149 within the capacitor region 105 of the first microelectronic device 100 as opposed to within (e.g., only within) the second microelectronic device structure 200 facilitate formation of a microelectronic device 260 having a smaller footprint (and a greater density of memory cells) compared to conventional microelectronic devices. In other words, the area efficiency of the microelectronic device 260 is improved relative to conventional microelectronic devices.

In some embodiments, the configuration of the capacitor region 105 (e.g., the capacitor structures 149) within the capacitor region 105 may facilitate operation of the microelectronic device 260 with a low-level power source $V_{ss}$, such as at a voltage of about 0.5 V, or at a voltage less than about 0.5 V.

With reference to FIG. 8D, in some embodiments, the capacitor structures 149 of the capacitor region 105 of the first microelectronic device structure 100 may be in electrical communication with a voltage source supply $V_{ss}$ and one or both of a bit line precharge voltage ($V_{BLP}$) source and a cell plate voltage ($V_{PLT}$) source. In some embodiments, the second electrodes 149B of the capacitor structures 149 are in electrical communication with the bit line precharge voltage ($V_{BLP}$) source and the cell plate voltage ($V_{PLT}$) source by means of, for example, the additional second routing structure 155 (which may also be referred to as a "capacitor cell plate" of the capacitor structures 149), the fourth contact structure 150, the third contact structure 142 of the third group 142C, and the seventh contact structures 238. In some embodiments, the first electrode 149A is in electrical communication with the voltage source supply $V_{ss}$.

Figure 9:
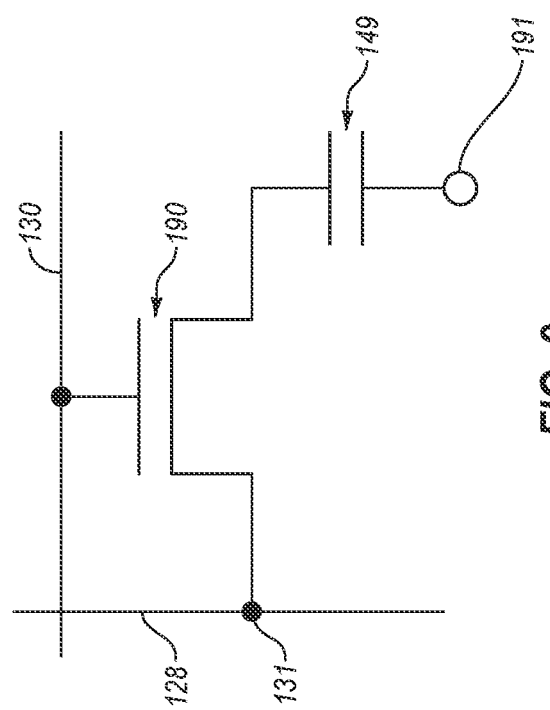
FIG. 9 is a simplified circuit diagram of a portion of a microelectronic device, in accordance with embodiments of the disclosure.

FIG. 9 is a simplified circuit diagram illustrating a relationship between the capacitor structures 149, the digit lines 128, and the word lines 130. The word lines 130 may be configured to be in electrical communication with the digit lines 128 through a transistor 190. A capacitor structure 149 may be configured to be in electrical communication with the cell plate voltage $V_{PLT}$ source at a node 191. The digit line 128 may be configured to be selectively coupled to the bit line precharge voltage $V_{BLP}$ source at node 131. In some embodiments, the node 131 is coupled to the second electrode 149B and the node 191 is configured to be coupled to the cell plate voltage ($V_{PLT}$) source.

In use and operation, when a voltage is applied to the word line 130, the transistor 190 may be in a conductive (e.g., an on) state and electrically couple the digit line 128 to the capacitor structure 149. Accordingly, when a voltage is applied to the word line 130, the capacitor structure 149 is in operable communication with the digit line 128 and the voltage coupled to the digit line 128 at the node 131 (e.g., the bit line precharge voltage $V_{BLP}$ source). When the voltage to the word line 130 is turned off (e.g., below a threshold voltage of the transistor 190), the capacitor structure 149 may be uncoupled from the digit line 128. In some embodiments, coupling the capacitor structure 149 to the digit line 128 during application of a voltage to the word line 130 (and operation of the memory cells 156) may provide a stabilization to the memory cells 156 of the memory array region 110.

In some embodiments, the capacitor structures 149 may be used during operation of the microelectronic device 260 at voltages from about 1.0 V to about 1.5 V.

Although FIG. 8A through FIG. 8D have been described and illustrated as including the capacitor region 105 comprising the capacitor structures 149 with a particular orientation and configuration, the description is not so limited. In some embodiments, the capacitor structures exhibit a different configuration than those described with reference to FIG. 8D.

Figure 10B:
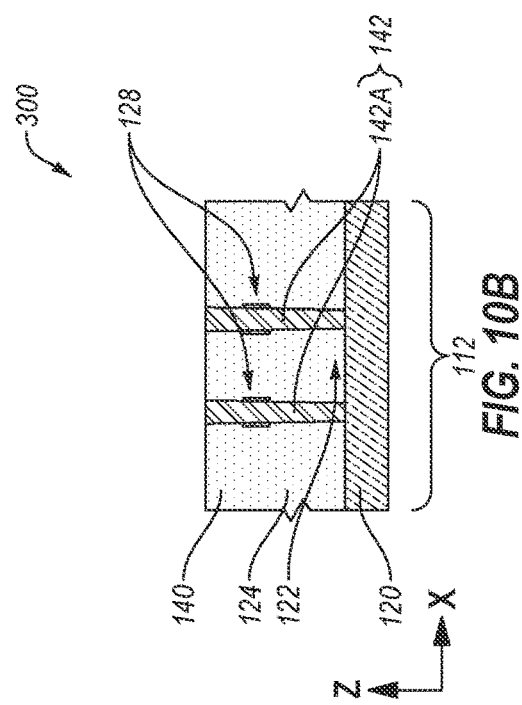
Figure 10A:
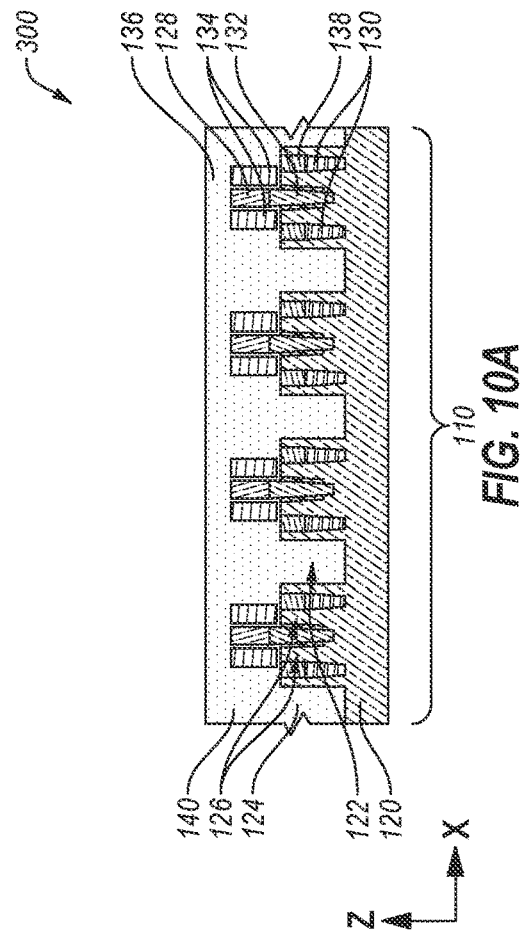
Figure 11B:
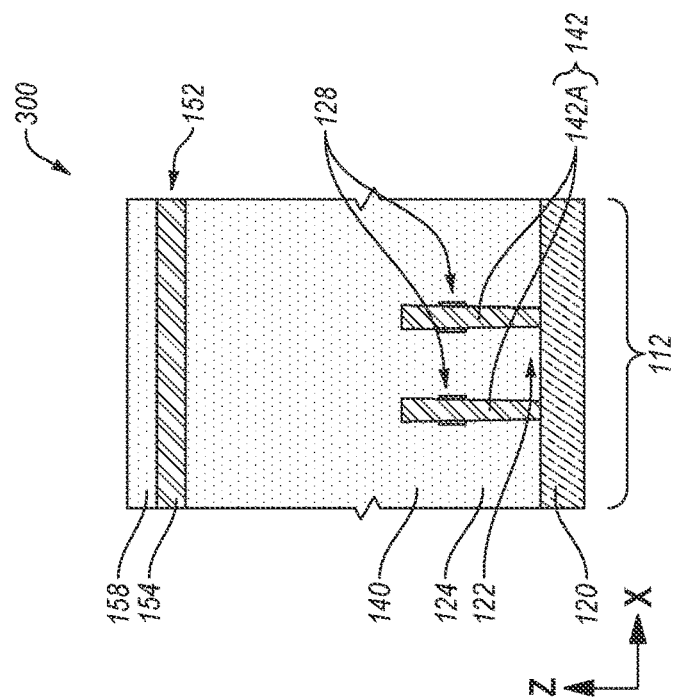
FIG. 11A through FIG. 11D are simplified, partial longitudinal cross-sectional views of a memory array (FIG. 11A), a digit line exit region (FIG. 11B), a word line exit region (FIG. 11C), and a capacitor region (FIG. 11D) of the microelectronic device structure following the processing stage of FIG. 10A through FIG. 10D.
Figure 11A:
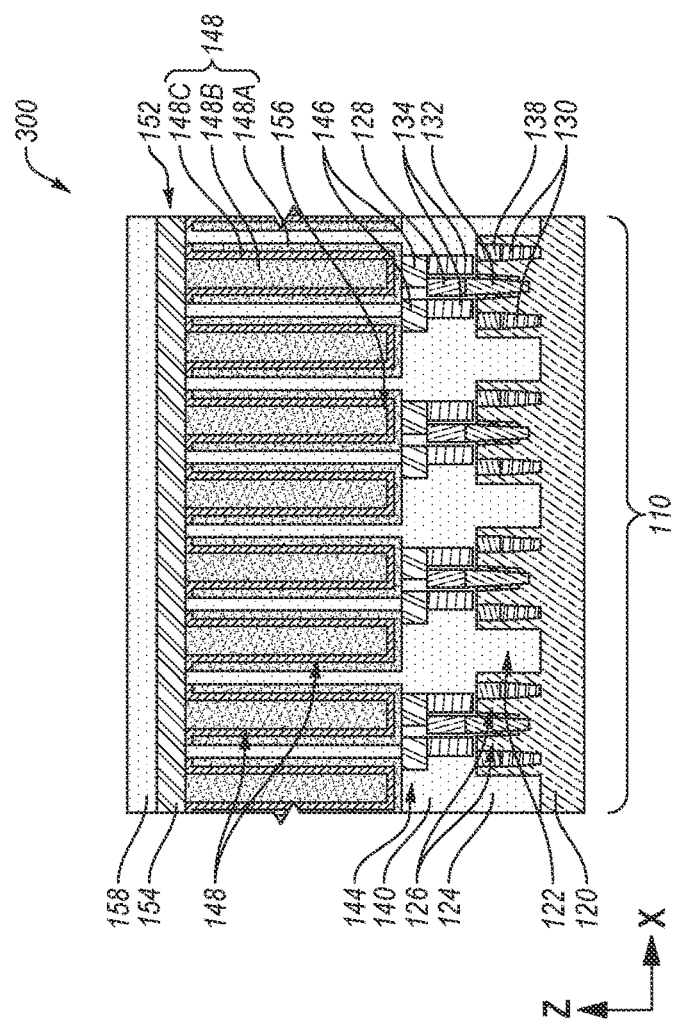
Figure 11D:
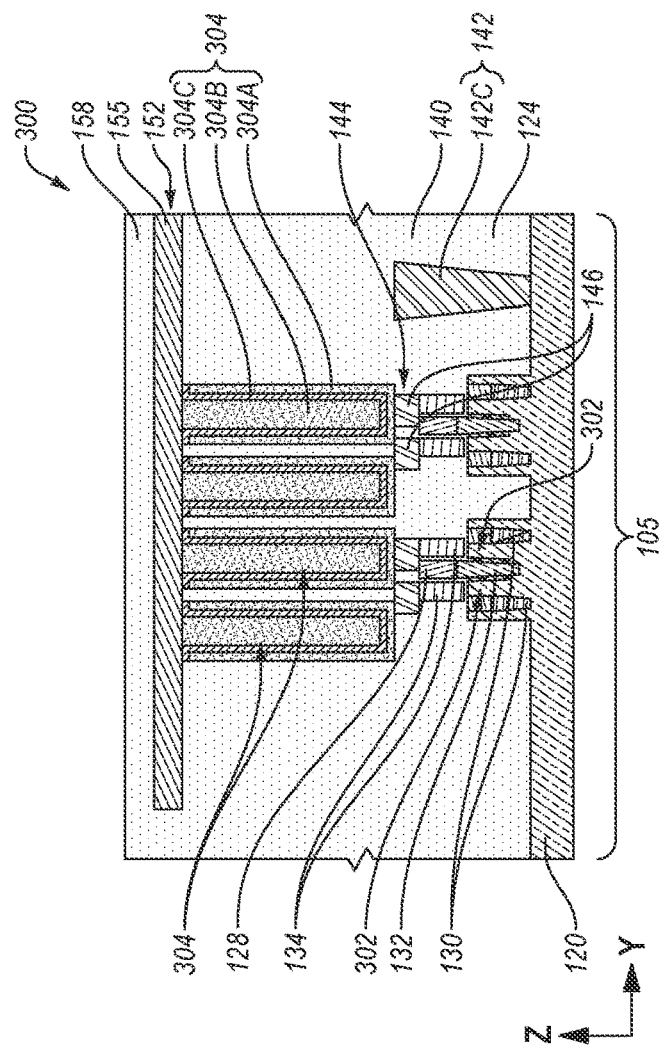
Figure 11C:
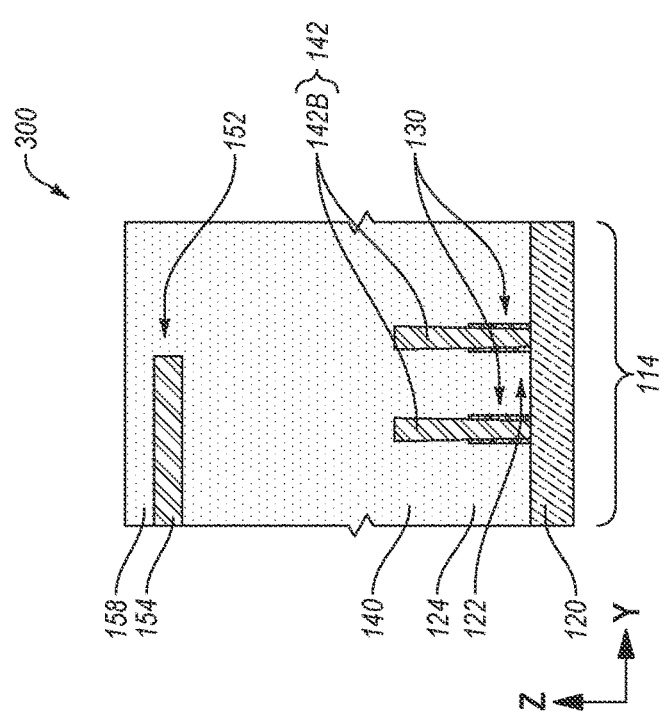
Figure 12D:
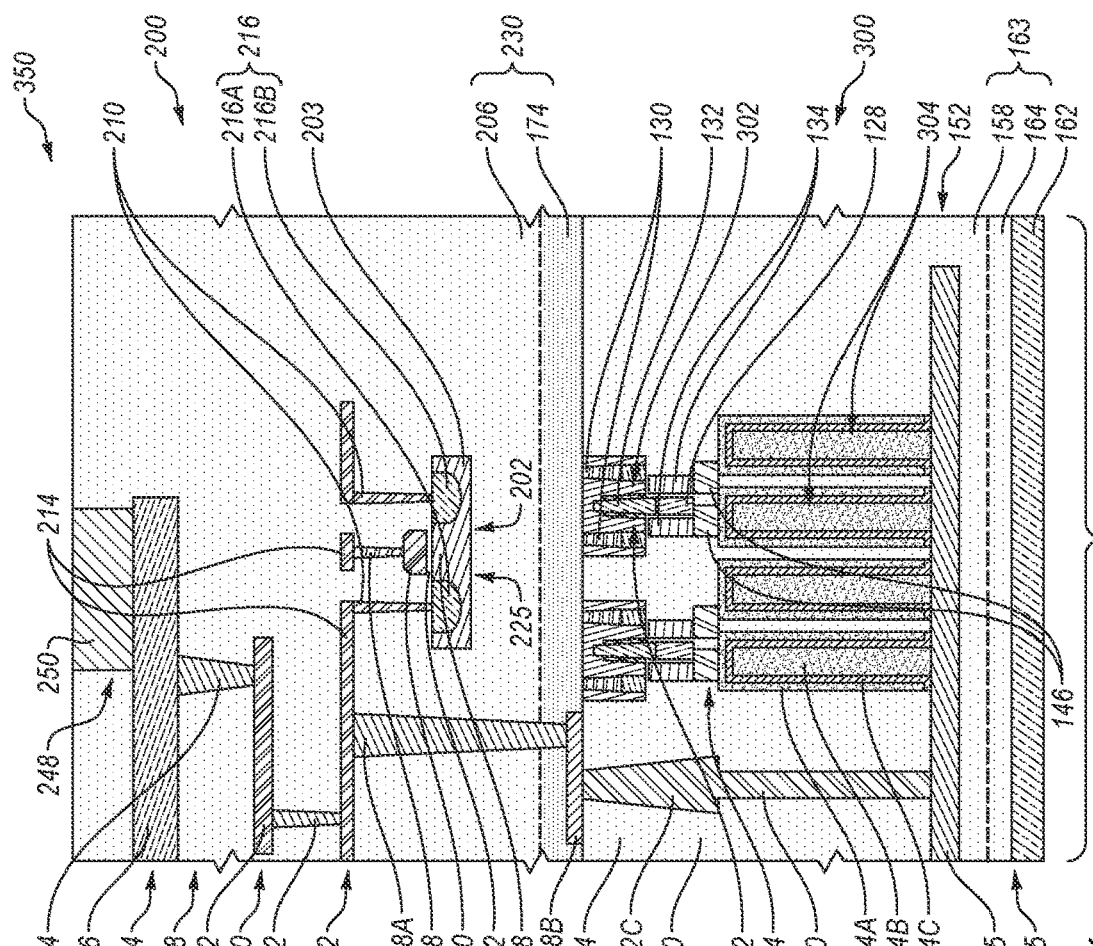
Figure 12C:
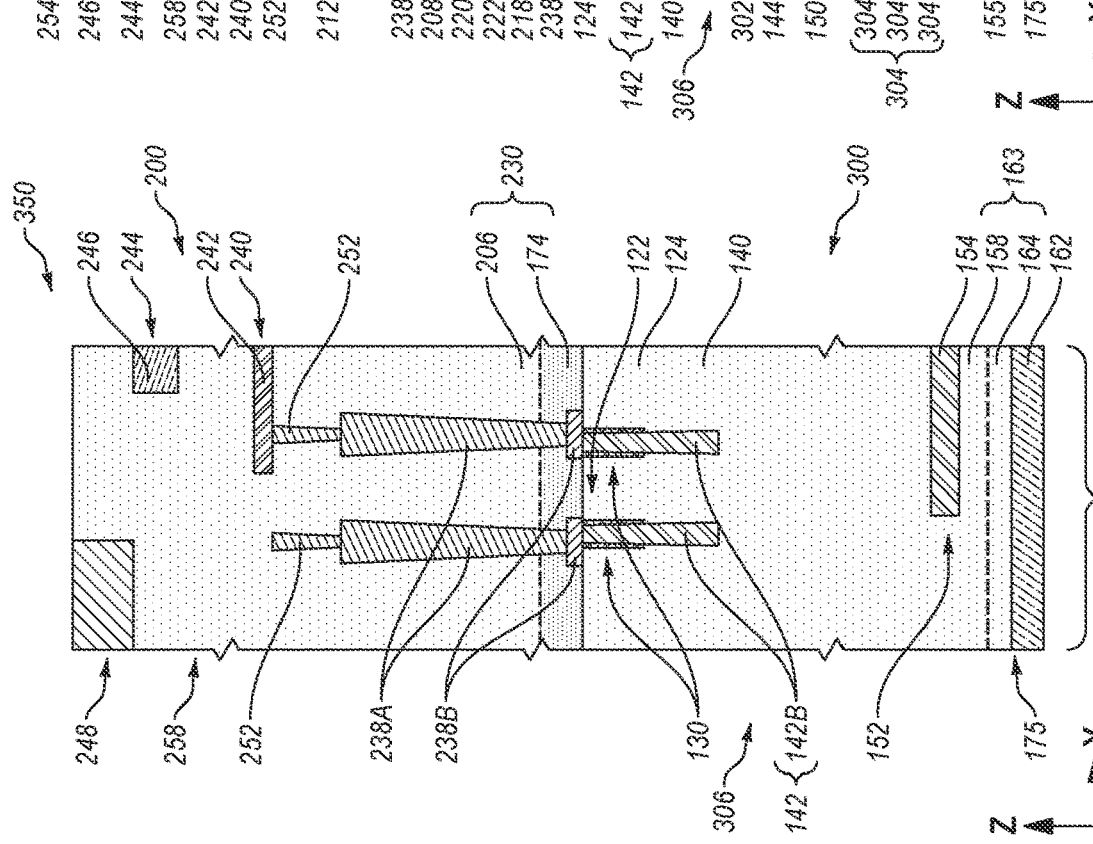

Referring now to FIG. 10A through FIG. 10D, illustrated are simplified partial cross-sectional views of different regions of a first microelectronic device structure 300 including access devices (e.g., transistors) 302 within the capacitor region 105, in accordance with embodiments of the disclosure. FIG. 10A illustrates a simplified, partial longitudinal cross-sectional view from the perspective of the Y-direction (so as to depict an XZ-plane) of one of the memory array region 110 of the first microelectronic device structure 300 similar to the cross-sectional view of FIG. 2A. FIG. 10B illustrates a simplified, partial longitudinal cross-sectional view from the perspective of the Y-direction (so as to depict an XZ-plane) of one of the digit line exit regions 112 of the first microelectronic device structure 300 similar to the cross-sectional view of FIG. 2B. FIG. 10C illustrates a simplified, partial longitudinal cross-sectional view from the perspective of the X-direction (so as to depict a YZ-plane) of one of the word line exit regions 114 of the first microelectronic device structure 300 similar to the cross-sectional view of FIG. 2C. FIG. 10D illustrates a simplified, partial longitudinal cross-sectional view from the perspective of the X-direction (so as to depict a YZ-plane) of the capacitor region 105 of the first microelectronic device structure 300 similar to the cross-sectional view of FIG. 2D.

With collective reference to FIG. 10A through FIG. 10D, the first microelectronic device structure 300 may be substantially similar to the first microelectronic device structure 100 of FIG. 2A through FIG. 2D, except that the first microelectronic device structure 300 includes the access devices 302 within the capacitor region 105. The access devices 302 within the capacitor region 105 be configured substantially the same as the access devices 126 within the memory array region 110 and may, for example, be formed to include a channel region comprising a portion of the first base semiconductor structure 120; a source region and a drain region each individually comprising one or more of at least one conductively doped portion of the first base semiconductor structure 120 and/or at least one conductive structure formed in, on, or over the first base semiconductor structure 120; and at least one gate structure comprising a portion of at least one of the word lines 130. Each access device 126 may also include a gate dielectric material (e.g., a dielectric oxide material) formed to be interposed between the channel region thereof and the gate structure thereof.

With reference to FIG. 10D, digit lines 128 may be formed to be coupled to the access devices 302 of the capacitor region 105. At least some of the digit lines 128 may also horizontally extend in the Y-direction through the memory array region 110 to the capacitor region 105 to form a portion of the access devices 302. In some such embodiments, at least some of the digit lines 128 are electrically coupled to the access devices 126 in the memory array region 110 and to the access devices 302 in the capacitor region 105. At least some of the digit lines 128 (FIG. 10A, FIG. 10B, FIG. 10D) may terminate (e.g., end) within the digit line exit region 112 (FIG. 10B). Furthermore, word lines 130 (e.g., access lines) may be formed to be coupled to the access devices 302 and to horizontally extend in the X-direction through the memory array region 110 and be routed (e.g., in the Y-direction) to the capacitor region 105 to form a portion of the access devices 302. In some such embodiments, at least some of the word lines 130 are electrically coupled to the access devices 126 in the memory array region 110 and to the access devices 302 in the capacitor region 105. At least some of the word lines 130 (FIG. 10A, FIG. 10C) may terminate within the word line exit region 114 (FIG. 10C). In some embodiments, at least some of the digit lines 128 and at least some of the word lines 130 are electrically connected to the access devices 126 in the memory array region 110 and to the access devices 302 of the capacitor region 105.

Referring next to FIG. 11A through FIG. 11D, illustrated are simplified, partial longitudinal cross-sectional views, from the directional perspectives previously described, of the memory array region 110 (FIG. 11A), the digit line exit region 112 (FIG. 11B), the word line exit region 114 (FIG. 11C), and the capacitor region 105 (FIG. 11D) at a processing stage of the method of forming the microelectronic device following the processing stage previously described with reference to FIG. 10A through FIG. 10D. As collectively depicted in FIG. 11A through FIG. 11D, the first microelectronic device structure 300 may be substantially similar to the first microelectronic device structure 100 described above with reference to FIG. 3A through FIG. 3D, except that the capacitor region 105 includes the access devices 302 as described above with reference to FIG. 10D, and the capacitor region 105 further includes capacitor structures 304 in electrical communication with the access devices 302.

In some embodiments, each of the memory array region 110, the digit line exit region 112, and the word line exit region 114 are formed substantially as described above with reference to FIG. 3A through FIG. 3C. In some embodiments, the capacitor structures 304 may be formed within the capacitor region 105 substantially simultaneously with formation of the storage node devices 148 of the memory array region 110. In some embodiments, the capacitor structures 304 have substantially the same size and shape as the storage node devices 148.

The capacitor structures 304 may each individually comprise a first electrode (e.g., a bottom electrode) 304A, a second electrode (e.g., a top electrode) 304B, and a dielectric material 304C between the first electrode 304A and the second electrode 304B, which may be substantially similar (e.g., comprise substantially the same material composition) as each of the respective first electrode 148A, second electrode 148B, and dielectric material 148C of the storage node devices 148.

In some embodiments, the capacitor structures 304 may be formed to be in electrical communication with the access devices 302. By way of non-limiting example, within the capacitor region 105, at least some of the first routing structures 146 may be formed and configured to couple the access devices 302 to the capacitor structures 304. In some embodiments, the first electrode 304A of the capacitor structures 304 are in electrical communication with the first routing structures 146 of the first routing tier 144.

Referring now to FIG. 12A through FIG. 12D, a microelectronic device 350 may be formed from the first microelectronic device structure 300. The microelectronic device 350 may be substantially the same and may be formed in substantially the same matter as the microelectronic device 260, described above with reference to FIG. 8A through FIG. 8D, except that the microelectronic device 350 is formed from and includes components of the first microelectronic device structure 300 rather than being formed from and including all of the components of the first microelectronic device structure 100 (FIG. 8A through FIG. 8D). Accordingly, the microelectronic device 350 includes the access devices 302, and the capacitor structures 304 coupled to the access devices 302 in the capacitor region 105.

By way of non-limiting example, the additional microelectronic device structure 175 may be attached to the first microelectronic device structure 300, as described above with reference to FIG. 4A through FIG. 4D to form a first microelectronic device structure assembly 306. The first microelectronic device structure assembly 306 may be vertically inverted (e.g., flipped) and portions of the first base semiconductor structure 120 may be removed, such as by CMP. Thereafter, the sacrificial structures 172 may be formed within the fifth isolation material 174 over the first base semiconductor structure 120 and the access devices 126, as described above with reference to FIG. 4A. The sacrificial structures 172 may also be formed vertically over the additional second routing structure 155 within the capacitor region 105.

With continued reference to FIG. 12A through FIG. 12D, after forming the first microelectronic device structure assembly 306, the second microelectronic device structure 200 may be attached to the first microelectronic device structure assembly 306, as described above with reference to attachment of the first microelectronic device structure assembly 166 (FIG. 7A through FIG. 7D) to the second microelectronic device structure 200 (FIG. 7A through FIG. 7D), to form the microelectronic device 350. By way of non-limiting example, the fifth isolation material 174 of the first microelectronic device structure assembly 306 may be bonded to the sixth isolation material 206 of the second microelectronic device structure 200 to form the microelectronic device 350 comprising the first microelectronic device structure assembly 306 coupled to the second microelectronic device structure 200.

Accordingly, the capacitor region 105 of the microelectronic device 350 may include the capacitor structures 304 coupled to the access devices 302 by the first routing structures 146. The access devices 302 within the capacitor region 105 may be coupled to digit lines 128 and word lines 130 that are also coupled to access devices 126 within the memory array region 110.

In some embodiments, the capacitor structures 304 of the capacitor region 105 may be configured to selectively be in electrical communication with one or more of an equivalent voltage ($V_{EQ}$) (also referred to as a "mid-level voltage"), an isolation voltage ($V_{ISO}$), and a variable voltage (VARY) by means of the additional second routing structures 155, the fourth contact structures 150, the third contact structures 142 of the third group 142C, and the seventh contact structures 238. In some embodiments, the second electrode 304B is configured to selectively be in electrical communication with the one or more of the equivalent voltage $V_{EQ}$, the isolation voltage $V_{ISO}$, and the variable voltage VARY. In some embodiments, the digit lines 128 are in electrical communication with the voltage source supply $V_{SS}$. In some embodiments, the word lines 130 are operably coupled to a capacitor supply voltage $V_{CCP}$.

In some embodiments, the capacitor structures 304 may be used during operation of the microelectronic device 350 at voltages from about 1.0 V to about 1.5 V. In use and operation, and with reference to FIG. 9, when the capacitor supply voltage $V_{CCP}$ is applied to the word line 130, the capacitor structures 304 in operable communication with the word line 130 may be selectively coupled to the digit line 128 coupled to the capacitor structure 304 by means of the transistor 190 (e.g., the access device 302). In turn, the capacitor structures 304 are selectively in operable communication with the memory cells 156 when the $V_{CCP}$ voltage is applied to the word lines 130.

When the word line 130 is in an off state (e.g., when the capacitor supply voltage $V_{CCP}$ is not applied to the word line 130), the capacitor structure 304 is disconnected from the voltage source supply $V_{SS}$ of the digit line 128 and the storage node devices 148 coupled to the word line 130 are disconnected from the power source (the voltage source supply $V_{SS}$).

When the capacitor supply voltage $V_{CCP}$ is not applied to the word line 130, the capacitor structure 304 is disconnected from the voltage source supply $V_{SS}$ of the digit line 128. Disconnecting the storage node devices 148 from the power source when the voltage is not applied to the word line 130 may facilitate prolonging the service life of the memory cells 156 of the memory array region 110, similar to so-called "wear leveling" techniques. In some embodiments, when the memory array bank 102 associated with the memory array region 110 is idle, disconnecting the storage node device 148 from the voltage source supply $V_{SS}$ of the digit line 128 may prolong the operating life of the memory cells 156 of the memory array region 110.

Figure 13B:
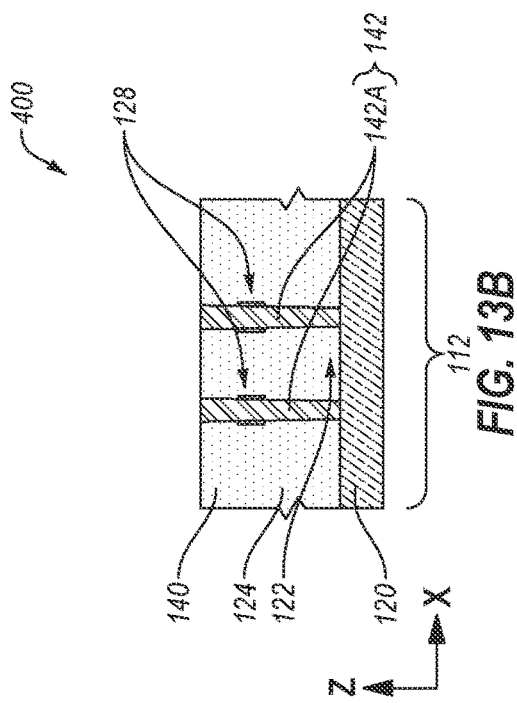
Figure 13A:
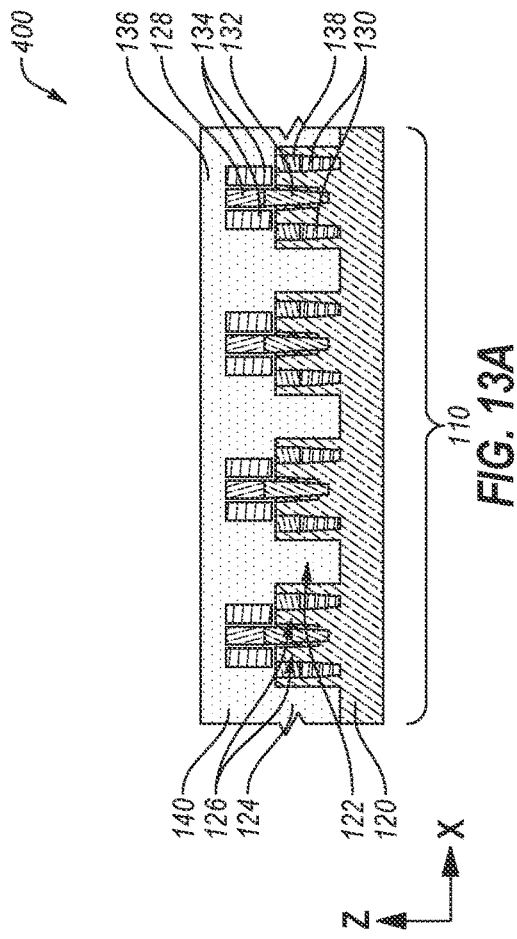
Figure 15B:
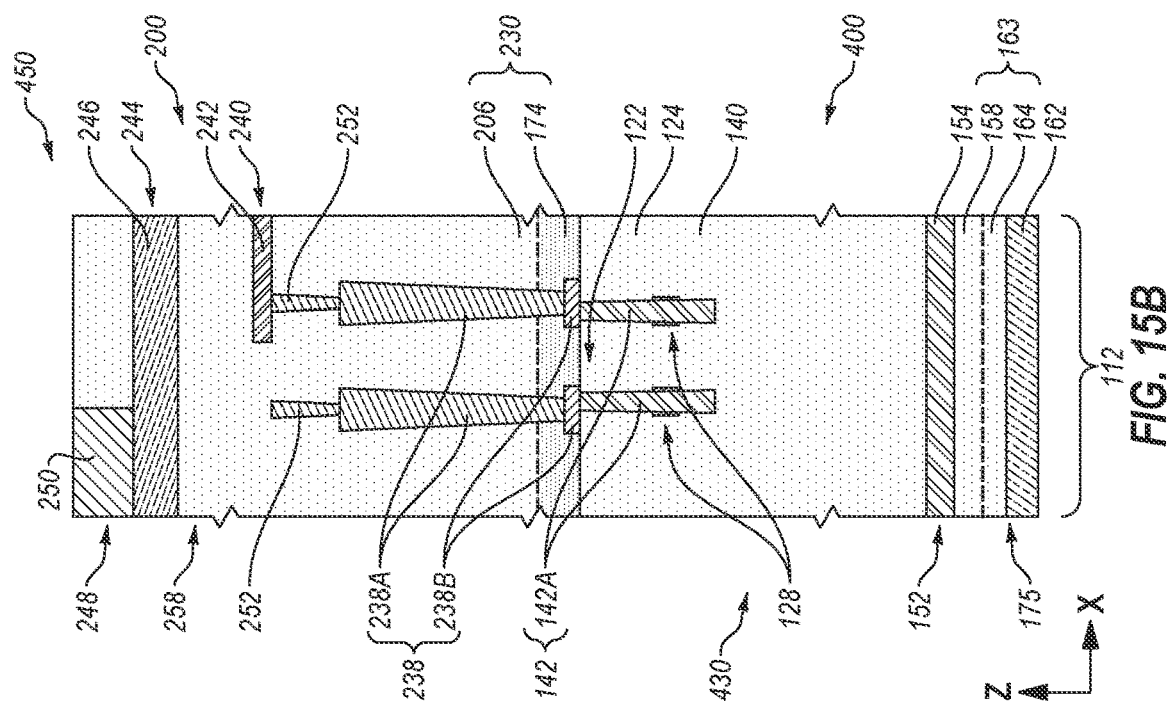
FIG. 15A through FIG. 15D are simplified, partial longitudinal cross-sectional views of a memory array (FIG. 15A), a digit line exit region (FIG. 15B), a word line exit region (FIG. 15C), and a capacitor region (FIG. 15D) of a microelectronic device formed from the microelectronic device structure shown in FIG. 14A through FIG. 14D following further processing.
Figure 15A:
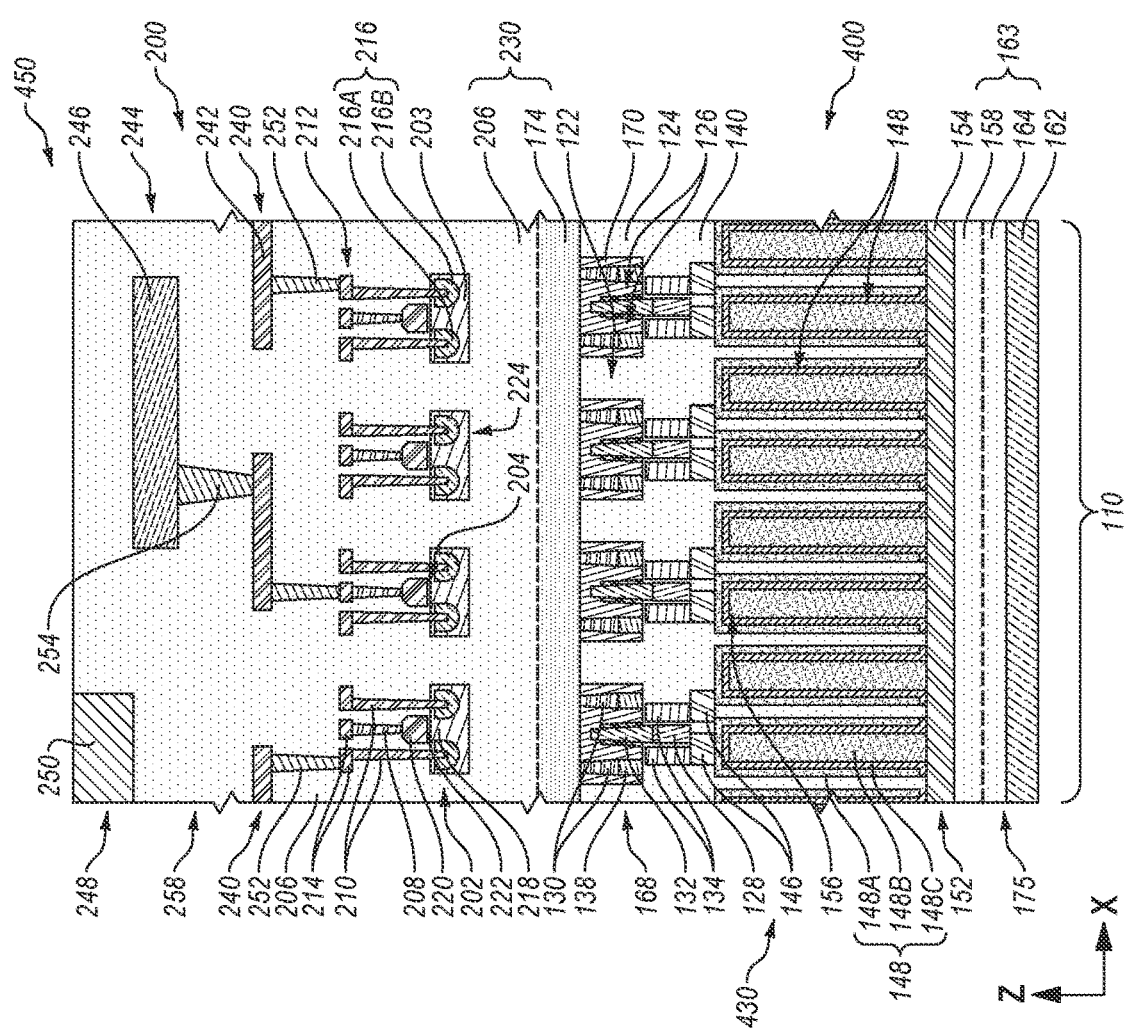
Figure 15D:
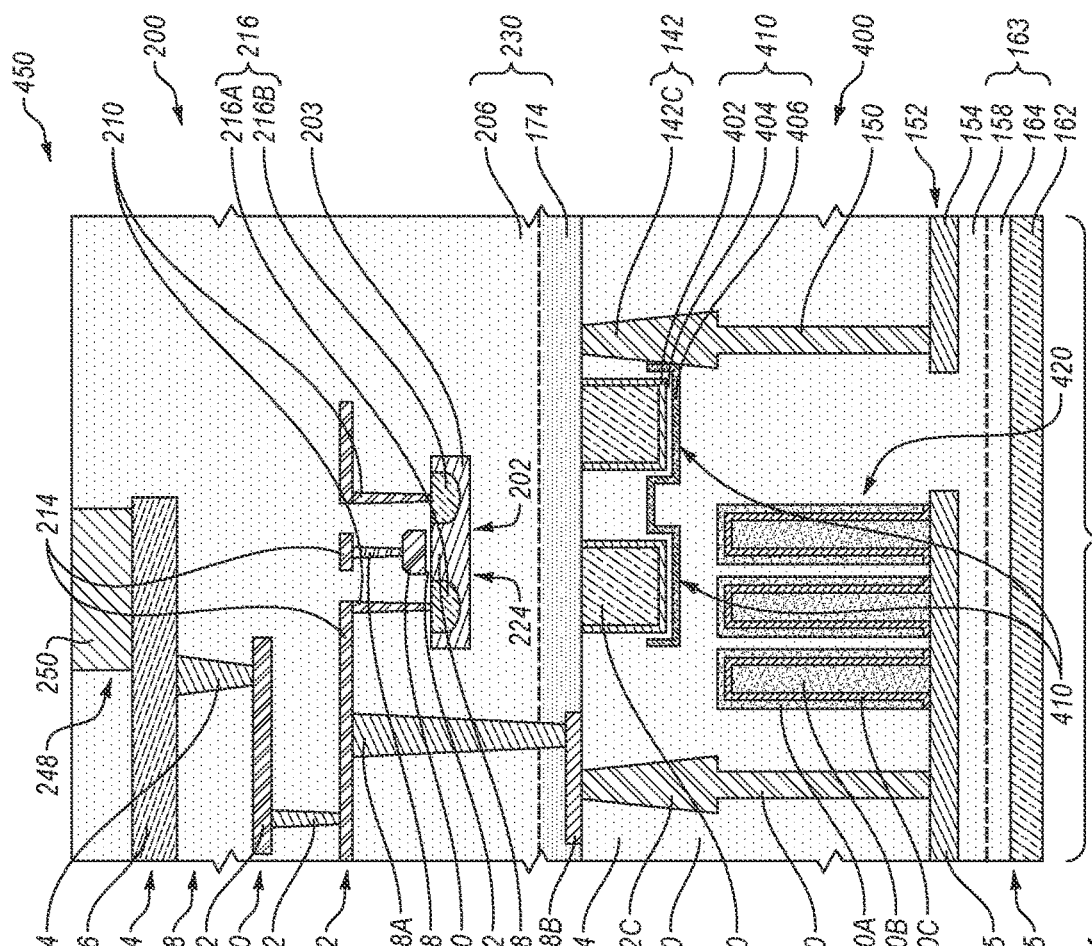
Figure 15C:
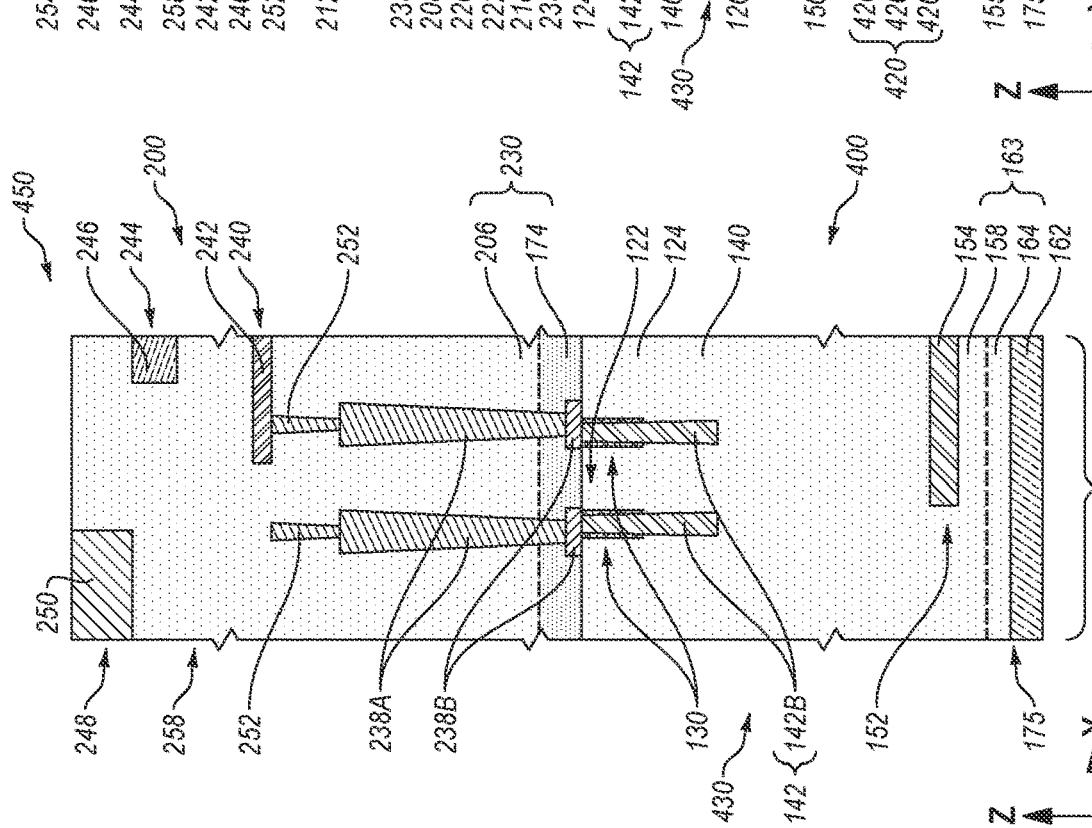

FIG. 13A through FIG. 13D are simplified partial cross-sectional views of different regions of a first microelectronic device structure 400 different types of capacitors within the capacitor region 105, in accordance with embodiments of the disclosure. FIG. 13A illustrates a simplified, partial longitudinal cross-sectional view from the perspective of the Y-direction (so as to depict an XZ-plane) of one of the memory array region 110 of the first microelectronic device structure 400 similar to the cross-sectional view of FIG. 10A. FIG. 13B illustrates a simplified, partial longitudinal cross-sectional view from the perspective of the Y-direction (so as to depict an XZ-plane) of one of the digit line exit regions 112 of the first microelectronic device structure 400 similar to the cross-sectional view of FIG. 10B. FIG. 13C illustrates a simplified, partial longitudinal cross-sectional view from the perspective of the X-direction (so as to depict a YZ-plane) of one of the word line exit regions 114 of the first microelectronic device structure 400 similar to the cross-sectional view of FIG. 10C. FIG. 13D illustrates a simplified, partial longitudinal cross-sectional view from the perspective of the X-direction (so as to depict a YZ-plane) of one of the capacitor region 105 of the first microelectronic device structure 400 similar to the cross-sectional view of FIG. 10D.

With collective reference to FIG. 13A through FIG. 13D, the first microelectronic device structure 400 is substantially similar to the first microelectronic device structure 100 of FIG. 2A through FIG. 2D, except that the first microelectronic device structure 400 includes first capacitor structures 410 (also referred to as "metal oxide semiconductor (MOS) capacitors")) within the capacitor region 105 and at substantially the same vertical height (e.g., in the Z-direction) as the access devices 126 within the memory array region 110. Each of the first capacitor structures 410 may individually be formed of and include semiconductive material (e.g., silicon) of the first base semiconductor structure 120, a first electrode 402 comprising the conductive material as the word lines 130, the dielectric material 404 comprising the insulative material of the second isolation material 140, and a second electrode 406 comprising the conductive material of the digit lines 128. In some embodiments, the first electrode 402 is at substantially the same vertical elevation (e.g., in the Z-direction) as the word line 130 in the memory array region 110 and the second electrode 406 is at the same vertical elevation (e.g., in the Z-direction) as the digit line 128 in the memory array region 110.

The dielectric material 404 may be directly between (e.g., directly horizontally between, directly vertically between) the first electrode 402 and the second electrode 406. The first electrode 402 may directly contact the semiconductive material of the first base semiconductor structure 120. In some embodiments, the first electrode 402 of each first capacitor structure 410 may be isolated from the first electrode 402 of a horizontally neighboring (e.g., in the Y-direction) first electrode 402. In some embodiments, the second electrode 406 of horizontally neighboring (e.g., in the X-direction) first capacitor structures 410 may be electrically coupled by the same conductive material of the word lines 130.

Referring next to FIG. 14A through FIG. 14D, illustrated are simplified, partial longitudinal cross-sectional views, from the directional perspectives previously described, of the memory array region 110 (FIG. 14A), the digit line exit region 112 (FIG. 14B), the word line exit region 114 (FIG. 14C), and the capacitor region 105 (FIG. 14D) at a processing stage of the method of forming the microelectronic device following the processing stage previously described with reference to FIG. 13A through FIG. 13D. As collectively depicted in FIG. 14A through FIG. 14D, the first microelectronic device structure 400 may be substantially similar to the first microelectronic device structure 100 described above with reference to FIG. 3A through FIG. 3D, except that the capacitor region 105 includes the first capacitor structures 410 as described above with reference to FIG. 13D, and the capacitor region 105 further includes second capacitor structures 420 in electrical communication with the additional second routing structure 155.

In some embodiments, each of the memory array region 110, the digit line exit region 112, and the word line exit region 114 are formed substantially as described above with reference to FIG. 3A through FIG. 3C. In some embodiments, the second capacitor structures 420 may be formed within the capacitor region 105 substantially simultaneously with formation of the storage node devices 148 of the memory array region 110. In some embodiments, the second capacitor structures 420 have substantially the same size and shape as the storage node devices 148.

The second capacitor structures 420 may each individually comprise a first electrode (e.g., a bottom electrode) 420A, a second electrode (e.g., a top electrode) 420B, and a dielectric material 420C between the first electrode 420A and the second electrode 420B, which may be substantially similar (e.g., comprise substantially the same material composition) as each of the respective first electrode 148A, second electrode 148B, and dielectric material 148C of the storage node devices 148.

In some embodiments, the second capacitor structures 420 are electrically connected to at least some of the digit lines 128 (FIG. 14A) and at least some of the word lines 130 (FIG. 14A).

Referring now to FIG. 15A through FIG. 15D, a microelectronic device 450 may be formed from the first microelectronic device structure 400. The microelectronic device 450 may be substantially the same and may be formed in substantially the same matter as the microelectronic device 260, described above with reference to FIG. 8A through FIG. 8D, except that the microelectronic device 450 is formed from and includes components of the first microelectronic device structure 400 rather than being formed from and including all of the components of the first microelectronic device structure 100 (FIG. 8A through FIG. 8D).

By way of non-limiting example, the additional microelectronic device structure 175 may be attached to the first microelectronic device structure 400, as described above with reference to FIG. 4A through FIG. 4D to form a first microelectronic device structure assembly 430. The first microelectronic device structure assembly 430 may vertically inverted (e.g., flipped) and portions of the first base semiconductor structure 120 may be removed, such as by CMP. Thereafter, the sacrificial structures 172 may be formed within the fifth isolation material 174 over the first base semiconductor structure 120 and the access devices 126, as described above with reference to FIG. 4A. The sacrificial structures 172 may also be formed vertically over the additional second routing structure 155 within the capacitor region 105. Of course, in embodiments where the first microelectronic device structure is formed to include conductive structures in place of the sacrificial structures 172, the conductive structures (rather than the sacrificial structures 172) may be formed vertically over the additional second routing structure 155 within the capacitor region 105.

With continued reference to FIG. 15A through FIG. 15D, after forming the first microelectronic device structure assembly 430, the second microelectronic device structure 200 may be attached to the first microelectronic device structure assembly 430, as described above with reference to attachment of the first microelectronic device structure assembly 166 (FIG. 7A through FIG. 7D) to the second microelectronic device structure 200 (FIG. 7A through FIG. 7D), to form the microelectronic device 450.

Accordingly, the capacitor region 105 of the microelectronic device 450 may include the first capacitor structures 410 comprising the conductive materials of the digit lines 128 and the word lines 130 and at substantially the same vertical elevation (e.g., in the Z-direction) as the access devices 126 of the memory array region 110. In some embodiments, the capacitor region 105 further comprises second capacitor structures 420 at substantially the same vertical elevation (e.g., in the Z-direction) as the storage node devices 148 (FIG. 15A) within the memory array region 110.

In some embodiments, the first capacitor structures 410 of the capacitor region 105 are configured to selectively be in electrical communication with one or more of a drive voltage ($V_{DRV}$), an external power supply voltage ($V_{COMP}$), and a capacitor supply voltage $V_{CCP}$. In some embodiments, one or more of (e.g., each of) the $V_{DRV}$ voltage, the $V_{COMP}$ voltage, and the capacitor supply voltage $V_{CCP}$ may be greater than about 2.0 V. In some embodiments, the second electrode 406 of the first capacitor structures 410 is operably coupled to the digit lines 128, which may be coupled to the capacitor supply voltage $V_{CCP}$. In some embodiments, the first electrode 402 of the first capacitor structures 410 is coupled to a voltage source supply $V_{ss}$. In some embodiments, two or more of the first capacitor structures 410 are serially coupled.

Thus, in accordance with embodiments of the disclosure, a microelectronic device comprises array regions individually comprising memory cells comprising access devices and storage node devices, digit lines coupled to the access devices and extending in a first direction, word lines coupled to the access devices and extending in a second direction orthogonal to the first direction, and control logic devices over and in electrical communication with the memory cells. The microelectronic device further comprises capacitor regions horizontally offset from the array regions in the first direction and having a dimension in the second direction greater than each individual array region in the second direction. The capacitor regions individually comprise additional control logic devices vertically overlying the memory cells, and capacitor structures within horizontal boundaries of the additional control logic devices.

Furthermore, in accordance with some embodiments of the disclosure, a microelectronic device comprises a first microelectronic device structure and a second microelectronic device structure attached to the first microelectronic device structure. The first microelectronic device structure comprises memory banks, each comprising memory arrays comprising memory cells, each memory cell comprising a storage node, and capacitor structures horizontally offset from the storage node devices and vertically overlying the storage node devices. The second microelectronic device structure comprises control logic devices within horizontal boundaries of the memory arrays and vertically overlying the memory arrays, and bank logic devices comprises additional control logic devices horizontally offset from the control logic devices and vertically overlying the capacitor structures.

In accordance with additional embodiments, a method of forming a microelectronic device comprises forming a first microelectronic device structure and forming a second microelectronic device structure. Forming the first microelectronic device structure comprises forming a memory array region comprising memory cells comprising storage node devices coupled to access devices and forming a capacitor region comprising capacitor structures horizontally spaced from the memory array region. Forming the second microelectronic device structure comprises forming a transistor array region comprising control logic devices and forming bank logic devices comprising additional control logic devices horizontally spaced from the transistor array region. The method further comprises attaching the first microelectronic device structure to the second microelectronic device structure such that at least some of the additional control logic devices of the second microelectronic device structure are located within horizontal boundaries of at least some of the capacitor structures of the first microelectronic device structure.

Microelectronic devices (e.g., the microelectronic device 260 (FIG. 8A through FIG. 8D), the microelectronic device 350 (FIG. 12A through FIG. 12D), the microelectronic device 450 (FIG. 15A through FIG. 15D)) in accordance with embodiments of the disclosure may be used in embodiments of electronic systems of the disclosure. For example, FIG. 16 is a block diagram illustrating an electronic system 500 according to embodiments of disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 500 includes at least one memory device 502. The memory device 502 may comprise, for example, a microelectronic device (e.g., the microelectronic device 260 (FIG. 8A through FIG. 8D), the microelectronic device 350 (FIG. 12A through FIG. 12D), the microelectronic device 450 (FIG. 15A through FIG. 15D)) previously described herein. The electronic system 500 may further include at least one electronic signal processor device 504 (often referred to as a "microprocessor"). The electronic signal processor device 504 may, optionally, comprise a microelectronic device (e.g., the microelectronic device 260 (FIG. 8A through FIG. 8D), the microelectronic device 350 (FIG. 12A through FIG. 12D), the microelectronic device 450 (FIG. 15A through FIG. 15D)) previously described herein. While the memory device 502 and the electronic signal processor device 504 are depicted as two (2) separate devices in FIG. 16, in additional embodiments, a single (e.g., only one) memory/processor device having the functionalities of the memory device 502 and the electronic signal processor device 504 is included in the electronic system 500. In such embodiments, the memory/processor device may include a microelectronic device (e.g., the microelectronic device 260 (FIG. 8A through FIG. 8D), the microelectronic device 350 (FIG. 12A through FIG. 12D), the microelectronic device 450 (FIG. 15A through FIG. 15D)) previously described herein. The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, a monitor, a display, a printer, an audio output jack, a speaker, etc. In some embodiments, the input device 506 and the output device 508 comprise a single touchscreen device that can be used both to input information to the electronic system 500 and to output visual information to a user. The input device 506 and the output device 508 may communicate electrically with one or more of the memory device 502 and the electronic signal processor device 504.

Accordingly, in at least some embodiments, an electronic device comprises an input device, an output device, a processor device operably coupled to the input device and the output device, and a memory device operably coupled to the processor device. The memory device comprises memory array regions each comprising memory cells comprising dynamic random-access memory (DRAM) cells, capacitor structures horizontally offset from the memory array regions and horizontally intervening between the memory array regions and additional memory array regions, and access devices vertically overlying the capacitor structures and in electrical communication with at least some of the capacitor structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
    array regions individually comprising:
        memory cells comprising access devices and storage node devices;
        digit lines coupled to the access devices and extending in a first direction;
        word lines coupled to the access devices and extending in a second direction orthogonal to the first direction; and
        control logic devices over and in electrical communication with the memory cells; and
    capacitor regions horizontally offset from the array regions in the first direction and having a dimension in the second direction greater than each individual array region in the second direction, the capacitor regions individually comprising:
        additional control logic devices vertically overlying the memory cells; and
        capacitor structures within horizontal boundaries of the additional control logic devices.

2. The microelectronic device of claim 1, wherein the capacitor structures are electrically coupled to at least some of the digit lines.

3. The microelectronic device of claim 1, wherein the capacitor structures are substantially vertically aligned with the storage node devices of the memory cells of the array regions.

4. The microelectronic device of claim 1, wherein the capacitor structures are substantially vertically aligned with the access devices of the memory cells of the array regions.

5. The microelectronic device of claim 1, wherein the capacitor structures comprise substantially the same material composition as the digit lines and the word lines and further comprises a dielectric material.

6. The microelectronic device of claim 1, wherein the capacitor structures are in electrical communication with a semiconductor material.

7. The microelectronic device of claim 1, wherein a first electrode of a first of the capacitor structures is continuous with a first electrode of a second of the capacitor structures horizontally neighboring the first of the capacitor structures.

8. The microelectronic device of claim 1, wherein the capacitor structures are in electrical communication with the additional control logic devices.

9. The microelectronic device of claim 8, wherein the additional control logic devices comprise one or more of digital signal acquisition (DSA) devices, error checking and correction (ECC) devices, voltage generators, command address devices, data output devices, command address devices, antifuse devices, delay-locked loop (DLL) systems, and delay enable devices.

10. The microelectronic device of claim 1, wherein one or more of the capacitor structures comprise a decoupling capacitor.

11. The microelectronic device of claim 1, wherein the additional control logic devices are vertically aligned with the control logic devices.

12. The microelectronic device of claim 1, wherein a horizontal area of the capacitor regions is at least about 50 percent of a horizontal area of the array regions.

13. The microelectronic device of claim 1, wherein at least some of the digit lines horizontally extend from the array regions to the capacitor regions.

14. A microelectronic device, comprising:
    a first microelectronic device structure comprising:
        memory banks, each comprising memory arrays comprising memory cells, each memory cell comprising a storage node; and
        capacitor structures horizontally offset from the storage nodes of the memory cells and vertically overlying the storage nodes; and
    a second microelectronic device structure attached to the first microelectronic device structure, the second microelectronic device structure comprising:
        control logic devices within horizontal boundaries of the memory arrays and vertically overlying the memory arrays; and
        bank logic devices comprise additional control logic devices horizontally offset from the control logic devices and vertically overlying the capacitor structures.

15. The microelectronic device of claim 14, wherein the additional control logic devices are in electrical communication with the capacitor structures.

16. The microelectronic device of claim 14, further comprising additional capacitor structures in the first microelectronic device structure vertically underlying the capacitor structures.

17. The microelectronic device of claim 16, wherein the additional capacitor structures are at least partially horizontally aligned with the capacitor structures.

18. The microelectronic device of claim 16, wherein the additional capacitor structures are in electrical communication with the additional control logic devices.

19. The microelectronic device of claim 14, wherein:
    the additional control logic devices comprise bank logic structures; and
    the capacitor structures vertically underlie the bank logic structures.

20. The microelectronic device of claim 14, wherein an electrode of the capacitor structures directly contacts a semiconductive material.

21. The microelectronic device of claim 14, wherein the additional control logic devices are larger than the control logic devices.

22. The microelectronic device of claim 14, wherein the capacitor structures are in electrical communication with a deep contact structure vertically extending through the second microelectronic device structure and in electrical communication with a power bus.

23. An electronic system, comprising:
    an input device;
    an output device;
    a processor device operably connected to the input device and the output device; and a memory device operably connected to the processor device and comprising:
  memory array regions each comprising memory cells comprising dynamic random-access memory (DRAM) cells;
  capacitor structures horizontally offset from the memory array regions and horizontally intervening between the memory array regions and additional memory array regions; and
  access devices vertically overlying the capacitor structures and in electrical communication with at least some of the capacitor structures.

24. The electronic system of claim 23, wherein the access devices are vertically aligned with additional access devices of the memory cells of the memory array regions.

25. The electronic system of claim 23, wherein the capacitor structures are in operable communication with control logic devices vertically overlying the capacitor structures.

26. The electronic system of claim 23, wherein the capacitor structures are substantially vertically aligned with storage node devices of the memory cells of the memory array regions.

27. The electronic system of claim 23, wherein the access devices comprise gates electrically connected to word lines within the memory array regions.

28. A method of forming a microelectronic device, the method comprising:
  forming a first microelectronic device structure, comprising:
    forming a memory array region comprising memory cells comprising storage node devices coupled to access devices; and
    forming a capacitor region comprising capacitor structures horizontally spaced from the memory array region;
  forming a second microelectronic device structure, comprising:
    forming a transistor array region comprising control logic devices; and
    forming bank logic devices comprising additional control logic devices horizontally spaced from the transistor array region; and
  attaching the first microelectronic device structure to the second microelectronic device structure such that at least some of the additional control logic devices of the second microelectronic device structure are located within horizontal boundaries of at least some of the capacitor structures of the first microelectronic device structure.

29. The method of claim 28, wherein attaching the first microelectronic device structure to the second microelectronic device structure comprises bonding an isolation material of the first microelectronic device structure to an additional isolation material of the second microelectronic device structure.

30. The method of claim 28, wherein forming the first microelectronic device structure comprises forming additional access devices configured to be in electrical communication with the capacitor structures substantially simultaneously with forming the access devices of the memory array region.

31. The method of claim 28, wherein forming the first microelectronic device structure comprises forming additional capacitor structures to be at least partially horizontally aligned with the capacitor structures.

32. The method of claim 28, wherein forming the first microelectronic device structure comprises forming the capacitor structures to be vertically aligned with the access devices of the memory array region.

* * * * *

UNITED STATES PATENT AND TRADEMARK OFFICE
CERTIFICATE OF CORRECTION

| | | Page 1 of 1 |
|---|---|---|
| PATENT NO. | : 12,137,549 B2 | |
| APPLICATION NO. | : 17/461095 | |
| DATED | : November 5, 2024 | |
| INVENTOR(S) | : Fatma Arzum Simsek-Ege and Yuan He | |

It is certified that error appears in the above-identified patent and that said Letters Patent is hereby corrected as shown below:

In the Specification

| | | |
|---|---|---|
| Column 1, | Line 20, | change "by reducing; the dimensions" to --by reducing the dimensions-- |
| Column 22, | Line 21, | change "(e.g., sapphire; a-Al$_2$O$_3$)," to --(e.g., sapphire; α-Al$_2$O$_3$),-- |

Signed and Sealed this
Seventh Day of January, 2025

Derrick Brent
*Acting Director of the United States Patent and Trademark Office*